(12) United States Patent
Funatsuki et al.

(10) Patent No.: US 11,200,951 B2
(45) Date of Patent: Dec. 14, 2021

(54) SEMICONDUCTOR MEMORY DEVICE

(71) Applicant: TOSHIBA MEMORY CORPORATION, Tokyo (JP)

(72) Inventors: Rieko Funatsuki, Yokohama Kanagawa (JP); Takahiko Sasaki, Tokyo (JP); Tomonori Kurosawa, Zama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 202 days.

(21) Appl. No.: 16/561,391

(22) Filed: Sep. 5, 2019

(65) Prior Publication Data

US 2020/0185035 A1 Jun. 11, 2020

(30) Foreign Application Priority Data

Dec. 11, 2018 (JP) .............................. JP2018-231802

(51) Int. Cl.
| | | |
|---|---|---|
| *G11C 7/08* | (2006.01) | |
| *G11C 16/10* | (2006.01) | |
| *G11C 7/10* | (2006.01) | |
| *G11C 16/34* | (2006.01) | |
| *G11C 16/08* | (2006.01) | |
| *G11C 16/24* | (2006.01) | |
| *G11C 16/26* | (2006.01) | |
| *G11C 16/30* | (2006.01) | |

(52) U.S. Cl.
CPC ............... *G11C 16/10* (2013.01); *G11C 7/08* (2013.01); *G11C 7/106* (2013.01); *G11C 7/109* (2013.01); *G11C 7/1063* (2013.01); *G11C 7/1087* (2013.01); *G11C 16/08* (2013.01); *G11C 16/24* (2013.01); *G11C 16/26* (2013.01); *G11C 16/30* (2013.01); *G11C 16/3459* (2013.01)

(58) Field of Classification Search
CPC ........... G11C 16/10; G11C 7/08; G11C 7/106; G11C 7/1087; G11C 7/109; G11C 16/3459; G11C 16/08; G11C 16/24; G11C 16/26; G11C 16/30; G11C 7/1063; G11C 16/32; G11C 2211/5648; G11C 11/5628; G11C 16/0483
See application file for complete search history.

(56) References Cited

U.S. PATENT DOCUMENTS

| | | | |
|---|---|---|---|
| 7,117,295 B2 * | 10/2006 | Kunori | ............... G11C 11/5621 711/103 |
| 2008/0258129 A1 | 10/2008 | Toda | |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2011/0235399 A1 | 9/2011 | Sasaki | |
| 2011/0284946 A1 | 11/2011 | Kiyotoshi | |

(Continued)

FOREIGN PATENT DOCUMENTS

| | | |
|---|---|---|
| JP | 2005522045 A | 7/2005 |
| JP | 2011198440 A | 10/2011 |

*Primary Examiner* — Mohammed A Bashar
(74) *Attorney, Agent, or Firm* — Holtz, Holtz & Volek PC

(57) ABSTRACT

According to one embodiment, a semiconductor memory device includes a plurality of memory cells; a first circuit configured to convert first data into second data relating to an order of thresholds of the memory cells; and a second circuit configured to perform a write operation on the memory cells based on the second data.

18 Claims, 32 Drawing Sheets

(56) References Cited

U.S. PATENT DOCUMENTS

| | | | |
|---|---|---|---|
| 2012/0155168 A1* | 6/2012 | Kim | G11C 11/5628 |
| | | | 365/185.03 |
| 2017/0076790 A1 | 3/2017 | Sasaki et al. | |
| 2017/0110186 A1 | 4/2017 | Sasaki et al. | |
| 2019/0057743 A1* | 2/2019 | Lee | G11C 16/10 |
| 2019/0189223 A1* | 6/2019 | Yun | G11C 11/5628 |
| 2019/0259458 A1* | 8/2019 | Shibata | G11C 16/10 |

\* cited by examiner

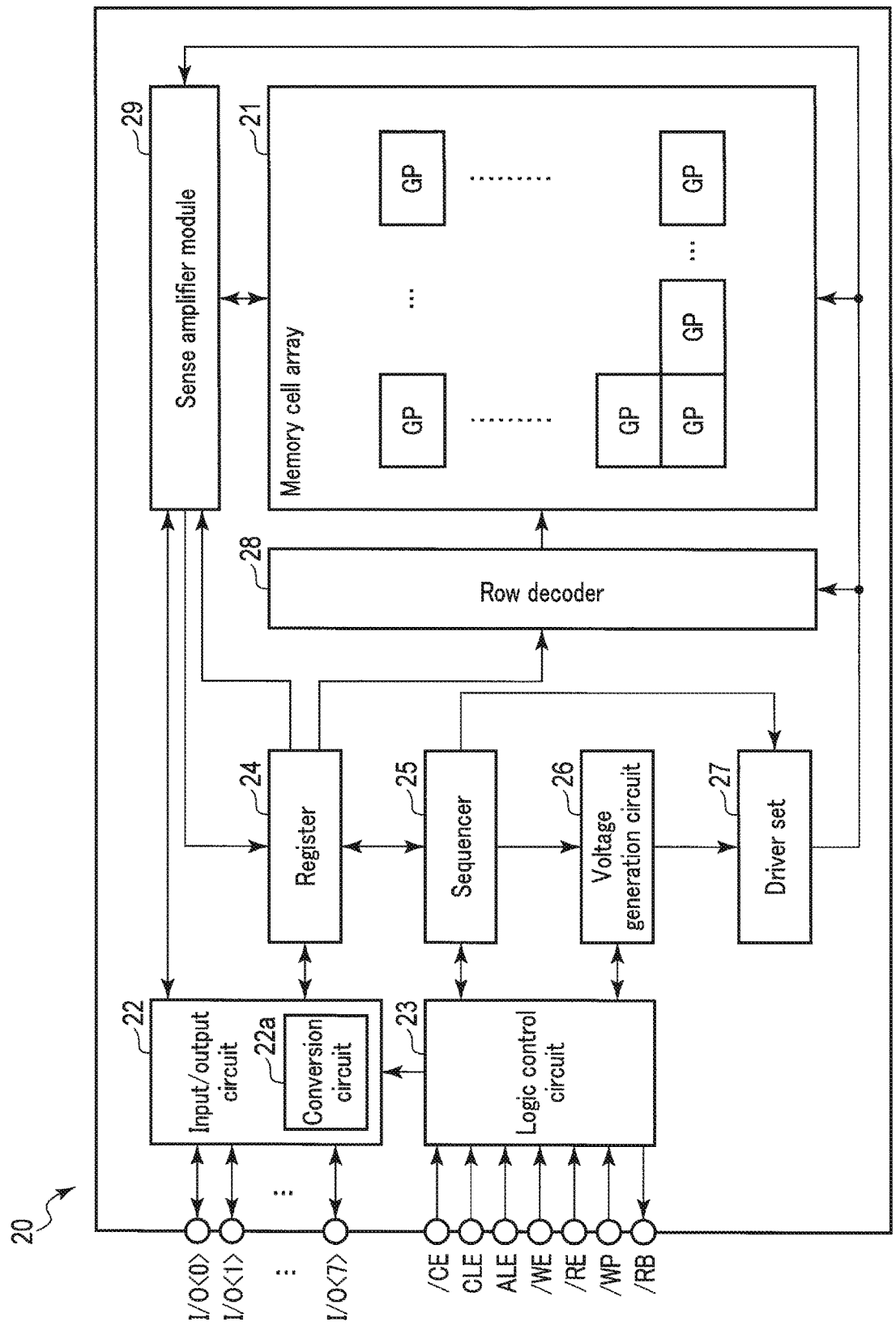
F I G. 5

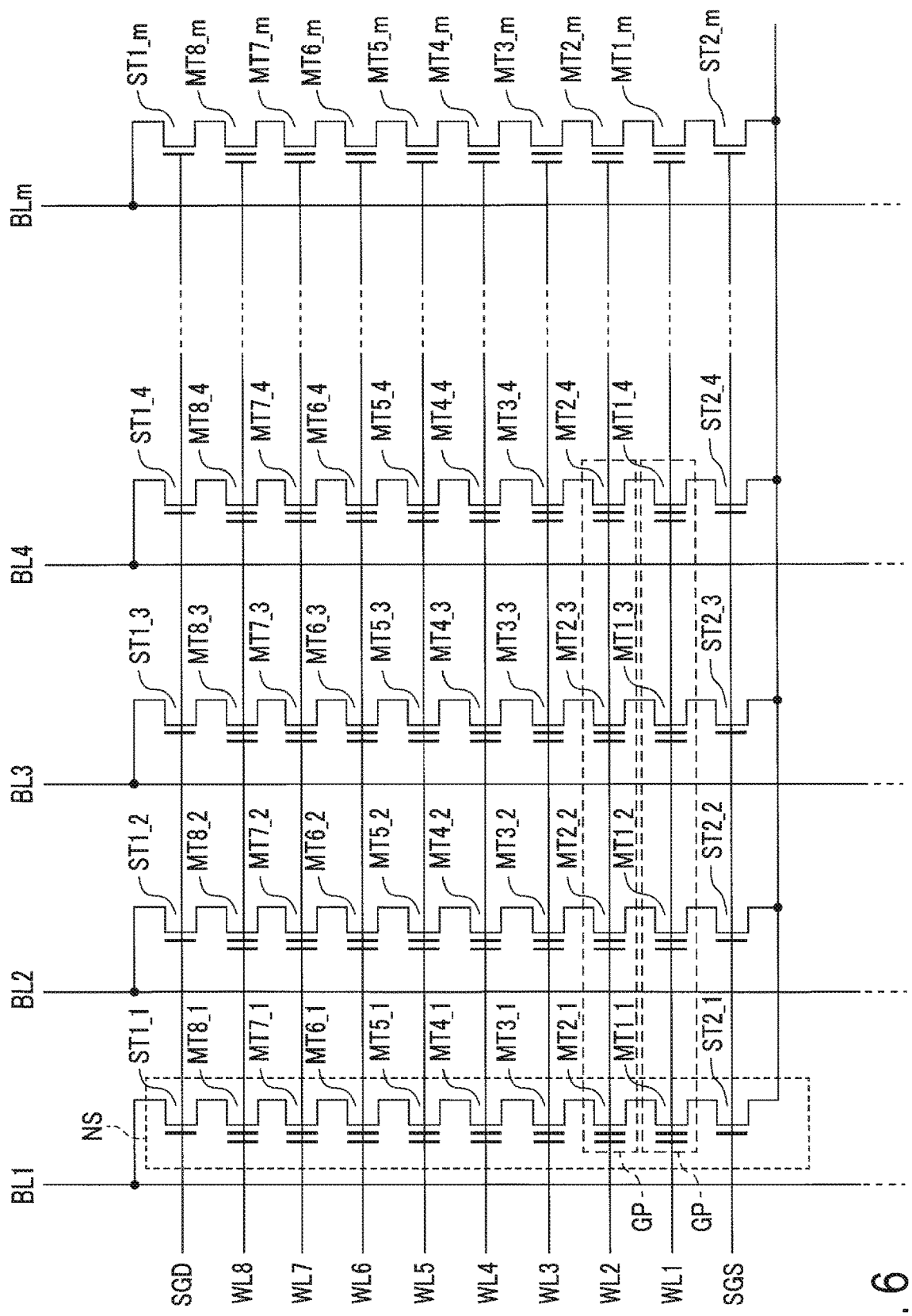
F I G. 6

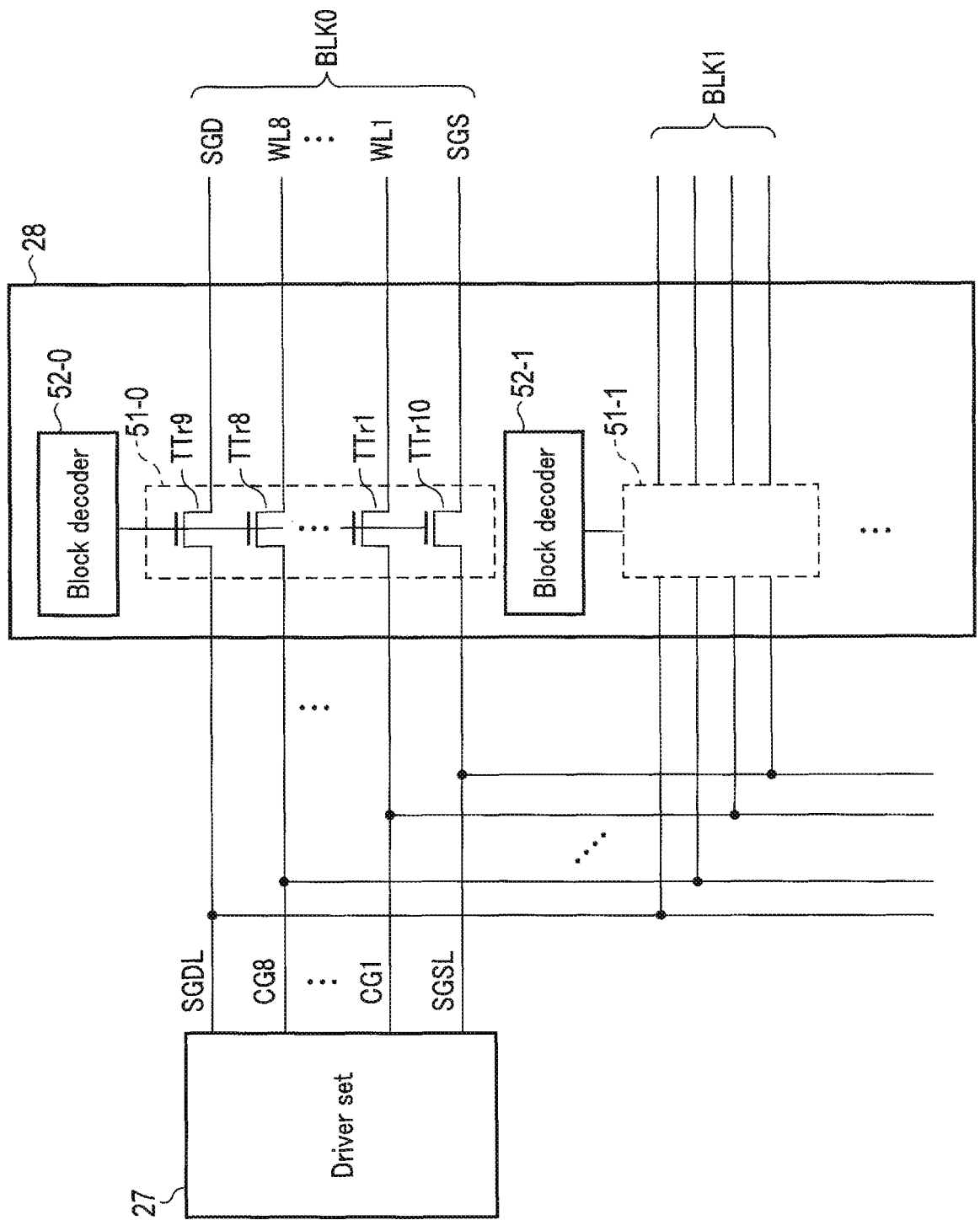
F I G. 8

| Data \ Vth order | Cell1 | Cell2 | Cell3 | Cell4 |
|---|---|---|---|---|
| 1 | 1 | 2 | 3 | 4 |
| 2 | 1 | 2 | 4 | 3 |
| 3 | 1 | 3 | 2 | 4 |
| 4 | 1 | 3 | 4 | 2 |
| 5 | 1 | 4 | 2 | 3 |
| 6 | 1 | 4 | 3 | 2 |
| 7 | 2 | 1 | 3 | 4 |
| 8 | 2 | 1 | 4 | 3 |
| 9 | 3 | 4 | 1 | 2 |
| 10 | 3 | 4 | 2 | 1 |
| 11 | 4 | 1 | 2 | 3 |
| 12 | 4 | 1 | 3 | 2 |
| 13 | 4 | 2 | 1 | 3 |
| 14 | 4 | 2 | 3 | 1 |
| 15 | 4 | 3 | 1 | 2 |
| 16 | 4 | 3 | 2 | 1 |

F I G. 10

| | First bit | Second bit | Third bit | Fourth bit | Fifth bit | Sixth bit |
|---|---|---|---|---|---|---|
| Permutation data: | 0(Cell1<Cell4) or 1(Cell1>Cell4) | 0(Cell1<Cell3) or 1(Cell1>Cell3) | 0(Cell1<Cell2) or 1(Cell1>Cell2) | 0(Cell2<Cell4) or 1(Cell2>Cell4) | 0(Cell2<Cell3) or 1(Cell2>Cell3) | 0(Cell3<Cell4) or 1(Cell3>Cell4) |

F I G. 11

| Vth relationship / Data | First bit Cell1:Cell4 | Second bit Cell1:Cell3 | Third bit Cell1:Cell2 | Fourth bit Cell2:Cell4 | Fifth bit Cell2:Cell3 | Sixth bit Cell3:Cell4 |
|---|---|---|---|---|---|---|
| 1 | 0 | 0 | 0 | 0 | 0 | 0 |
| 2 | 0 | 0 | 0 | 0 | 0 | 1 |
| 3 | 0 | 0 | 0 | 0 | 1 | 0 |
| 4 | 0 | 0 | 0 | 1 | 1 | 0 |
| 5 | 0 | 0 | 0 | 1 | 0 | 1 |
| 6 | 0 | 0 | 0 | 1 | 1 | 1 |
| 7 | 0 | 0 | 1 | 0 | 0 | 0 |
| 8 | 0 | 0 | 1 | 0 | 0 | 1 |
| 9 | 1 | 1 | 0 | 1 | 1 | 0 |
| 10 | 1 | 1 | 1 | 1 | 1 | 0 |
| 11 | 1 | 0 | 0 | 1 | 0 | 1 |
| 12 | 1 | 0 | 0 | 1 | 1 | 1 |
| 13 | 1 | 0 | 1 | 1 | 0 | 1 |
| 14 | 1 | 1 | 1 | 1 | 0 | 1 |
| 15 | 1 | 1 | 0 | 1 | 1 | 1 |
| 16 | 1 | 1 | 1 | 1 | 1 | 1 |

FIG. 12

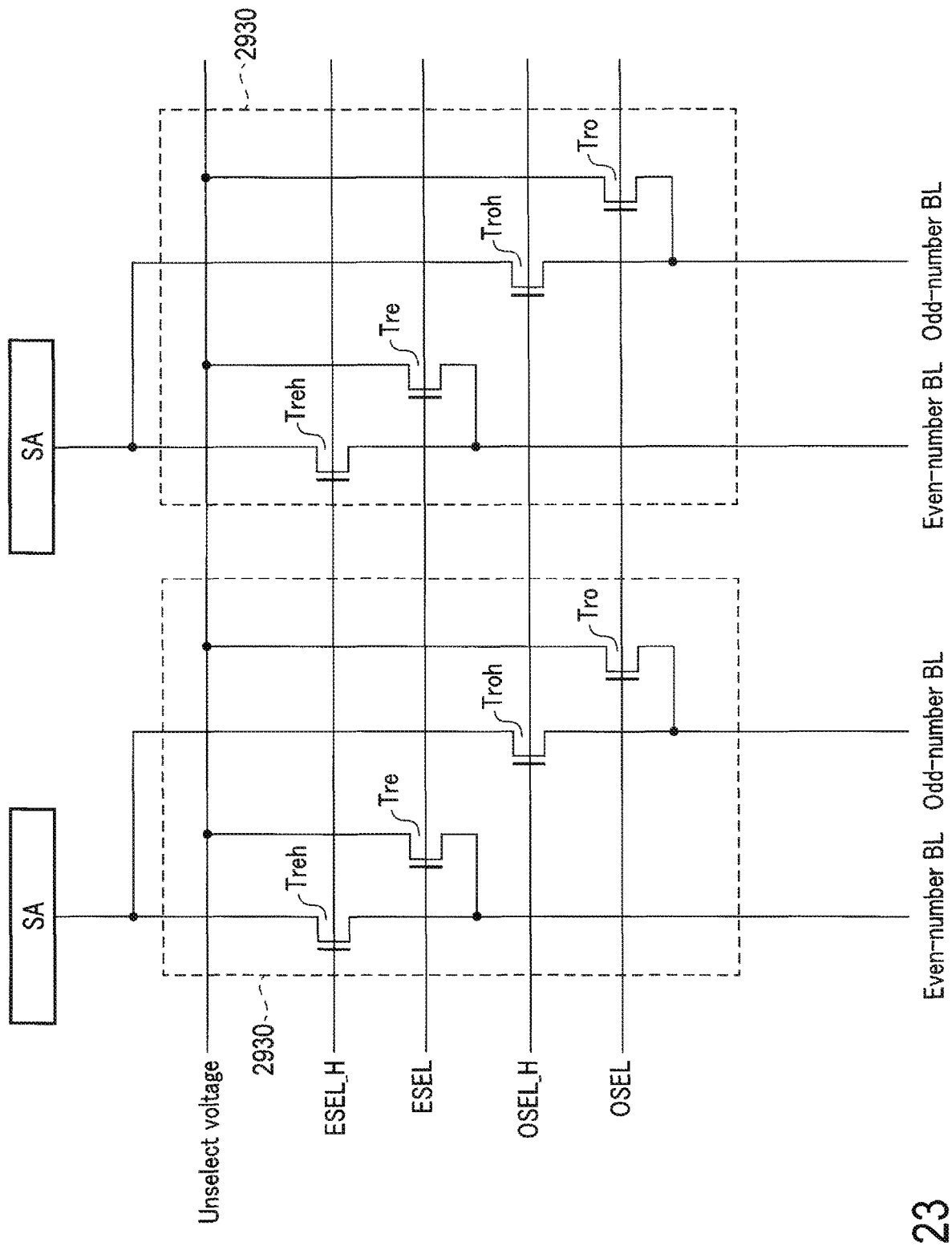
F I G. 23

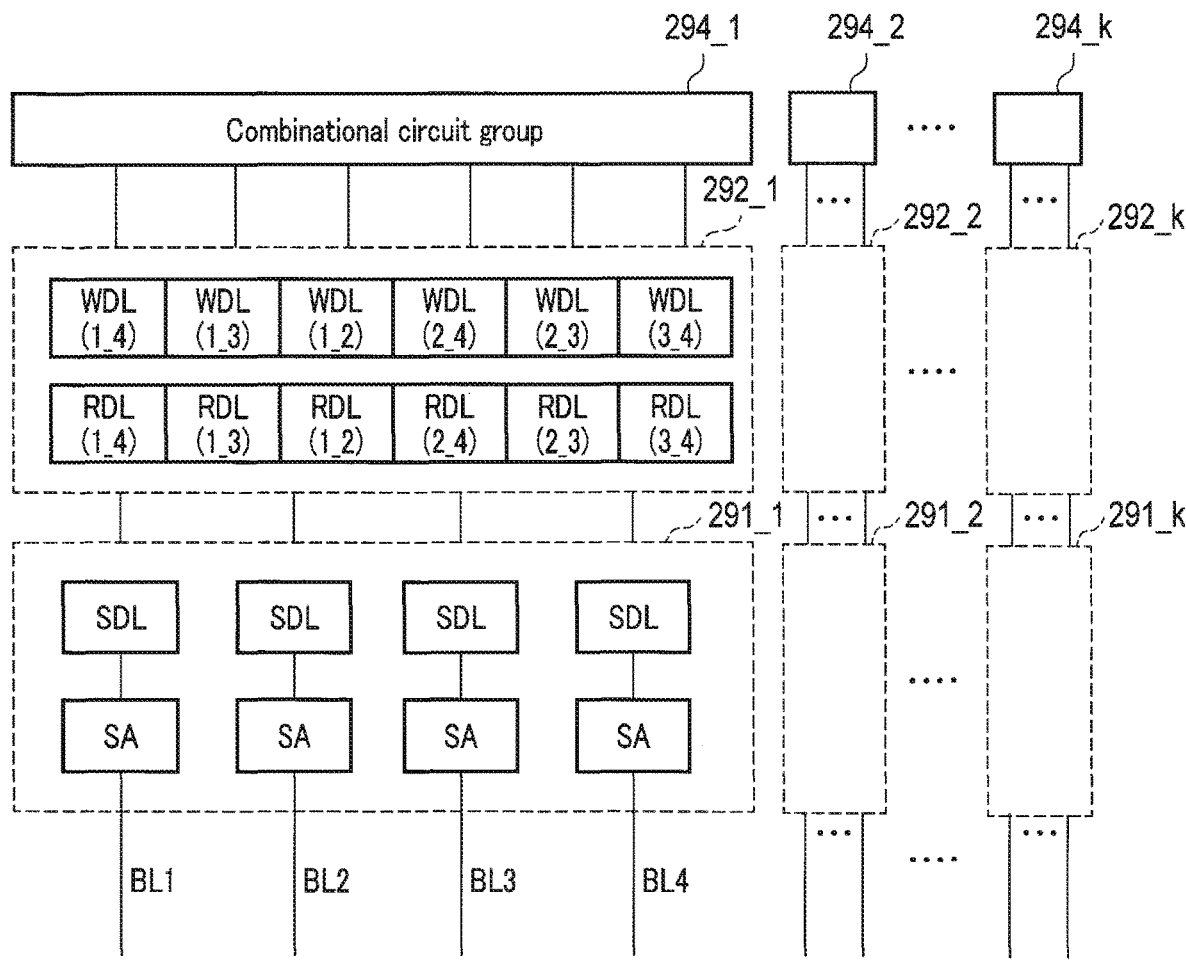
F I G. 24

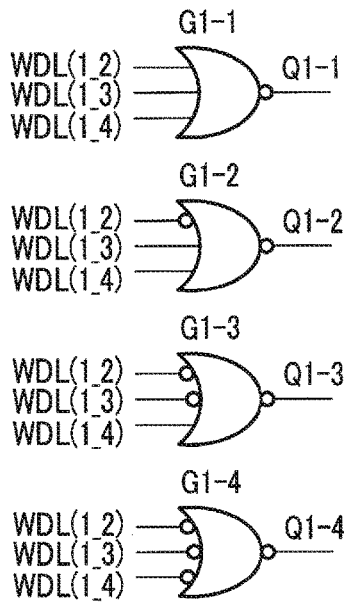
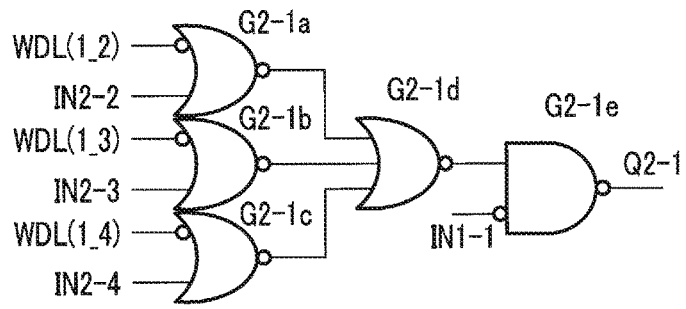
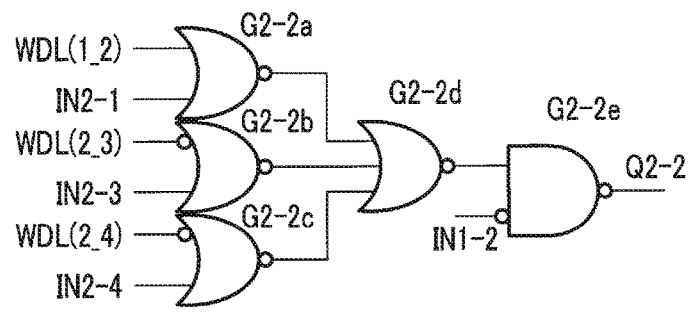
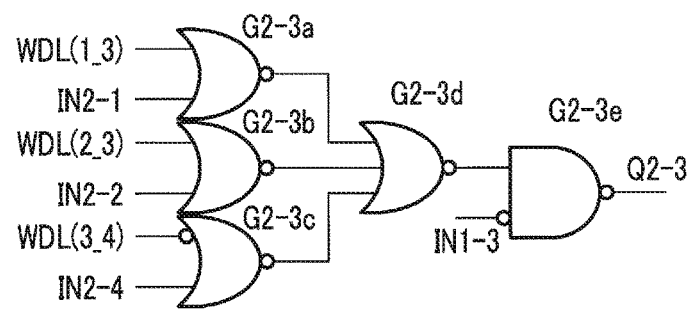
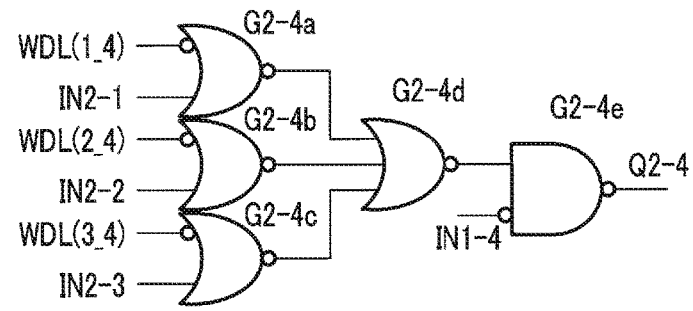
F I G. 25

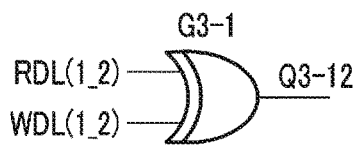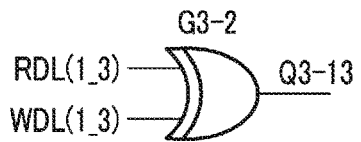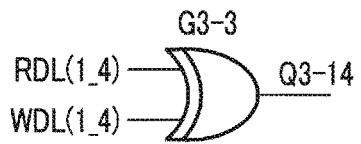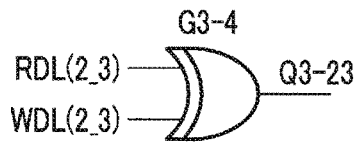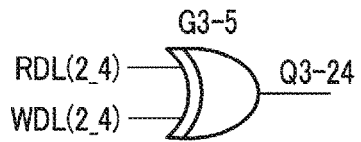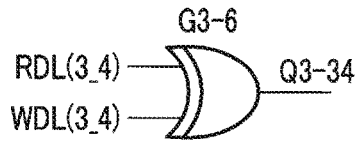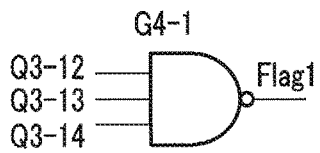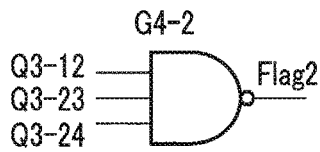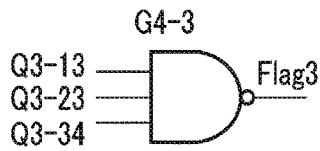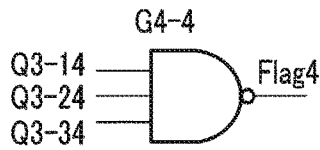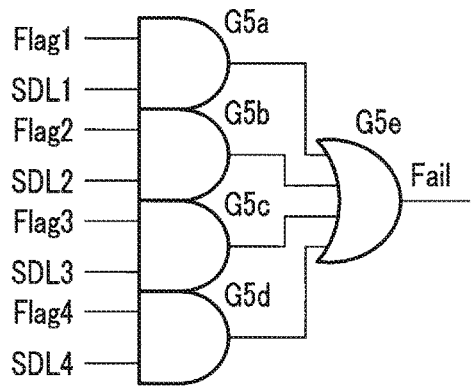
F I G. 26

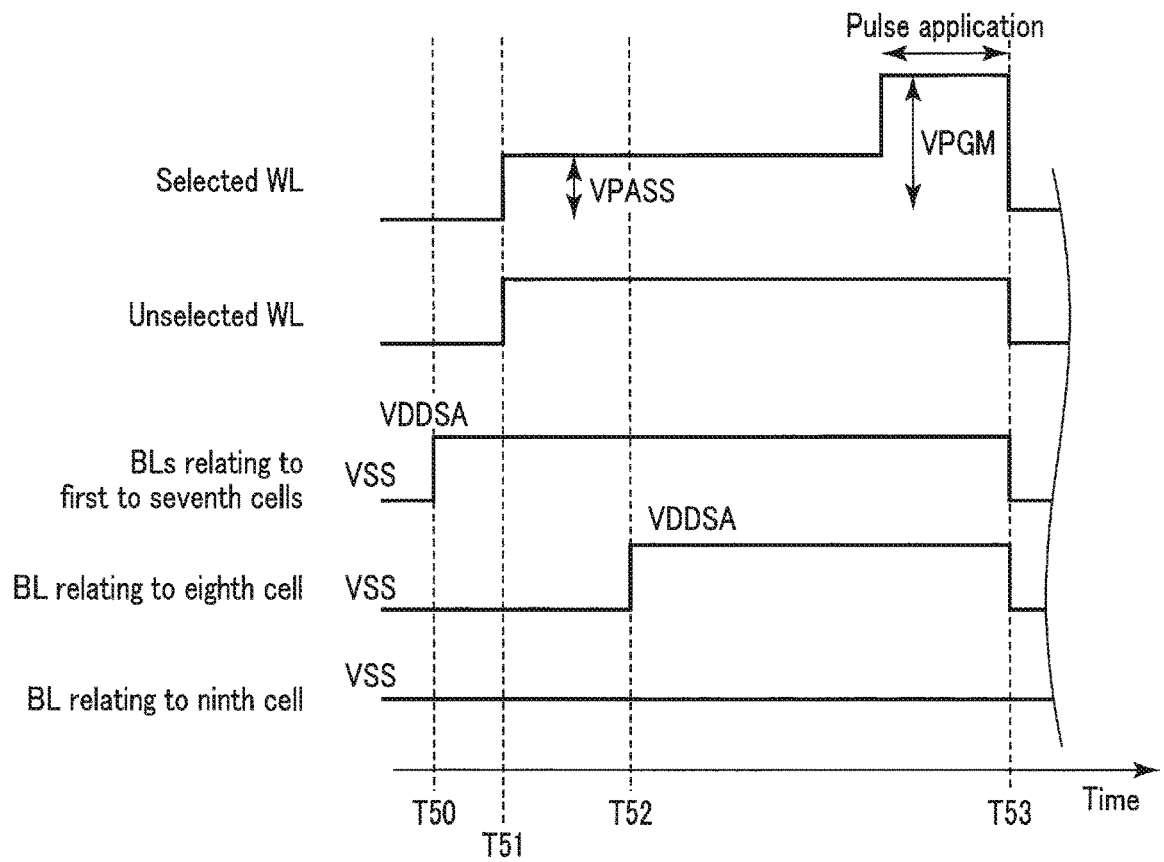
F I G. 36
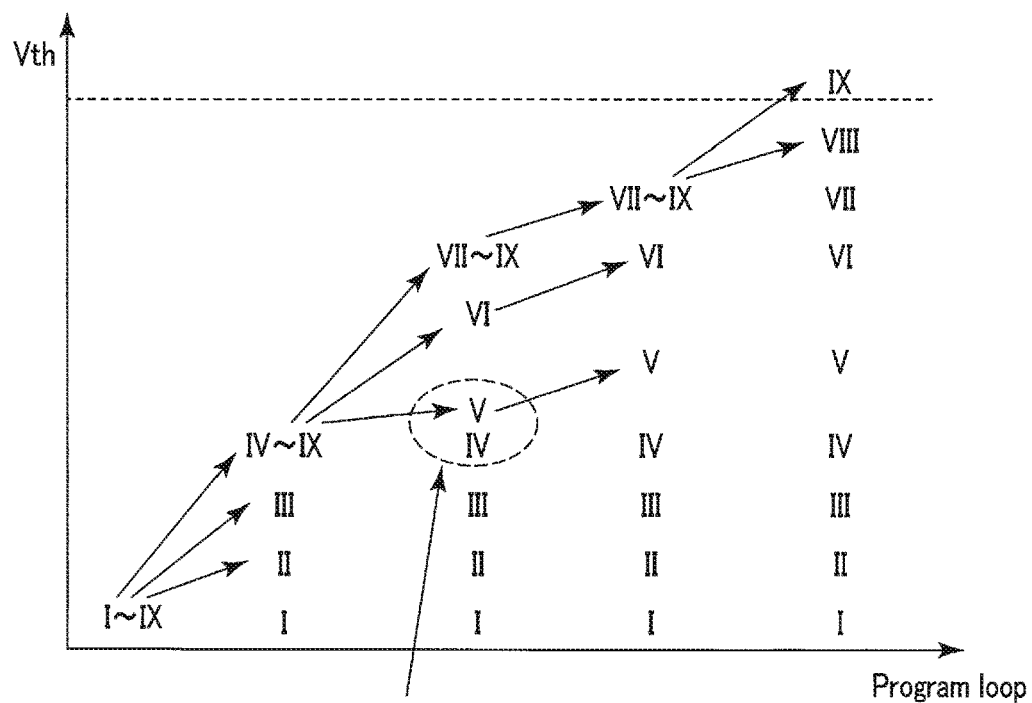
F I G. 37  Order is correct, but threshold difference is small

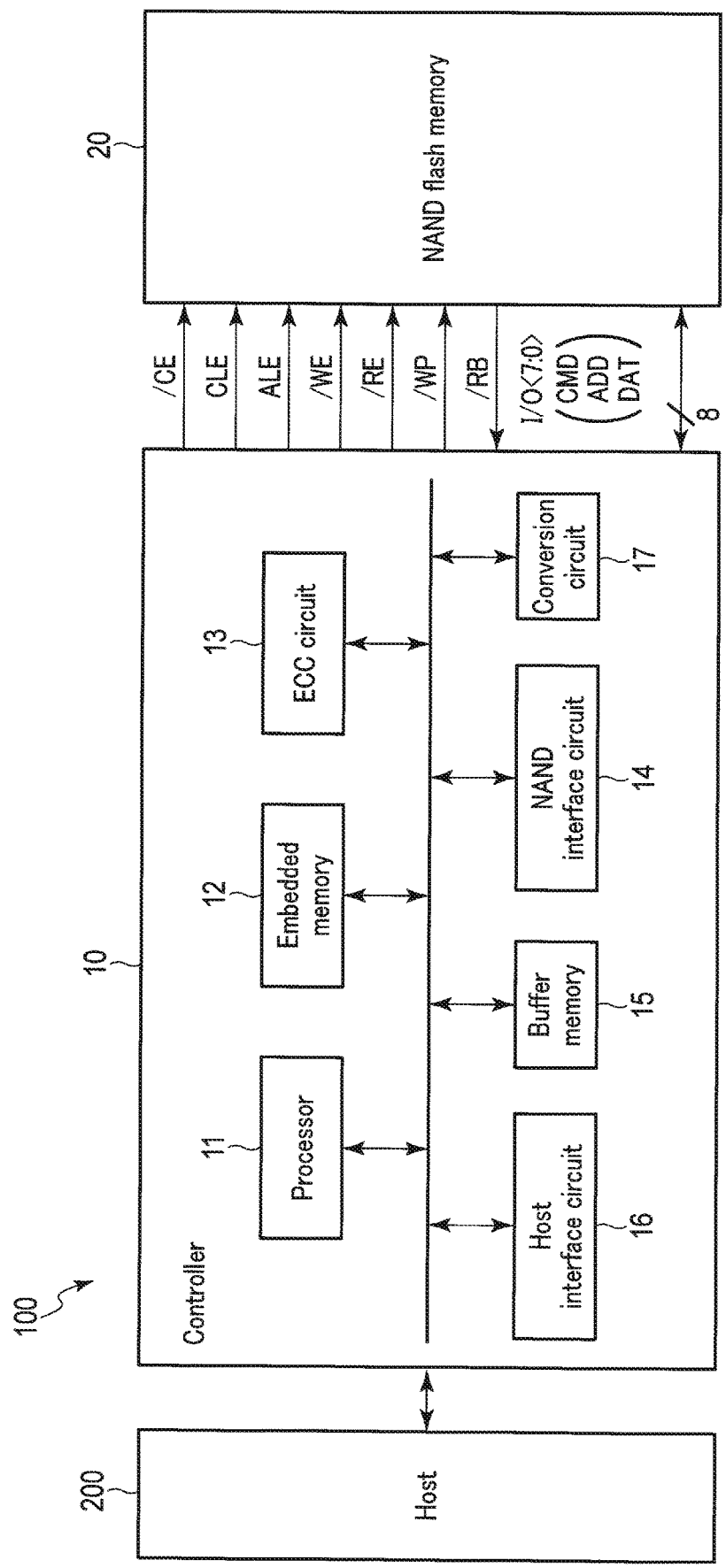
F I G. 42

SEMICONDUCTOR MEMORY DEVICE

CROSS-REFERENCE TO RELATED APPLICATIONS

This application is based upon and claims the benefit of priority from prior Japanese Patent Application No. 2018-231802, filed Dec. 11, 2018, the entire contents of which are incorporated herein by reference.

FIELD

Embodiments described herein relate to a semiconductor memory device.

BACKGROUND

As a semiconductor memory device, a NAND flash memory is known.

BRIEF DESCRIPTION OF THE DRAWINGS

FIG. 5 is a block diagram of a semiconductor memory device.

FIG. 6 is a circuit diagram of a memory cell array.

FIG. 8 is a block diagram showing a row decoder.

FIG. 10 is a diagram showing a relationship between data and orders of thresholds of memory cells.

FIG. 11 is a diagram showing a structure of permutation data.

FIG. 12 is a diagram showing a relationship between data and permutation data.

FIG. 23 is a circuit diagram showing a configuration of a multiplexer.

FIG. 24 is a block diagram showing a configuration of a sense amplifier module of a semiconductor memory device according to a third embodiment.

FIG. 25 is a circuit diagram showing a configuration of the sense amplifier module of the semiconductor memory device according to the third embodiment.

FIG. 26 is a circuit diagram showing a configuration of the sense amplifier module of the semiconductor memory device according to the third embodiment.

FIG. 36 is a waveform diagram showing operation waveforms in the fourth write method.

FIG. 37 is a diagram showing changes of thresholds of memory cells in a program loop.

FIG. 42 is a block diagram of another example of the memory system.

DETAILED DESCRIPTION

Figure 1:
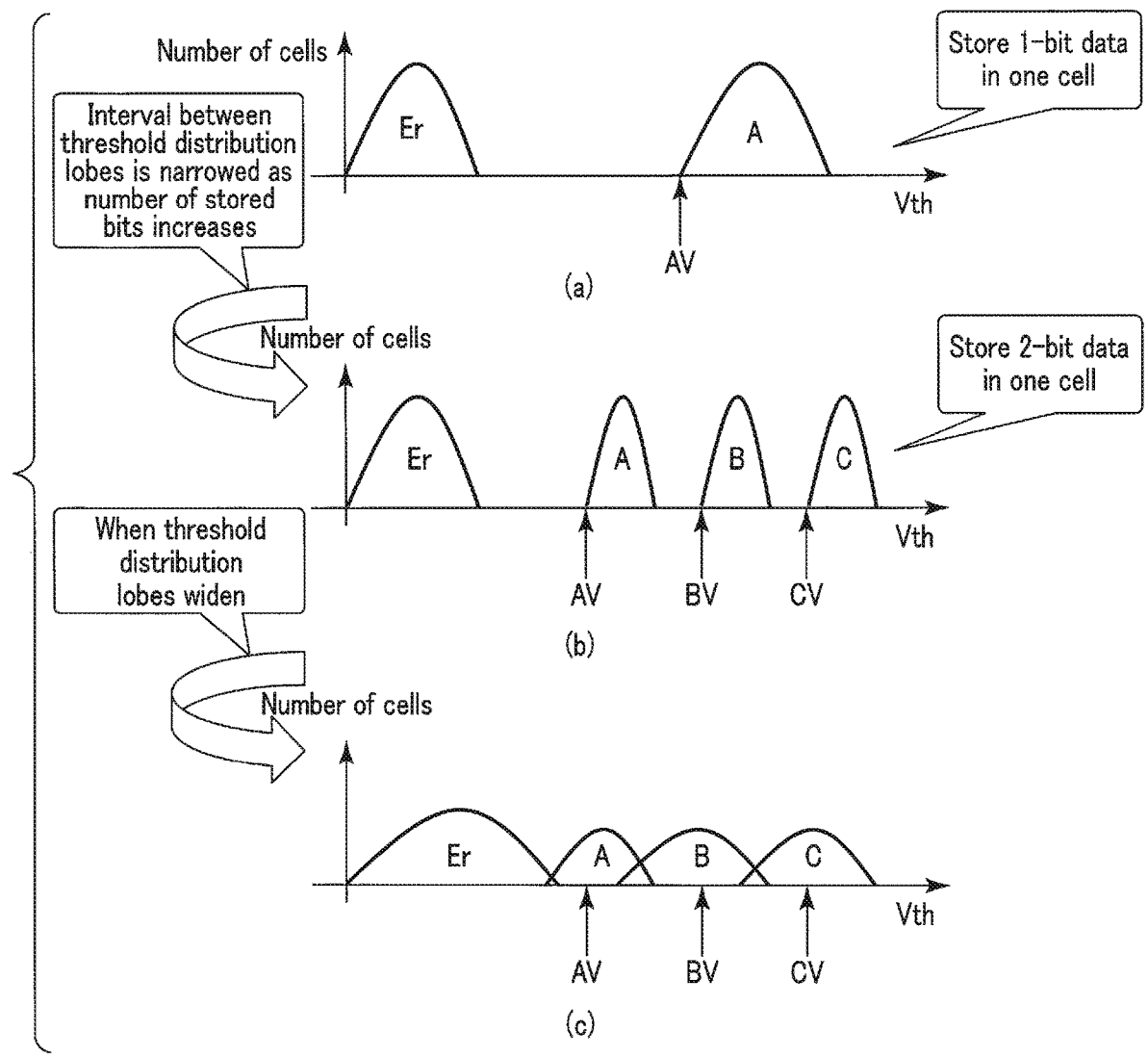
FIG. 1 is a diagram showing an example of a storage method of a semiconductor memory device.

In generally, according to one embodiment, a semiconductor memory device includes a plurality of memory cells; a first circuit configured to convert first data into second data relating to an order of thresholds of the memory cells; and a second circuit configured to perform a write operation on the memory cells based on the second data.

Hereinafter, details of embodiments will be described with reference to the drawings. In the description, common parts are assigned with common reference numerals throughout the drawings.

<1> First Embodiment

<1-1> Outline

First, an outline of the first embodiment will be described.

One of the storage methods of a nonvolatile semiconductor memory device is a method of storing data by bringing the threshold of a memory cell to a predetermined voltage.

For example, as shown in FIG. 1, when 1-bit (binary) data is stored in one memory cell, the threshold of the memory cell is brought to the "Er" level or the "A" level (equal to or larger than the reference value AV). In this way, when 1-bit data is stored in one memory cell, a sufficient interval can be secured between the "Er"-level threshold distribution lobe and the "A"-level threshold distribution lobe.

However, there is a demand for storing multi-bit (multi-valued) data in one memory cell. As shown in FIG. 1, when multi-bit (e.g., 2-bit) data is stored in one cell, a plurality of reference values (AV, BV, and CV) are provided. Therefore, data is required to be written in a narrower threshold distribution lobe than when 1-bit data is stored in one memory cell.

However, as the size of the semiconductor memory device is reduced, the range of variation among memory cells increases, and the threshold distribution lobes may widen under the influence of a disturb or temperature change. In this case, adjacent threshold distribution lobes may overlap with each other, or a threshold distribution lobe may fall below a reference value, as shown in FIG. 1.

As the number of bits stored in one memory cell increases, a plurality of read operations need to be performed while changing the read electrical potential, and the read time increases.

Figure 2:
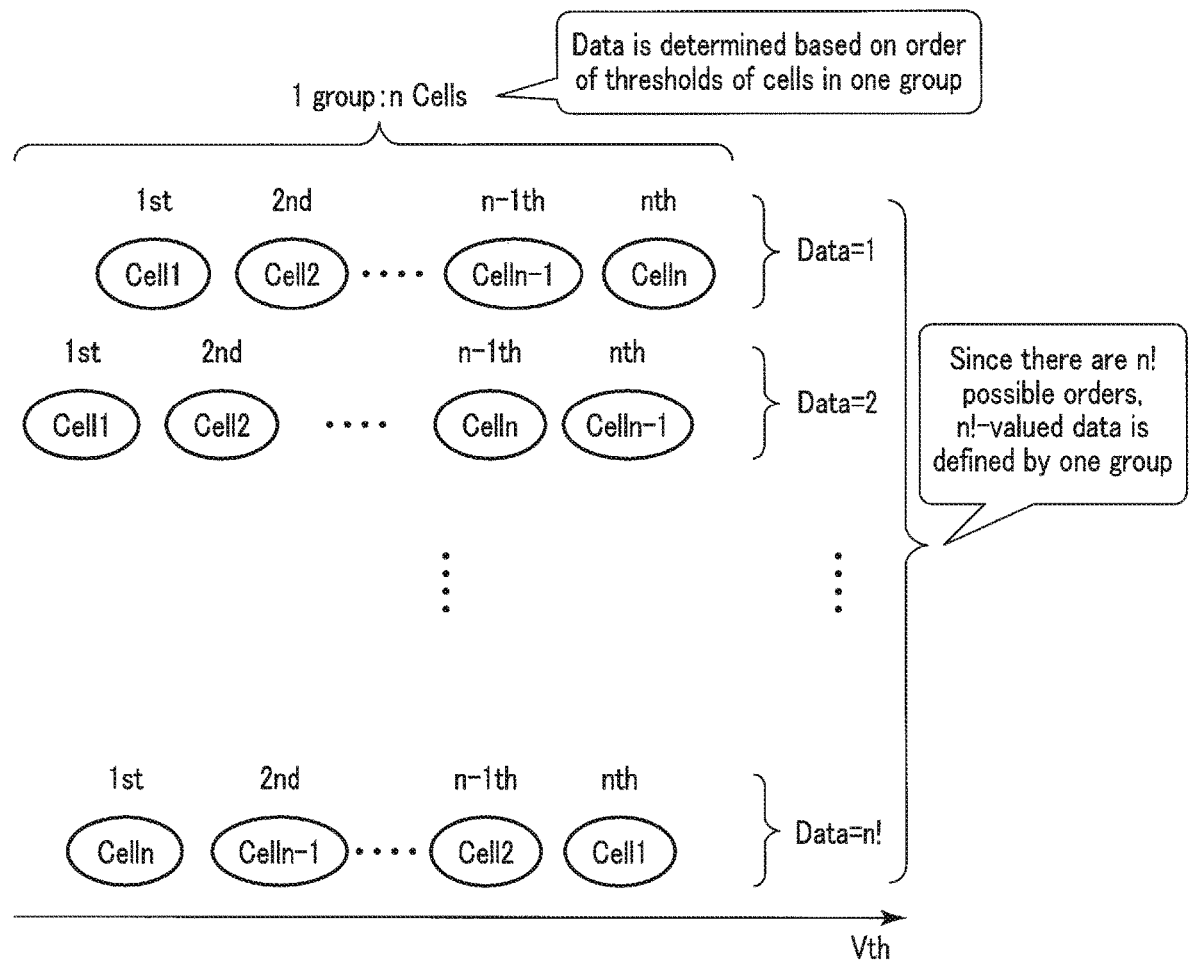
FIG. 2 is a diagram showing an example of another storage method of a semiconductor memory device.

In contrast, as another storage method of a nonvolatile semiconductor memory device, a method of forming a group of a plurality of memory cells (for example, n memory cells (n is any integer)), and determining data in accordance with the order of the thresholds of the memory cells in the group (see FIG. 2).

As shown in FIG. 2, when one group includes n memory cells, there are n! possible orders of the thresholds of the memory cells. Namely, n!-valued data can be defined by one group.

Figure 3:
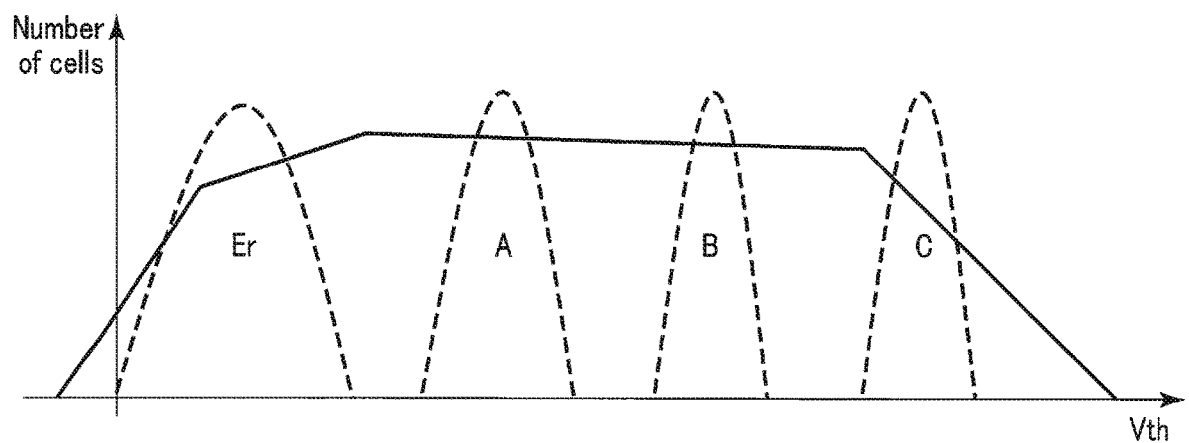
FIG. 3 is threshold distribution of memory cells in the case where another storage method of a semiconductor memory device is adopted.

In the method of FIG. 1, there are 4 distribution lobes shown in FIG. 3 by broken lines. Unlike in the method of FIG. 1, thresholds are not in correspondence with data in the method of FIG. 2. Therefore, the threshold distribution of the memory cells in the method of FIG. 2 appears to have one lobe as shown in FIG. 3.

Hereinafter, a semiconductor memory device adopting the method of FIG. 2 will be described.

<1-2> Configuration

First, a configuration of a semiconductor memory device according to the first embodiment will be described.

<1-2-1> Overall Configuration of Memory System

Figure 4:
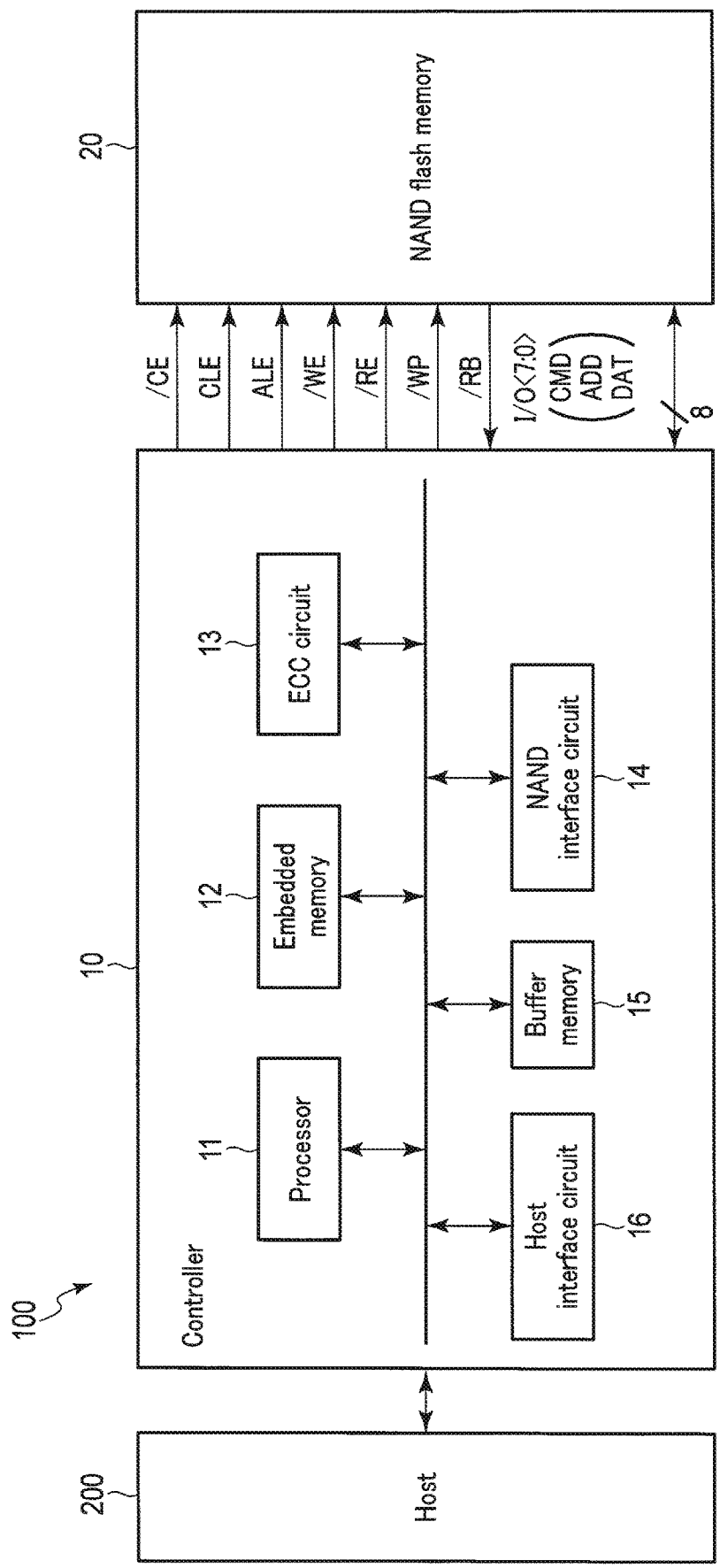
FIG. 4 is a block diagram of a memory system.

A configuration example of a memory system according to the first embodiment will be described with reference to FIG. 4. FIG. 4 is a block diagram showing an example of the configuration of the memory system according to the first embodiment. The memory system 100 communicates with, for example, an external host device 200. The memory system 100 holds data from the host device 200, and reads out data to the host device 200.

As shown in FIG. 4, the memory system 100 includes a memory controller 10 and a semiconductor memory device (NAND flash memory) 20. The memory controller 10 receives an instruction from the host device 200, and controls the semiconductor memory device 20 based on the received instruction. Specifically, the memory controller 10 writes data, which the host device 200 instructed the memory controller 10 to write, in the semiconductor memory device 20, and reads data, which the host device 200 instructed the memory controller 10 to read, from the semiconductor memory device 20 and transmits the data to the host device 200. The memory controller 10 is coupled to the semiconductor memory device 20 via NAND buses. The semiconductor memory device 20 includes a plurality of memory cells to volatilely store data.

The NAND buses are used for transmission and reception of respective signals /CE, CLE, ALE, /WE, /RE, /WP, /RB, and I/O<7:0> compatible with a NAND interface. The signal /CE is a signal for enabling the semiconductor memory device 20. The signal CLE notifies the semiconductor memory device 20 that the signal I/O<7:0> which flows into the semiconductor memory device 20 when the signal CLE is at the "H (high)" level is a command. The signal ALE notifies the semiconductor memory device 20 that the signal I/O<7:0> which flows into the semiconductor memory device 20 when the signal ALE is at the "H" level is an address. The signal /WE instructs the semiconductor memory device 20 to take therein the signal I/O<7:0> which flows into the semiconductor memory device 20 when the signal /WE is at the "L (low)" level. The signal /RE instructs the semiconductor memory device 20 to output the signal I/O<7:0>. The signal /WP instructs the semiconductor memory device 20 not to write or erase data. The signal /RB indicates whether the semiconductor memory device 20 is in a ready state (in which the semiconductor memory device 20 accepts external instructions) or in a busy state (in which the semiconductor memory device 20 does not accept external instructions). The I/O<7:0> is, for example, an 8-bit signal. The I/O<7:0> is an entity of data transmitted and received between the semiconductor memory device 20 and the memory controller 10, and includes a command CMD, an address ADD, and data DAT. The data DAT includes write data and read data.

<1-2-2> Configuration of Controller

With continuous reference to FIG. 4, the controller of the memory system according to the first embodiment will be described. The memory controller 10 includes a processor (central processing unit; CPU) 11, an embedded memory (random access memory; RAM) 12, an error check and correction (ECC) circuit 13, a NAND interface circuit 14, a buffer memory 15, and a host interface circuit 16.

The processor 11 controls the operation of the entire memory controller 10. In response to, for example, a data read instruction received from the host device 200, the processor 11 issues a read instruction based on the NAND interface to the semiconductor memory device 20. A similar operation is performed in the write operation and erase operation. The processor 11 also has a function of executing various arithmetic operations on data read from the semiconductor memory device 20.

The embedded memory 12 is a semiconductor memory such as a dynamic random access memory (DRAM), and is used as a work area of the processor 11. The embedded memory 12 holds, for example, firmware for managing the semiconductor memory device 20, and various management tables.

The ECC circuit 13 performs error detection and error correction processing. Specifically, when data is written, the ECC circuit 13 generates an ECC code for a certain number of data sets based on data received from the host device 200. When data is read, the ECC circuit 13 performs ECC decoding based on the ECC code, and detects whether there is an error. When an error is detected, the ECC circuit 13 specifies the bit location and corrects the error.

The NAND interface circuit 14 is coupled to the semiconductor memory device 20 via a NAND bus, and controls communication with the semiconductor memory device 20. In accordance with an instruction of the processor 11, the NAND interface circuit 14 transmits a command CMD, an address ADD, and write data to the semiconductor memory device 20. The NAND interface circuit 14 receives read data from the semiconductor memory device 20.

The buffer memory 15 temporarily holds data or the like which the memory controller 10 has received from the semiconductor memory device 20 and the host device 200. The buffer memory 15 is also used as a storage area that temporarily holds, for example, data read from the semiconductor memory device 20 and the result of an arithmetic operation on the read data.

The host interface circuit 16 is coupled to the host device 200, and controls communication with the host device 200. The host interface circuit 16 transfers, for example, an instruction and data received from the host device 200 to the processor 11 and buffer memory 15, respectively.

[1-2-3] Configuration of Semiconductor Memory Device

Next, a configuration example of the semiconductor memory device according to the first embodiment will be described with reference to FIG. 5. FIG. 5 is a block diagram showing an example of the configuration of the semiconductor memory device according to the first embodiment.

The semiconductor memory device 20 includes a memory cell array 21, an input/output circuit 22, a logic control circuit 23, a register 24, a sequencer 25, a voltage generation circuit 26, a driver set 27, a row decoder 28, and a sense amplifier module 29.

The memory cell array 21 includes a plurality of blocks BLK. The block BLK includes a plurality of nonvolatile memory cell transistors (not shown), each of which is associated with a bit line and a word line. The block BLK is, for example, a data erase unit, and data in the same block BLK is collectively erased. Each block BLK includes a plurality of string units SU. Each string unit SU is a set of NAND strings NS. Each NAND string NS includes a plurality of memory cell transistors. Hereinafter, the memory cell transistor is also simply referred to as a "memory cell" or a "cell". The unit of a plurality of memory cell transistors coupled to the same word line is referred to as a group GP. In the semiconductor memory device according to the present embodiment, data is stored in units of groups. The number of blocks in the memory cell array 21, the number of string units in one block BLK, the number of NAND strings in one string unit SU, and the number of memory cell transistors in one group may be set at will. In particular, the relationship between each group and memory cell transistors is stored in, for example, the input/output circuit 22.

The input/output circuit 22 transmits and receives the signal I/O<7:0> to and from the memory controller 10. The input/output circuit 22 transfers the command CMD and address ADD in the signal I/O<7:0> to the register 24. The input/output circuit 22 transmits and receives write data and read data to and from the sense amplifier module 29. The input/output circuit 22 includes a conversion circuit 22a. When receiving the signal I/O<7:0>, the conversion circuit 22a converts it into permutation data in units of bits that can be stored by one group (four bits when one group is constituted by four cells). The permutation data is a data format for defining permutation information (the order of the thresholds of cells).

The logic control circuit 23 receives the signals /CE, CLE, ALE, /WE, /RE, and/WP from the memory controller 10. The logic control circuit 23 also transfers the signal/RB to the memory controller 10 to report the state of the semiconductor memory device 20 to the outside.

The register 24 holds the command CMD and the address ADD. The register 24 transfers the address ADD to the row decoder 28 and the sense amplifier module 29, and transfers the command CMD to the sequencer 25.

The sequencer 25 receives the command CMD, and controls the entire semiconductor memory device 20 in accordance with a sequence based on the received command CMD.

The voltage generation circuit 26 generates a voltage required for an operation such as a data write operation, data read operation, or data erase operation, based on an instruction from the sequencer 25. The voltage generation circuit 26 supplies the generated voltage to the driver set 27.

The driver set 27 includes a plurality of drivers, and supplies various voltages from the voltage generation circuit 26 to the row decoder 28 and the sense amplifier module 29 based on the address from the register 24. The driver set 27, for example, supplies various voltages to the row decoder 28 based on the row address in the address.

The row decoder 28 receives the row address in the address ADD from the register 24, and selects a block BLK or the like based on, for example, a block address in the row address. A voltage from the driver set 27 is transferred to the selected block BLK via the row decoder 28.

When data is read, the sense amplifier module 29 senses data read from a memory cell transistor out to a bit line, and transfers the sensed read data to the input/output circuit 22. When data is written, the sense amplifier module 29 transfers write data written via a bit line to a memory cell transistor. The sense amplifier module 29 also receives a column address in the address ADD from the register 24, and outputs data of a column based on the column address.

<1-2-4> Configuration of Memory Cell Array

A configuration of the memory cell array of the semiconductor memory device according to the first embodiment will be described with reference to FIG. 6. FIG. 6 is an example of a circuit diagram for illustrating a configuration of the memory cell array of the semiconductor memory device according to the first embodiment.

As shown in FIG. 6, each NAND string NS includes, for example, eight memory cell transistors MT (MT1 to MT8), a select transistor ST1, and a select transistor ST2. The number of memory cell transistors MT is not limited to 8, and may be, but is not limited to, 16, 32, 64, 96, or 128, etc. The memory cell transistor MT includes a stacked gate including a control gate and a charge storage layer. Each memory cell transistors MT is coupled between the select transistors ST1 and ST2 in series. In the following description, the term "couple" includes the case where a conductive element is provided between the coupled elements.

As show in FIG. 6, one group GP includes a plurality of (e.g., four) memory cell transistors coupled to the same word line WL. Here, data is stored in units of groups.

The memory cell array may have other configurations. That is, the memory cell array may have the configuration described in, for example, U.S. patent application Ser. No. 12/407,403, entitled "Three-dimensional Stacked Nonvolatile Semiconductor Memory", filed on Mar. 19, 2009. Alternatively, the memory cell array may have the configuration described in U.S. patent application Ser. No. 12/406,524, entitled "THREE-DIMENSIONAL STACKED NON-VOLATILE SEMICONDUCTOR MEMORY", filed on Mar. 18, 2009, U.S. patent application Ser. No. 12/679,991, entitled "NONVOLATILE SEMICONDUCTOR MEMORY DEVICE AND MANUFACTURING METHOD THEREOF", filed on Mar. 25, 2010, or U.S. patent application Ser. No. 12/532,030, entitled "SEMICONDUCTOR MEMORY and MANUFACTURING METHOD THEREOF", filed on Mar. 23, 2009. The entire contents of those patent applications are incorporated herein by reference.

<1-2-5> Configuration of Sense Amplifier Module

A configuration of the sense amplifier module of the semiconductor memory device according to the first embodiment will be described with reference to FIG. 7.

Figure 7:
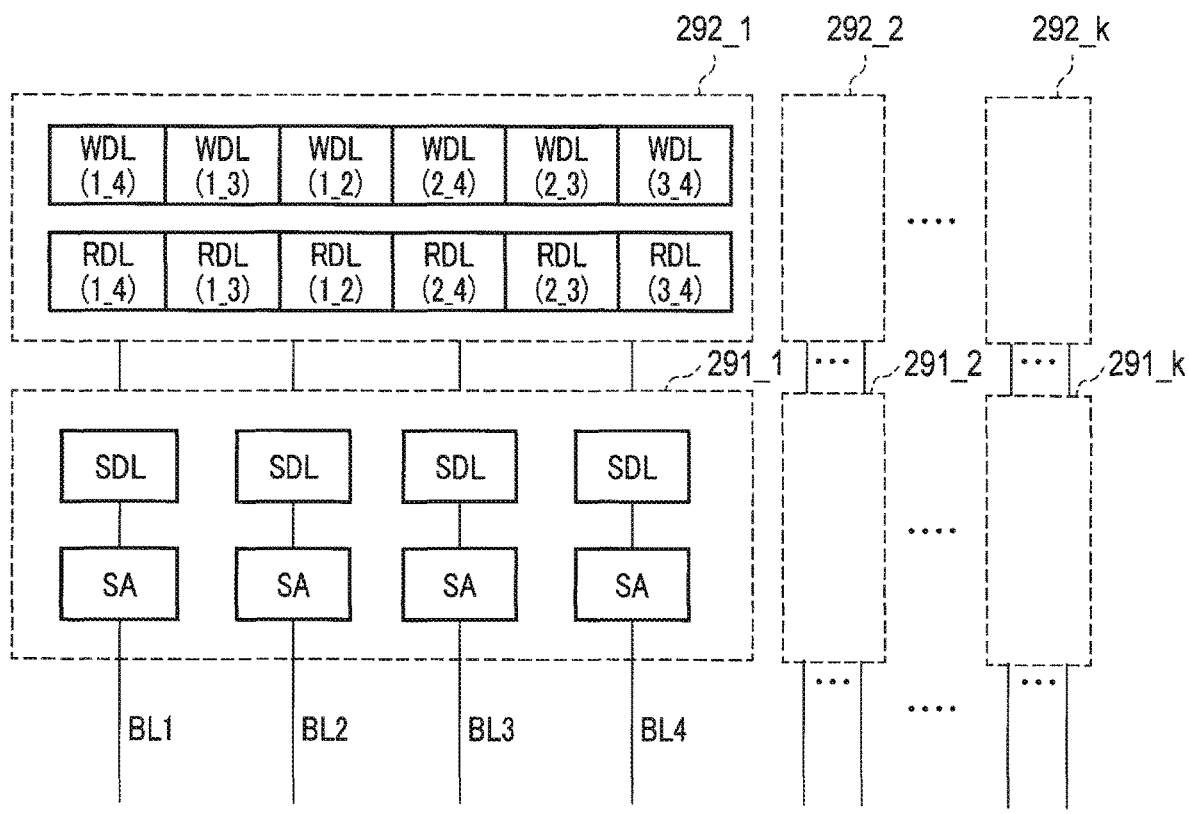
FIG. 7 is a block diagram showing a sense amplifier module.

As shown in FIG. 7, the sense amplifier module 29 of the semiconductor memory device according to the first embodiment includes a plurality of sense units 291 (291_1 to 291_$k$) and latch units 292 (292_1 to 292_$k$).

In each sense unit 291, a set of a sense amplifier SA and a latch circuit SDL relating to one group GP is provided for each bit line.

The sense amplifier SA reads data from a memory cell via a bit line BL, and stores the data in the latch circuit SDL.

The latch circuit SDL stores data read by the sense amplifier SA or data to be written in the memory cell.

Each latch unit 292 includes a plurality of latch circuits WDL and latch circuits RDL.

The latch circuit WDL stores data used when data is written in a memory cell. Data stored in each latch circuit WDL will be described later. The number of latch circuits WDL is $_nC_2$ (n is the number of cells per group).

The latch circuit RDL stores information read from a memory cell. Data stored in each latch circuit RDL will be described later. The number of latch circuits RDL is $_nC_2$ (n is the number of cells per group).

<1-2-6> Configuration of Row Decoder

Next, a configuration of the row decoder of the semiconductor memory device according to the first embodiment will be described with reference to FIG. 8.

As shown in FIG. 8, the row decoder 28 includes a plurality of transfer switch groups 51, and a plurality of block decoders 52.

One transfer switch group 51 and one block decoder 52 are allocated to, for example, one block BLK. In the example of FIG. 8, a transfer switch group 51-0 and a block decoder 52-0 are allocated to a block BLK0, whereas a transfer switch group 51-1 and a block decoder 52-1 are allocated to a block BLK1. In the following description, a block BLK on which a write, read or erase operation is performed is called a "selected block BLK", and a block BLK other than the selected block BLK is called an "unselected block BLK".

The transfer switch group 51 includes, for example, ten transfer transistors TTr (TTr1 to TTr10).

The transfer transistors TTr1 to TTr8 transfer voltages supplied from the driver set 27 to interconnects CG (CG1 to CG8) to word lines WL1 to WL8 of the selected block BLK, respectively. The transfer transistors TTr1 to TTr8 include first ends coupled to the word lines WL1 to WL8 of the corresponding block BLK, second ends coupled to interconnects CG1 to CG8, and gates coupled in common to a node BLKSEL, respectively.

The transfer transistor TTr9 transfers a voltage supplied from the driver set 27 to an interconnect SGDL to a select gate line SGD of the selected block BLK. The transfer transistor TTr9 includes a first end coupled to the select gate line SGD of the corresponding block BLK, a second end coupled to the interconnect SGDL, and a gate coupled to the node BLKSEL.

The transfer transistor TTr10 transfers a voltage supplied from the driver set 27 to an interconnect SGSL to a select gate line SGS of the selected block BLK. The transfer transistor TTr10 includes a first end coupled to the select gate line SGS of the corresponding block BLK, a second end coupled to the interconnect SGSL, and a gate coupled to the node BLKSEL.

The block decoder 52 decodes a block address signal received from the register 24 when data is written, read, or erased. When determining that the block BLK corresponding to the block decoder 52 is a selected block BLK as a result of the decoding, the block decoder 52 outputs an "H"-level signal to the node BLKSEL. When determining that the corresponding block BLK is not a selected block BLK, the block decoder 52 outputs an "L"-level signal to the node BLKSEL. The signal output to the node BLKSEL turns on the transfer transistors TTr1 to TTr10 when the signal is at the "H" level, and turns off the transfer transistors TTr1 to TTr10 when the signal is at the "L" level.

The driver set 27 supplies voltages to the interconnects CG, SGDL, and SGSL in accordance with the address ADD received from the register 24. The interconnects CG, SGDL, and SGSL transfer various voltages supplied from the driver set 27 to the respective transfer switch groups 51-0, 51-1, . . . . Namely, the voltages supplied from the driver set 27 are transferred to the word line WL and selected gate lines SGD and SGS in the selected block BLK via the transfer transistors TTr1 to TTr10 in the transfer switch group 51 corresponding to the selected block BLK.

<1-3> Operation

<1-3-1> Data Storage Method

A data storage method of the nonvolatile semiconductor memory device according to the present embodiment will be described.

As described above, the storage method of the nonvolatile semiconductor memory device according to the present embodiment is a method of dividing one page into groups of a plurality of cells (e.g., four cells), and determining data based on the permutation of the thresholds of the cells in one group. Such data will be referred to as permutation data.

Figure 9:
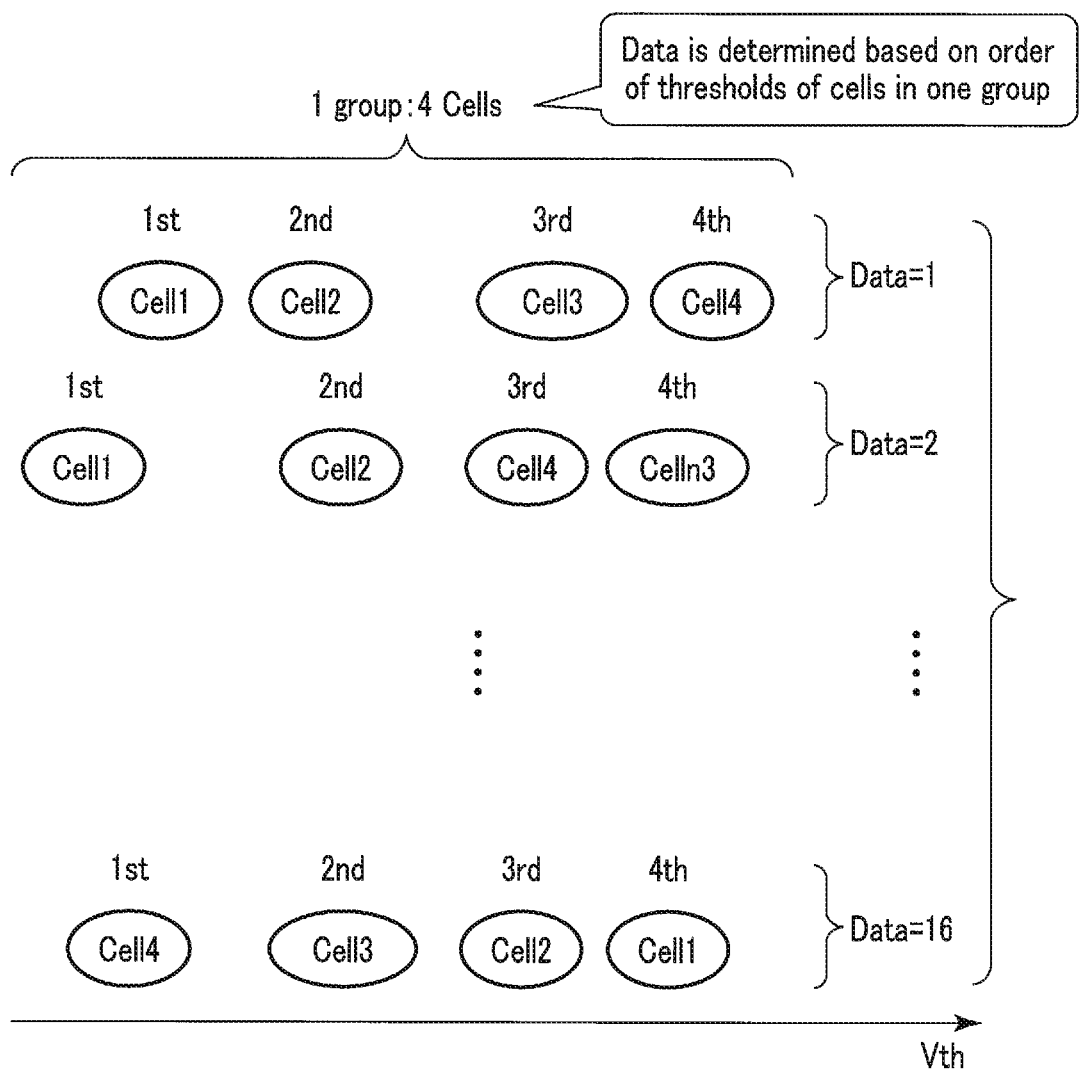
FIG. 9 is a diagram showing an example of a storage method of a semiconductor memory device according to embodiments.

As shown in FIGS. 9 and 10, for example, when four cells constitute one group, the number of possible orders of the cells is 41 (24) (hexadecimal). When converted into a number of bits, the orders correspond to $Log_2 24 = 4.58$ bits.

When converted into a number of bits per cell, the orders correspond to 1.15 bits/cell. This storage density is equivalent to that of a so-called single level cell (SLC). When the number of cells in one group is increased, the number of bits per cell increases.

<1-3-2> Data Format

As shown in FIG. 11, the permutation data in the present embodiment is constituted by a relationship between the thresholds of each set of two cells. In the permutation data of the case where four cells (cell 1 to cell 4) belong to one group, the relationship between the thresholds of the cell 1 and the cell 4 is defined in the first bit, the relationship between the thresholds of the cell 1 and the cell 3 is defined in the second bit, the relationship between the thresholds of the cell 1 and the cell 2 is defined in the third bit, the relationship between the thresholds of the cell 2 and the cell 4 is defined in the fourth bit, the relationship between the thresholds of the cell 2 and the cell 3 is defined in the fifth bit, and the relationship between the thresholds of the cell 3 and the cell 4 is defined in the sixth bit.

As shown in FIG. 11, when the threshold of the cell 1 is smaller than the threshold of the cell 4, the value of the first bit is "0". When the threshold of the cell 1 is larger than the threshold of the cell 4, the value of the first bit is "1".

As shown in FIG. 11, when the threshold of the cell 1 is smaller than the threshold of the cell 3, the value of the second bit is "0". When the threshold of the cell 1 is larger than the threshold of the cell 3, the value of the second bit is "1".

As shown in FIG. 11, when the threshold of the cell 1 is smaller than the threshold of the cell 2, the value of the third bit is "0". When the threshold of the cell 1 is larger than the threshold of the cell 2, the value of the third bit is "1".

As shown in FIG. 11, when the threshold of the cell 2 is smaller than the threshold of the cell 4, the value of the fourth bit is "0". When the threshold of the cell 2 is larger than the threshold of the cell 4, the value of the fourth bit is "1".

As shown in FIG. 11, when the threshold of the cell 2 is smaller than the threshold of the cell 3, the value of the fifth bit is "0". When the threshold of the cell 2 is larger than the threshold of the cell 3, the value of the fifth bit is "1".

As shown in FIG. 11, when the threshold of the cell 3 is smaller than the threshold of the cell 4, the value of the sixth bit is "0". When the threshold of the cell 3 is larger than the threshold of the cell 4, the value of the sixth bit is "1".

FIG. 12 shows the correspondence between hexadecimal data and permutation data. Specifically, when data "1" is input, the input/output circuit 22 generates "000000" as permutation data. Similarly, when data "2" to "16" is input, the input/output circuit 22 generates permutation data in accordance with the above-described rule.

<1-3-3> Permutation Data and Latch Circuits WDL

To write permutation data of four cells as described above, $_4C_2$ (=6) latch circuits WDL are required.

Figure 13:
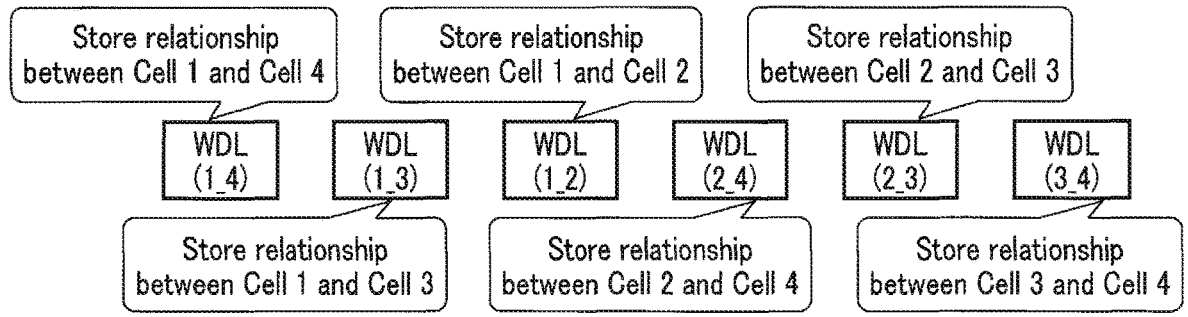
FIG. 13 is a diagram showing data stored in latch circuits.

As shown in FIG. 13, the nonvolatile semiconductor memory device according to the present embodiment includes six latch circuits WDL. A latch circuit WDL(1_4) stores the first bit of permutation data. A latch circuit WDL(1_3) stores the second bit of permutation data. A latch circuit WDL(1_2) stores the third bit of permutation data. A latch circuit WDL(2_4) stores the fourth bit of permutation data. A latch circuit WDL(2_3) stores the fifth bit of permutation data. A latch circuit WDL(3_4) stores the sixth bit of permutation data.

The expression "latch circuit WDL(X_Y)" will be described. The letters "X" and "Y" in the "latch circuit WDL(X_Y)" correspond to cell numbers in a group. For example, when the threshold of a cell X is smaller than the threshold of a cell Y, "0" is stored in the "latch circuit WDL(X_Y)". When the threshold of the cell X is larger than the threshold of the cell Y, "1" is stored in the "latch circuit WDL(X_Y)".

<1-3-4> Permutation Data and Latch Circuits RDL

To read permutation data of four cells as described above, $_4C_2$ (=6) latch circuits RDL are required.

Figure 14:
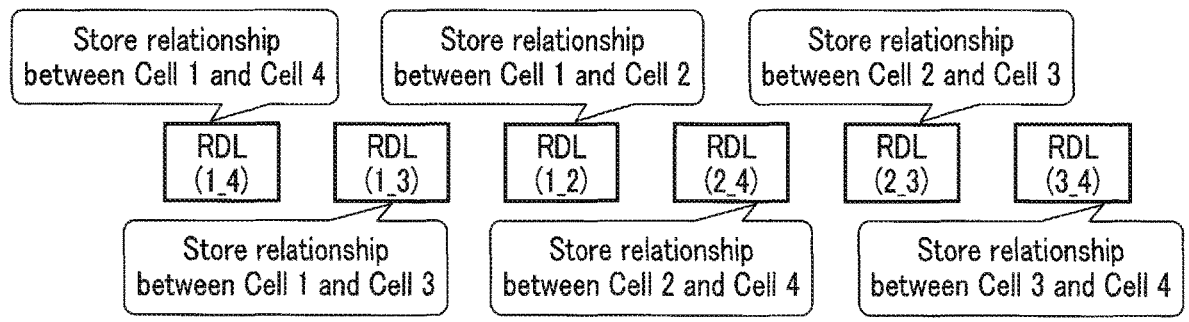
FIG. 14 is a diagram showing data stored in latch circuits.

As shown in FIG. 14, the nonvolatile semiconductor memory device according to the present embodiment includes six latch circuits RDL. A latch circuit RDL(1_4) stores the first bit of permutation data. A latch circuit RDL(1_3) stores the second bit of permutation data. A latch circuit RDL(1_2) stores the third bit of permutation data. A latch circuit RDL(2_4) stores the fourth bit of permutation data. A latch circuit RDL(2_3) stores the fifth bit of permutation data. A latch circuit RDL(3_4) stores the sixth bit of permutation data.

The expression "latch circuit RDL(X_Y)" will be described. The letters "X" and "Y" in the "latch circuit RDL(X_Y)" correspond to cell numbers in a group. For example, when the threshold of the cell X is smaller than the threshold of the cell Y, "0" is stored in the "latch circuit RDL(X_Y)". When the threshold of the cell X is larger than the threshold of the cell Y, "1" is stored in the "latch circuit RDL(X_Y)".

<1-4> Operation

<1-4-1> Data Write Operation

<1-4-1-1> Outline

An outline of the data write operation of the nonvolatile semiconductor memory device according to the present embodiment will be described with reference to FIG. 15. Here, the case of four cells/group is described for simplification; however, nine cells/group or 20 cells/per group may be adopted in practice, and the principle is the same in such a case.

Figure 15:
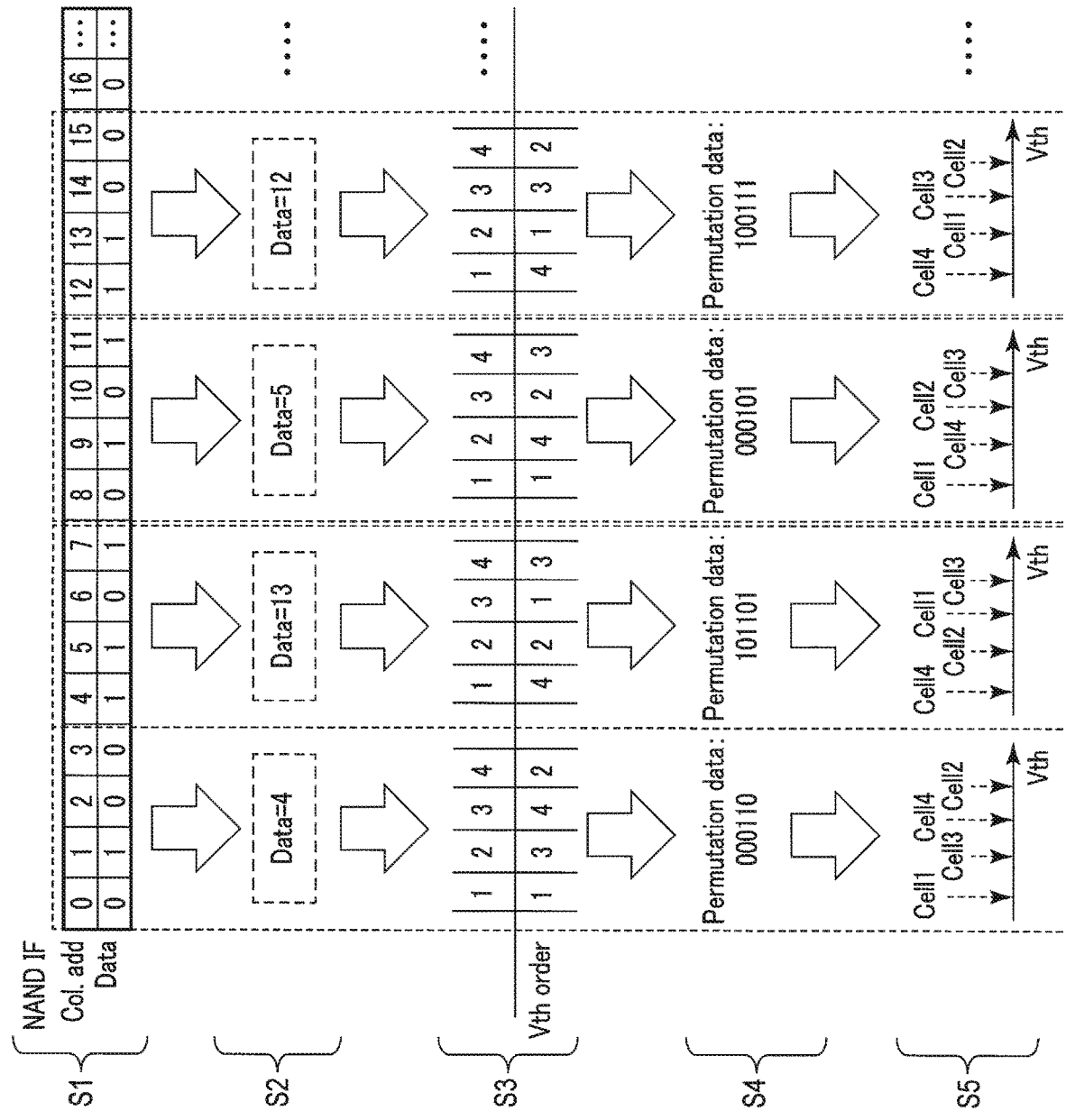
FIG. 15 is a diagram showing an outline of a data write operation of a nonvolatile semiconductor memory device according to embodiments.

As shown in FIG. 15, data is supplied from the NAND interface circuit 14 of the memory controller 10 to the semiconductor memory device 20 (S1).

The input/output circuit 22 divides data received from the NAND interface circuit 14 into four-bit units (S2). Then, the input/output circuit 22 converts each data unit into an order of cells (S3). Furthermore, the input/output circuit 22 generates permutation data based on the order of cells (S4). After that, the sequencer 25 performs a write operation on memory cells based on the permutation data. As a result, the thresholds of memory cells in one group are set to be placed in the order based on the permutation data (S5).

<1-4-1-2> Flow

Figure 16:
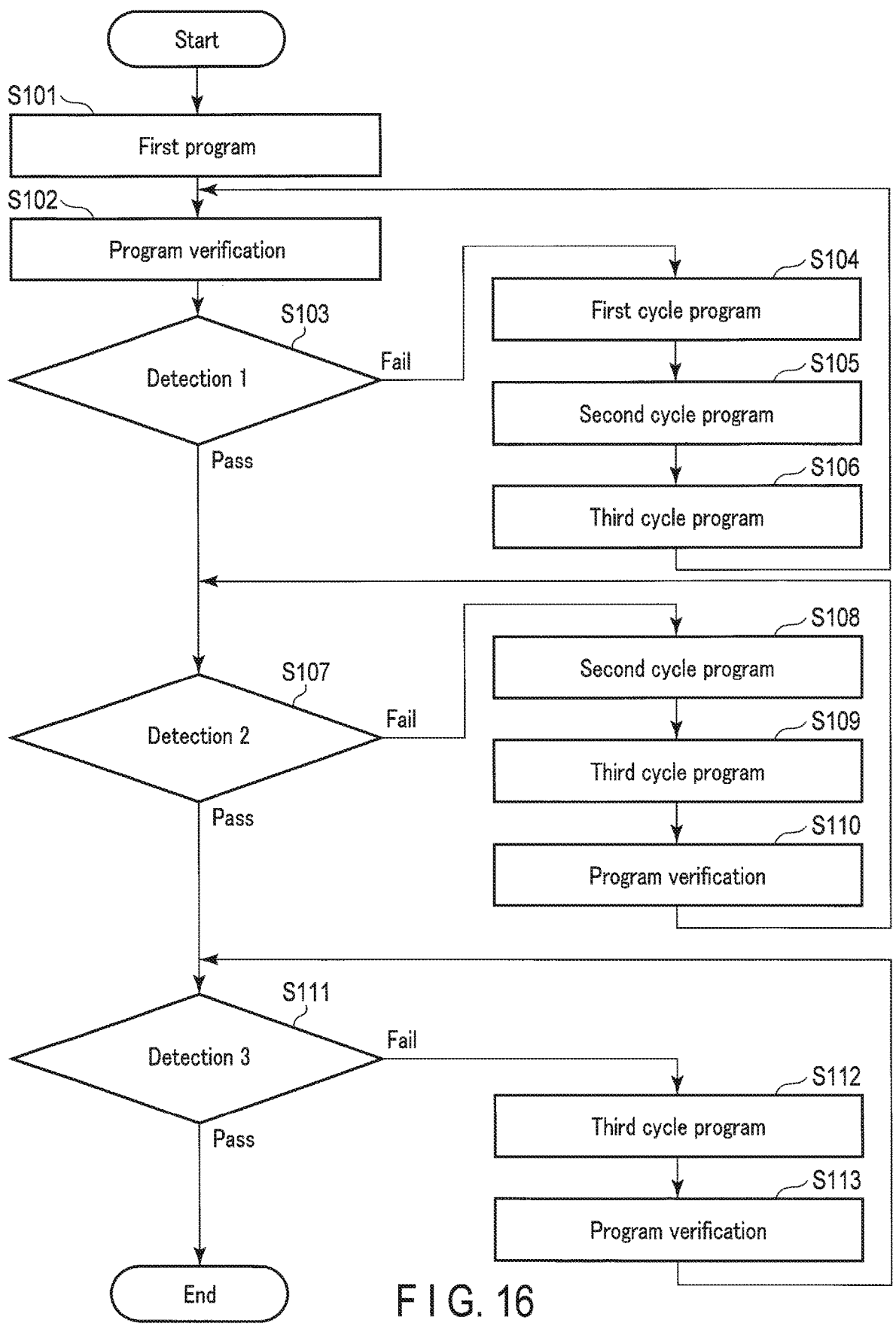
FIG. 16 is a flowchart showing a data write operation of a semiconductor memory device according to a first embodiment.

A flow of the data write operation of the nonvolatile semiconductor memory device according to the present embodiment will be described with reference to FIG. 16. The data write operation roughly includes two operations.

The first operation is a program for changing the threshold of a memory cell. The second operation is a program verification for confirming the result of the program. Described below is a method for writing data by repeating the program and program verification.

[Step S101]

The sequencer 25 performs a first program based on the permutation data stored in the latch circuits WDL. As the first program, the sequencer 25 applies pulses at three levels to respective cells to place the thresholds of the cells in each group in order. The cell to be in the lowest place in the group (first cell) is to have the lowest threshold; therefore, the threshold thereof need not be changed. Therefore, in this first program, a program is performed on the cells other than the first cell (non-write cell). The operations of latch circuits, etc. at the time of the program will be described later.

[Step S102]

The sequencer 25 performs a program verification after step S101.

[Step S103]

As a detection 1, the sequencer 25 checks whether the place of the cell to be in the lowest place (first cell) in each group is correct, and passes the step S103 if the place is correct in an allowable or larger number of groups (the allowable number of groups can be set at will). The operations of latch circuits, etc. at the time of the detection 1 will be described later.

[Step S104]

When determining that the detection 1 is failed (fail in the step S103), the sequencer 25 performs a first cycle program on a write target cell.

[Step S105]

After the first cycle program, the sequencer 25 performs a second cycle program on a write target cell.

[Step S106]

After the second cycle program, the sequencer 25 performs a third cycle program on a write target cell. After that, a program verification is performed in the step S102.

[Step S107]

When determining that the detection 1 is passed (pass in the step S103), the sequencer 25 performs a detection 2. In the detection 2, the sequencer 25 checks whether the place of the cell to be in the second-lowest place (second cell) in each group is correct, and passes the step S107 if the place is correct in an allowable or larger number of groups.

[Step S108]

When determining that the detection 2 is not passed (fail in the step S107), the sequencer 25 performs a second cycle program.

[Step S109]

After the second cycle program, the sequencer 25 performs a third cycle program.

[Step S110]

After the step S109, the sequencer 25 performs a program verification. Then, the sequencer 25 repeats the step S107.

[Step S111]

When determining that the detection 2 is passed (pass in the step S107), the sequencer 25 performs a detection 3. In the detection 3, the sequencer 25 checks whether the place of the cell to be in the highest place (fourth cell) is correct, and passes the step S111 if the place is correct in an allowable or larger number of groups.

When passing the detection 3, the sequencer 25 ends the write operation.

[Step S112]

When determining that the detection 3 is failed (fail in the step S111), the sequencer 25 performs a third cycle program.

[Step S113]

After the step S112, the sequencer 25 performs a program verification. Then, the sequencer 25 repeats the step S111.

<1-4-1-3> Specific Example

Next, a specific example of the data write operation of the nonvolatile semiconductor memory device according to the present embodiment will be described. Hereinafter, a specific example will be described while focusing on operation waveforms and operations of latch circuits.

The case where data "1100" received from the memory controller 10 is written will be described.

Figure 17:
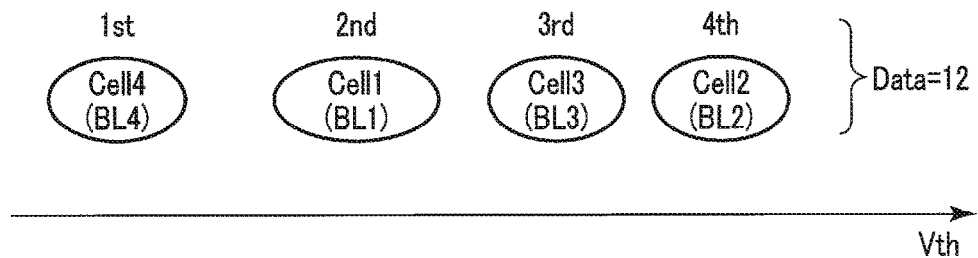
FIG. 17 is a diagram showing a relationship between data and an order of cells.

Upon receipt of "1100" from the memory controller 10, the input/output circuit 22 converts the data into data "12". The order of the cell 1 to cell 4 for data "12" is cell 4, cell 1, cell 3, and cell 2 in the ascending order, as shown in FIG. 17. Permutation data representing such an order of the cell 1 to cell 4 is "100111". For simplification, the bit lines BL to which the cells 1 to 4 respectively belong are called bit lines BL1 to BL4.

The permutation data "100111" is stored in the latch circuits WDL. Specifically, the latch circuit WDL(1_4) stores the first bit (bit defining the relationship between the thresholds of the cell 1 and cell 4) "1" of the permutation data. The latch circuit WDL(1_3) stores the second bit (bit defining the relationship between the thresholds of the cell 1 and cell 3) "0" of the permutation data. The latch circuit WDL(1_2) stores the third bit (bit defining the relationship between the thresholds of the cell 1 and cell 2) "0" of the permutation data. The latch circuit WDL(2_4) stores the fourth bit (bit defining the relationship between the thresholds of the cell 2 and cell 4) "1" of the permutation data. The latch circuit WDL(2_3) stores the fifth bit (bit defining the relationship between the thresholds of the cell 2 and cell 3) "1" of the permutation data. The latch circuit WDL(3_4) stores the sixth bit (bit defining the relationship between the thresholds of the cell 3 and cell 4) "1" of the permutation data.

Then, "0" is stored in all the latch circuits SDL.

Figure 18:
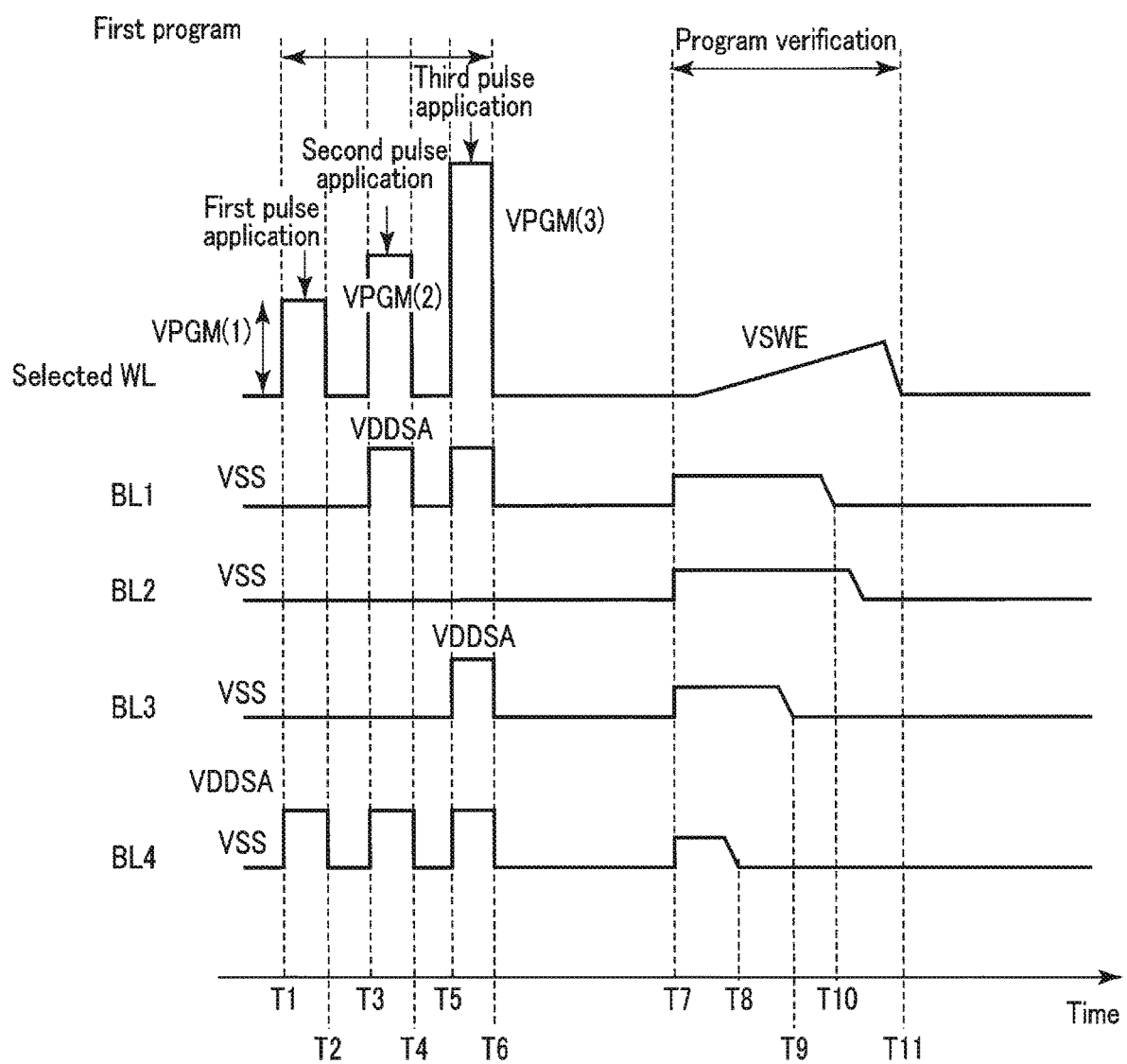
FIG. 18 is a waveform diagram showing the data write operation of the nonvolatile semiconductor memory device according to the first embodiment.
Figure 19:
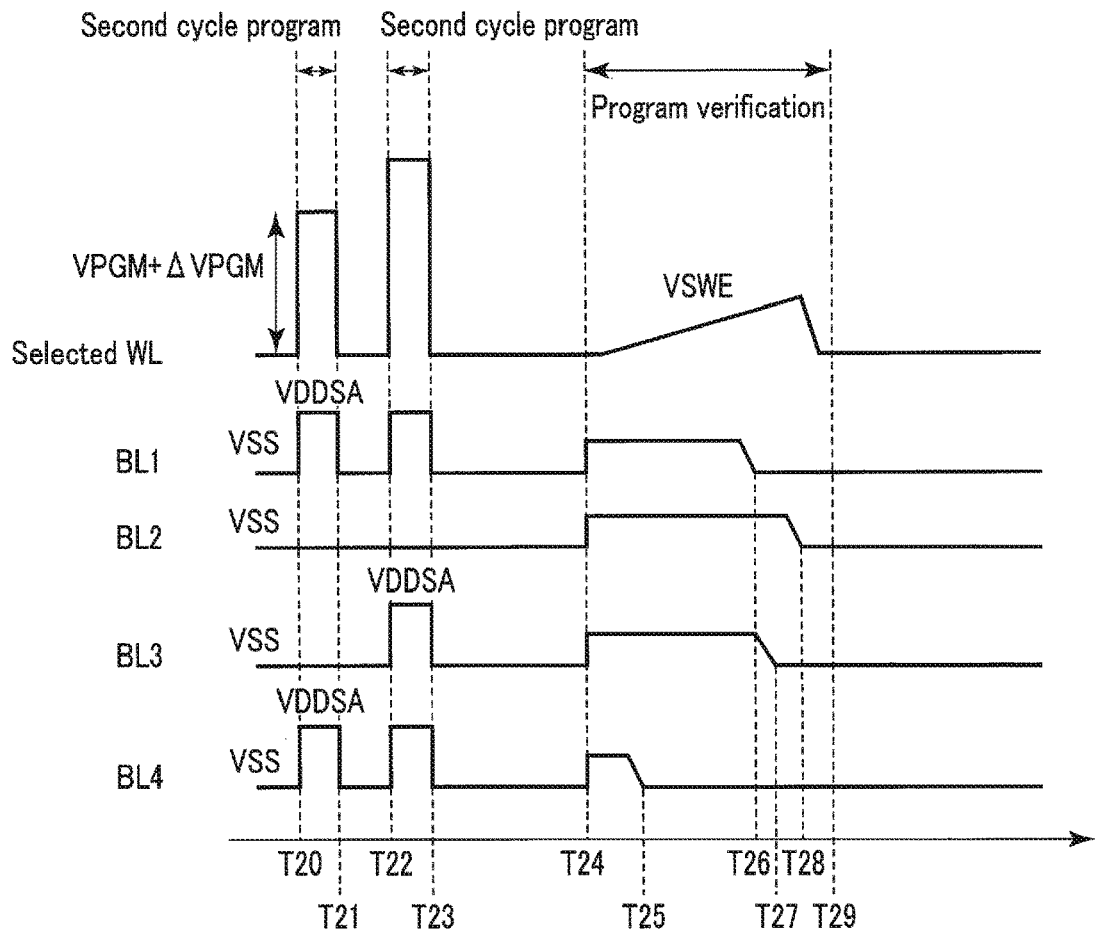
FIG. 19 is a waveform diagram showing the data write operation of the nonvolatile semiconductor memory device according to the first embodiment.

Hereinafter, the operation waveforms in this specific example will be described with reference to FIGS. 18 and 19. FIGS. 18 and 19 show voltages of the selected word line WL, and bit lines BL1 to BL4.

[Time T1 to Time T6]

As shown in FIG. 18, the sequencer 25 performs the first program (step S101) from a time T1 to a time T6. In the first program, the sequencer 25 applies a first pulse, a second pulse, and a third pulse to the selected word line WL. The first pulse is a voltage VPGM(1) applied to the second to fourth cells. The second pulse is a voltage VPGM(2) (VPGM(1)<VPGM(2)) applied to the third and fourth cells. The third pulse is a voltage VPGM(3) (VPGM(2)<VPGM(3)) applied to the fourth cell.

As described above, the cell 1 to cell 4 are coupled respectively to the bit lines BL1 to BL4. The order of the cells should be cell 4, cell 1, cell 3, and cell 2 in the ascending order.

Since the threshold Vth4 of the cell 4 should be the smallest, the first program is not performed on the cell 4. Therefore, at the first to third pulse application times, a non-write (write inhibit) voltage VDDSA is applied to the bit line BL4. In other words, to inhibit the program, the voltage of the bit line BL of the relevant cell needs to be controlled to be the voltage VDDSA. A method for placing the bit line BL4 in a non-write state is now described. Arithmetic operations are performed by using data stored in the latch circuits WDL. As the arithmetic operations, the following arithmetic operations 1 to 4 are performed. The result of the arithmetic operation 1 is stored in the latch circuit SDL (SDL1) relating to the bit line BL1, the result of the arithmetic operation 2 is stored in the latch circuit SDL (SDL2) relating to the bit line BL2, the result of the arithmetic operation 3 is stored in the latch circuit SDL (SDL3) relating to the bit line BL3, and the result of the arithmetic operation 4 is stored in the latch circuit SDL (SDL4) relating to the bit line BL4. The expression "SDLx<-WDLy" in the following arithmetic operation 1 to arithmetic operation 4 means that data of a latch circuit WDLy is stored in a latch circuit SDLx. The expression "~WDLy" means that the data of the latch circuit WDLy is inverted. The expression "WDLy & WDLz" means that an AND operation is performed on the data of the latch circuit XDLy and the data of the latch circuit WDLz.

$SDL1\leftarrow\sim WDL(1\_2)\&\sim WDL(1\_3)\&\sim WDL(1\_4)$   (Arithmetic Operation 1)

$SDL2\leftarrow WDL(1\_2)\&\sim WDL(2\_3)\&\sim WDL(2\_4)$   (Arithmetic Operation 2)

$SDL3\leftarrow WDL(1\_3)\& WDL(2\_3)\&\sim WDL(3\_4)$   (Arithmetic Operation 3)

$SDL4\leftarrow WDL(1\_4)\&WDL(2\_4)\& WDL(3\_4)$   (Arithmetic Operation 4)

A bit line BL relating to a latch circuit SDL that stores "1" is a non-write bit line BL, and the non-write voltage VDDSA is transferred thereto. In this example, the latch circuits SDL1 to SDL3 store "0", and the latch circuit SDL4 stores "1". Performing the above arithmetic operations causes only the relevant latch circuit SDL4 to store "1". As a result, the bit lines BL1 to BL3 become write targets, whereas only the bit line BL4 becomes a non-write target.

The threshold Vth1 of the cell 1 is the second smallest. Therefore, the second and third pulses are not applied to the cell 1. Accordingly, at the second and third pulse application times, the non-write voltage VDDSA is applied to the bit line BL1. A method for placing the bit line BL1 in the non-write state is now described. Arithmetic operations are performed by using data stored in the latch circuits WDL. As the arithmetic operations, the following arithmetic operations 5 to 8 are performed. The expression "SDLx|WDLy" in the following arithmetic operations 5 to 8 means that an OR operation is performed on the data of the latch circuit WDLy and the data of the latch circuit SDLx.

$RDL(1\_2)\leftarrow((\sim WDL(1\_2)|SDL2)\&(\sim WDL(1\_3)|SDL3)\&(\sim WDL(1\_4)SDL4))|SDL1$   (Arithmetic Operation 5)

$RDL(1\_3)\leftarrow((WDL(1\_2)|SDL1)\&(\sim WDL(2\_3)|SDL3)\&(\sim WDL(2\_4)|SDL4))|SDL2$   (Arithmetic Operation 6)

$RDL(1\_4)\leftarrow((WDL(1\_3)|SDL1)\&(WDL(2\_3)|SDL2)\&(WDL(3\_4)|SDL4))|SDL3$   (Arithmetic Operation 7)

$RDL(2\_3)\leftarrow((WDL(1\_4)|SDL1)\&(WDL(2\_4)|SDL2)\&(WDL(3\_4)|SLD3))|SDL4$   (Arithmetic Operation 8)

Here, some latch circuits RDL are used to avoid overwriting of data of the latch circuits SDL halfway through the arithmetic operations. The result of the arithmetic operation 5 is stored in, for example, the latch circuit RDL(1_2), the result of the arithmetic operation 6 is stored in, for example, the latch circuit RDL(1_3), the result of the arithmetic operation 7 is stored in, for example, the latch circuit RDL(1_4), and the result of the arithmetic operation 8 is stored in, for example, the latch circuit RDL(2_3). In this example, "1" is stored in the latch circuits RDL(1_2) and RDL(2_3), and "0" is stored in the latch circuits RDL(1-3) and RDL(1_4). After completion of the arithmetic operations, data of the latch circuits RDL are copied to the latch circuits SDL. Accordingly, "0" is stored in the latch circuits SDL2 and SDL3, and "1" is stored in the latch circuits SDL1 and SDL4. As a result, the bit lines BL2 and BL3 become write targets, and the bit lines BL1 and BL4 become non-write targets.

The threshold Vth3 of the cell 3 is the third smallest. Therefore, the third pulse is not applied to the cell 3. Accordingly, at the third pulse application time, the non-write voltage VDDSA is applied to the bit line BL3. The threshold Vth2 of the cell 2 is the largest. Therefore, the first to third pulses are applied to the cell 2. Accordingly, at the first to third pulse application times, a write voltage VSS is applied to the bit line BL2. A method for placing the bit line BL3 in the non-write state is now described. Arithmetic operations are performed by using data stored in the latch circuits WDL. As the arithmetic operations, the above arithmetic operations 5 to 8 are performed. Accordingly, "0" is stored in the latch circuit SDL2, and "1" is stored in the latch circuits SDL1, SDL3, and SDL4. As a result, the bit line BL2 becomes a write target, and the bit lines BL1, BL3, and BL4 become non-write targets.

[Time T7 to Time T11]

Described here mainly is the case where the assumed order cannot be achieved by the first program. For example, the case where the assumed order is cell 4, cell 1, cell 3, and cell 2, whereas the actual order is cell 4, cell 3, cell 1, and cell 2.

At the beginning of the program verification, the latch circuits RDL and the latch circuits SDL are reset to store "0". After that, the sequencer 25 performs the program verification (step S102). At this time, the sequencer 25 applies a program verification voltage VSWE to the selected word line WL. This voltage VSWE gradually rises, for example, from 0V to the positive first voltage. As the voltage of the selected word line WL rises, the memory cells are turned on in the ascending order of the threshold voltage, and a cell current flows. As a result, the electrical potential of each bit line falls from a charging voltage VDDx to VSSx. The sense amplifier SA determines when the voltage of each bit line BL falls to VSSx. In such a program verification, the voltage falling to VSSx early means that the threshold is small. The read results are stored in the latch circuits RDL. Specifically, "0" is stored in the latch circuit RDL(1_2), and "1" is stored in the latch circuits RDL(1-3), (1_4), (2_3), (2_4), and (3_4).

Next, in the state of the detection 1, whether the place of the lowest-place cell in each group is correct is detected. An XNOR operation is performed on the write data stored in each latch circuit WDL and the program verification result stored in the corresponding latch circuit RDL, and the operation result is written back to the latch circuit RDL.

Specifically, an XNOR operation of the latch circuit WDL(1_2) and the latch circuit RDL(1_2) is performed. Here, "0" is stored in the latch circuit WDL(1_2), and "0" is stored in the latch circuit RDL(1_2); therefore, "1" is stored in the latch circuit RDL(1_2).

Similarly, an XNOR operation of the latch circuit WDL(1_3) and the latch circuit RDL(1_3) is performed. Here, "0" is stored in the latch circuit WDL(1_3), and "1" is stored in the latch circuit RDL(1_3); therefore, "0" is stored in the latch circuit RDL(1_3).

An XNOR operation of the latch circuit WDL(1_4) and the latch circuit RDL(1_4) is performed. Here, "1" is stored in the latch circuit WDL(1_4), and "1" is stored in the latch circuit RDL(1_4); therefore, "1" is stored in the latch circuit RDL(1_4).

An XNOR operation of the latch circuit WDL(2_3) and the latch circuit RDL(2_3) is performed. Here, "1" is stored in the latch circuit WDL(2_3), and "1" is stored in the latch circuit RDL(2_3); therefore, "1" is stored in the latch circuit RDL(2_3).

An XNOR operation of the latch circuit WDL(2_4) and the latch circuit RDL(2_4) is performed. Here, "1" is stored in the latch circuit WDL(2_4), and "1" is stored in the latch circuit RDL(2_4); therefore, "1" is stored in the latch circuit RDL(2_4).

An XNOR operation of the latch circuit WDL(3_4) and the latch circuit RDL(3_4) is performed. Here, "1" is stored in the latch circuit WDL(3_4), and "1" is stored in the latch circuit RDL(3_4); therefore, "1" is stored in the latch circuit RDL(3_4).

As a result of those arithmetic operations, "0" is stored in the latch circuit RDL whose write data and read data do not match. Next, comparison data is transferred to the latch circuits SDL. After the program verification, "1" is stored in the latch circuits SDL.

In this state, the following arithmetic operations are performed:

$SDL1 \leftarrow \sim(RDL(1\_2)\&RDL(1\_3)\&RDL(1\_4))$ (Arithmetic Operation 9)

$SDL2 \leftarrow \sim(RDL(1\_2)\&RDL(2\_3)\&RDL(2\_4))$ (Arithmetic Operation 10)

$SDL3 \leftarrow \sim(RDL(1\_3)\&RDL(2\_3)\&RDL(3\_4))$ (Arithmetic Operation 11)

$SDL4 \leftarrow \sim(RDL(1\_4)\&RDL(2\_4)\&RDL(3\_4))$ (Arithmetic Operation 12)

Accordingly, "1" is stored in a latch circuit SDL that belongs to a bit line relating to a cell with a threshold place different from the expected one. In this example, "0" is stored in the latch circuits SDL1 and SDL3, and "1" is stored in the latch circuits SDL2 and SDL4. The data is transferred to a latch circuit (not shown) in the sense amplifiers SA coupled to the latch circuits SDL. This data is used to set a fail flag indicating that "a detection is failed" to a sense amplifier SA that has read data different from the expected one. Specifically, "0" is transferred to the sense amplifier SA1 coupled to the latch circuit SDL1. Similarly, "0" is transferred to the sense amplifier SA2 coupled to the latch circuit SDL2. Data "1" is transferred to the sense amplifier SA3 coupled to the latch circuit SDL3. Data "0" is transferred to the sense amplifier SA4 coupled to the latch circuit SDL4.

Then, the following arithmetic operations are performed. The arithmetic operations 13-16 are performed by using data of the latch circuits SDL1 to SDL4 obtained in the arithmetic operations 9-12.

$SDL1 \leftarrow ((\sim WDL(1\_2)|SDL2)\&(\sim WDL(1\_3)|SDL3)\& (\sim WDL(1\_4)|SDL4))|SDL1$ (Arithmetic Operation 13)

$SDL2 \leftarrow ((WDL(1\_2)|SDL1)\&(\sim WDL(2\_3)|SDL3)\& (\sim WDL(2\_4)|SDL4))|SDL2$ (Arithmetic Operation 14)

$SDL3 \leftarrow ((WDL(1\_3)|SDL1)\&(WDL(2\_3)|SDL2)\& (\sim WDL(3\_4)|SDL4))|SDL3$ (Arithmetic Operation 15)

$SDL4 \leftarrow ((WDL(1\_4)|SDL1)\&(WDL(2\_4)|SDL2)\& (WDL(3\_4)|SLD3))|SDL4$ (Arithmetic Operation 16)

Before the arithmetic operations, "0" is stored in the latch circuits WDL(1_2) and (1_3), and "1" is stored in the latch circuits WDL(1_4), (2_3), (2_4), and (3_4). Also, "0" is stored in the latch circuits SDL1 and SDL3, and "1" is stored in the latch circuits SDL2 and SDL4. Therefore, after the arithmetic operations 13 to 16, "1" is stored in the latch circuits SDL1, SDL2, and SDL4, and "0" is stored in the latch circuit SDL3.

Next, after the latch circuits SDL and latch circuits RDL are reset to store "0", the following arithmetic operations 17 to 20 are performed.

$SDL1 \leftarrow \sim WDL(1\_2)\& \sim WDL(1\_3)\& \sim WDL(1\_4)$ (Arithmetic Operation 17)

$SDL2 \leftarrow WDL(1\_2)\& \sim WDL(2\_3)\& \sim WDL(2\_4)$ (Arithmetic Operation 18)

$SDL3 \leftarrow WDL(1\_3)\& WDL(2\_3)\& \sim WDL(3\_4)$ (Arithmetic Operation 19)

$SDL4 \leftarrow WDL(1\_4)\& WDL(2\_4)\& WDL(3\_4)$ (Arithmetic Operation 20)

Then, "1" is stored in the latch circuit SDL relating to the first cell.

In this case, the threshold Vth4 is the smallest; therefore, "1" is stored in the latch circuit SDL4.

After that, an arithmetic operation of a latch circuit SDL and a sense amplifier SA is performed so that information of the fail flag stored in the sense amplifier SA is reflected, and the operation result is stored in a latch circuit RDL.

At this time, "1" is stored in the sense amplifiers SA1 and SA3, and "0" is stored in the sense amplifiers SA2 and SA4. Furthermore, "0" is stored in the latch circuits SDL1, SDL2, and SDL3, and "1" is stored in the latch circuit SDL4.

Arithmetic operations are performed in the sense amplifiers SA and latch circuits SDL, and at least one latch circuit RDL storing "1" means "fail". In this assumed case, all the latch circuits RDL store "0", which means "pass".

After the detection 1 is passed, the detection 2 is performed. In the detection 2, the arithmetic operations 5 to 8 are performed.

Data "0" is stored in the latch circuits SDL1 to SDL3, and "1" is stored in the latch circuit SDL4. Furthermore, "0" is stored in the latch circuits WDL(1_2) and (1_3), and "1" is stored in the latch circuits WDL(1-4), (2_3), (2_4), and (3_4). Consequently, "0" is stored in the latch circuits RDL(1_3) and (1_4), and "1" is stored in the latch circuits WDL(1-2) and (2_3) as a result of the arithmetic operations 5 to 8.

After that, data of the latch circuits RDL is copied to the latch circuits SDL. Data of which four latch circuits RDL of the six latch circuits RDL is copied to the four latch circuits SDL is stored in advance in a memory (not shown) of the sequencer 25.

As a result, "0" is stored in the latch circuits SDL2 and SDL3, and "1" is stored in the latch circuits SDL1 and SDL4.

After that, as done in the detection 1, an arithmetic operation of a latch circuit SDL and a sense amplifier SA is performed so that the result of the fail flag is reflected, and the operation result is stored in a latch circuit RDL.

Data "0" is stored in the sense amplifiers SA2 and SA4, and "1" is stored in the sense amplifiers SA1 and SA3. Therefore, "1" is stored in the latch circuit RDL(1_2), and "0" is stored in the latch circuits RDL(1-3), (1_4), and (2_3).

Here, there is a latch circuit RDL that stores "1", the detection 2 is failed, and the next second cycle program is performed.

[Time T20 to Time T21]

As shown in FIG. 19, the sequencer 25 performs the second cycle program (step S108) from the time T20 to time T21. At this time, "0" is stored in the latch circuits SDL2 and SDL3. Namely, the electrical potentials of the bit lines BL2 and BL3 are at VSS, whereas the electrical potentials of the bit lines BL1 and BL4 are at VDDSA. Accordingly, a program voltage is applied to the cell 2 and cell 3 relating to the latch circuits SDL2 and SDL3.

[Time T22 to Time T23]

Next, the third cycle program is performed. As in the second cycle program, the arithmetic operations 5 to 8 are performed to distinguish non-write cells from write cells.

Data "0" is stored in the latch circuits SDL2 and SDL3, and "1" is stored in the latch circuits SDL1 and SDL4. Furthermore, "0" is stored in the latch circuits WDL(1_2) and (1_3), and "1" is stored in the latch circuits WDL(1-4), (2_3), (2_4), and (3_4). Consequently, "0" is stored in the latch circuit RDL(1_3), and "1" is stored in the latch circuits RDL(1-2), (1_4), and (2_3) as a result of the arithmetic operations 5 to 8.

After that, data of the latch circuits RDL is transferred to the latch circuits SDL. Namely, "0" is stored in the latch circuit SDL2, and "1" is stored in the latch circuits SDL1, SDL3, and SDL4. Namely, the bit lines BL1, and BL3, and BL4 are placed in the non-write state. By applying a pulse thereafter, the sequencer can apply a write voltage only to the cell 2, and raise the threshold.

[Time T24 to Time T29]

After the third cycle program, a program verification is performed.

Here, the case where the expected order is achieved by the above second cycle program and the third cycle program will be described. In that case, the write operation is completed when all of the detections 1, 2, and 3 are passed. If one of the detections 1, 2, and 3 is failed, each pulse is applied, and a write operation is repeated until the thresholds of all of the four cells are placed in the expected order.

<1-5> Advantage

According to the above-described embodiment, a group of a plurality of cells is formed, and data is determined based on the order of the thresholds of the cells in the group. Data can be thereby written at high speed.

To facilitate understanding of the advantage of the present embodiment, a comparative example will be described. As described with reference to FIG. 1, one of the storage methods according to the comparative example is a method of storing data by bringing the threshold of a memory cell to a predetermined voltage.

Figure 20A:
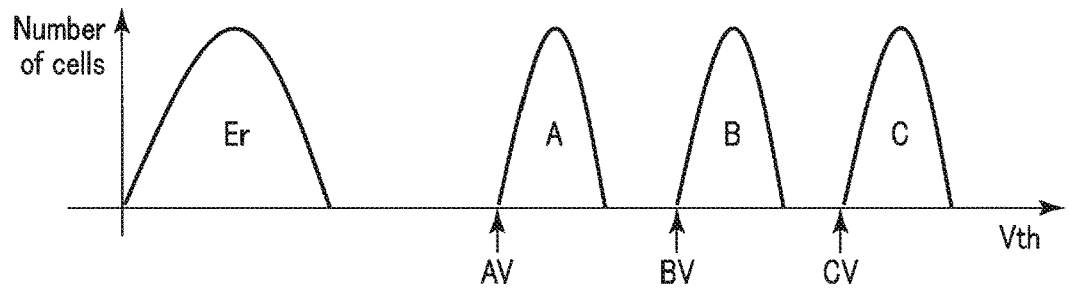
FIG. 20A is a diagram showing an example of a storage method of a semiconductor memory device.
Figure 20B:
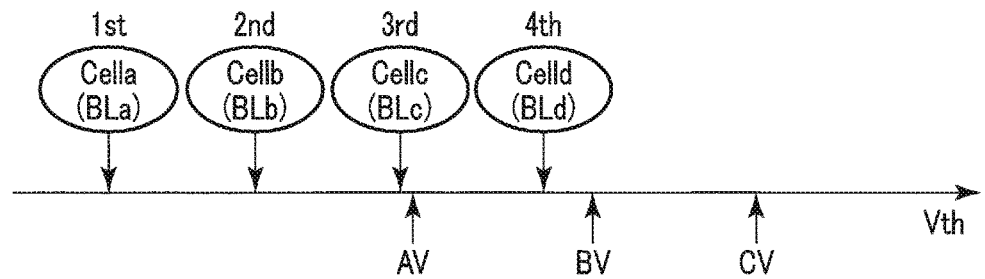
FIG. 20B is a diagram showing an example of a storage method of a semiconductor memory device according to embodiments.

In the case of the storage method according to the comparative example, adjacent threshold distribution lobes may overlap with each other, or a threshold distribution lobe may fall below a reference value, as the size of the semiconductor memory device is reduced or the number of bits stored in one memory cell is increased. As a result, the data write operation requires detailed control, which causes a problem that a longer time is required for the data write operation. For example, when there are four threshold distribution lobes, a write operation needs to be performed so that the thresholds fall within the lobes. For example, as the threshold becomes large, the threshold becomes more difficult to change, and more pulses may be required to be applied. Specifically, as shown in FIG. 20(*a*), for example, when the threshold should be brought to the A level, a write operation is performed so that the threshold falls within the range between a voltage AV and a voltage BV. When the threshold should be brought to the B level, a write operation is performed so that the threshold falls within the range between the voltage BV and a voltage CV. When the threshold should be brought to the C level, a write operation is performed so that the threshold becomes equal to or larger than the voltage CV.

However, unlike in the storage method according to the comparative example, the threshold distribution lobes need not be considered in the above-described embodiment. According to the above-described embodiment, the thresholds of the cells (cell a to cell d) in one group only need to be placed in a predetermined order for each data, as shown in FIG. 20(*b*). Therefore, unlike in the storage method according to the comparative example, a write operation with high precision is not required in the above-described embodiment. As a result, the write operation can be more roughly performed in the above-described embodiment than in the storage method according to the comparative example.

The above-described embodiment is also expected to speed up the read operation and verification operation. In the storage method according to the comparative example, the read operation needs to be performed while keeping the selected word line WL at a reference level. In the read operation of the storage method according to the comparative example, increasing the voltage of the selected word line WL in stages is conceivable. For example, when the voltage of the selected word line WL is increased in eight stages, a sense operation is performed with respective voltages. Therefore, it is necessary to wait for stabilization of the word lines WL and bit lines BL for each voltage. Accordingly, it cannot be expected that application of such a read method to this comparative example yields a time reduction effect.

In the present embodiment, however, the selected word line WL need not be maintained at a reference voltage; therefore, while raising the voltage of the selected word line WL, multiple levels can be read by one voltage raise. Therefore, when a large number of bits are stored in one memory cell, the read time and verification time (i.e., write time) can be reduced.

<2> Second Embodiment

The second embodiment will be described. In the second embodiment, a sense amplifier module will be described. The basic configuration and basic operation of the device according to the second embodiment are the same as those of the device according to the above-described first embodiment. Thus, descriptions of matters described in the above-described first embodiment and matters easily inferable from the first embodiment will be omitted.

<2-1> Configuration

<2-1-1> Configuration of Sense Amplifier Module of Comparative Example

A configuration of a sense amplifier module of a semiconductor memory device according to a comparative example of the second embodiment will be described with reference to FIG. 21. As an example, the case where one group is constituted by nine memory cells will be described.

Figure 21:
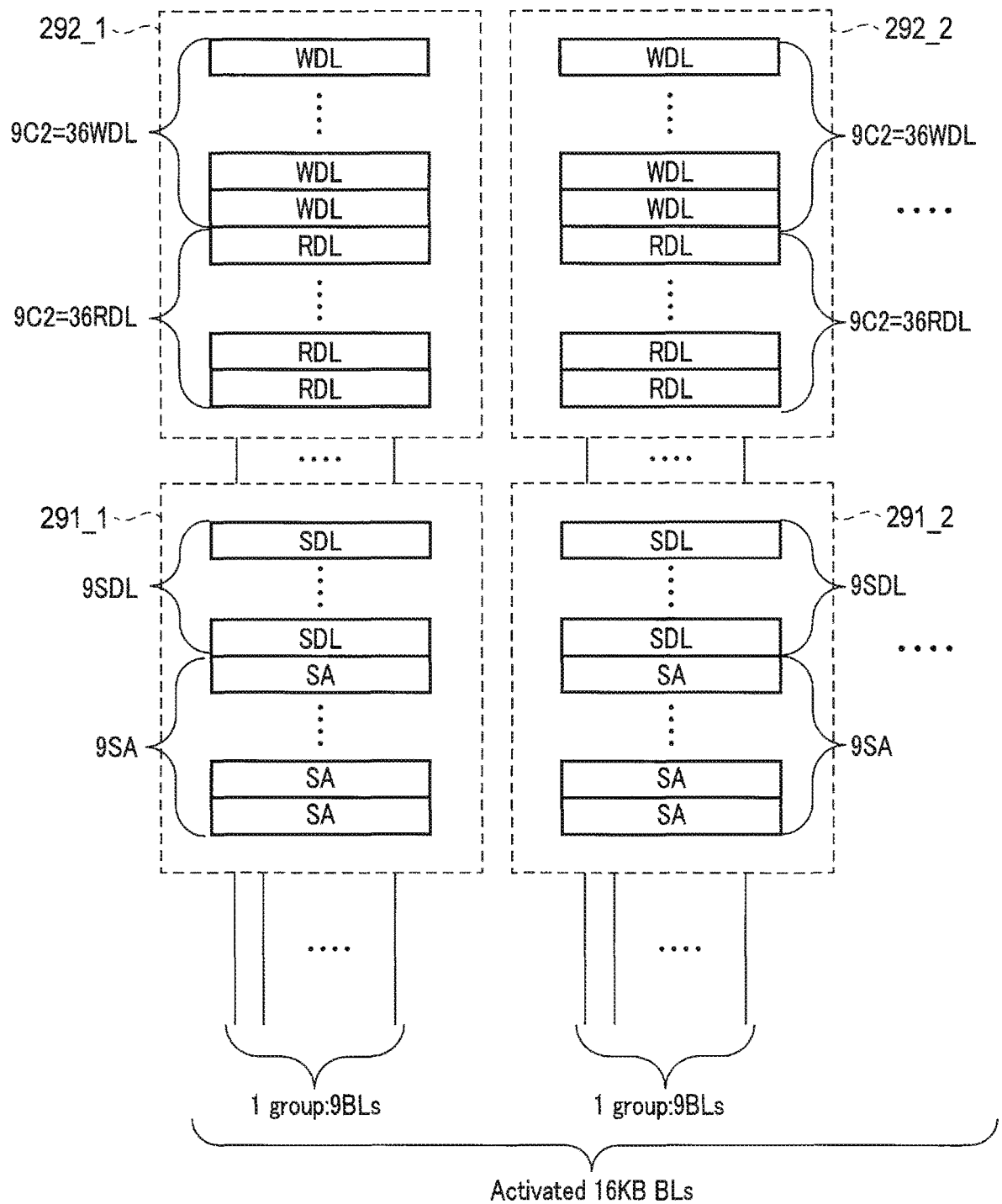
FIG. 21 is a block diagram showing a configuration of a sense amplifier module of a semiconductor memory device according to a comparative example of a second embodiment.

As shown in FIG. 21, the sense amplifier module 29 of the semiconductor memory device according to the comparative example of the second embodiment includes a plurality of sense units 291 (291_1 to 291_k) and latch units 292 (292_1 to 292_k).

In each sense unit 291, a set of a sense amplifier SA and a latch circuit SDL relating to one group GP is provided for each bit line. Namely, the number of the sense amplifiers SA and the number of the latch circuits SDL are the same as the number of the bit lines BL.

Each latch unit 292 includes a plurality of latch circuits WDL and latch circuits RDL. Each of the number of latch circuits WDL and the number of latch circuits RDL is $_nC_2$ (n is the number of cells per group). Assumed in this example is the case where one group includes 9 memory cells; therefore, each of the number of latch circuits WDL and the number of latch circuits RDL is 36.

Accordingly, in the permutation storage method, the number of latch circuits WDL and the number of latch circuits RDL are determined based on the number of cells per group (memory density), and the number of data latches increases as the density increases.

<2-1-2> Configuration of Sense Amplifier Module of Second Embodiment

A configuration of a sense amplifier module according to the second embodiment will be described with reference to FIG. 22. In the second embodiment, data per access is limited to half the data in the comparative example, thereby reducing the number of latch circuits WDL and the number of latch circuits RDL to approximately half, and consequently suppressing increase in the area.

Figure 22:
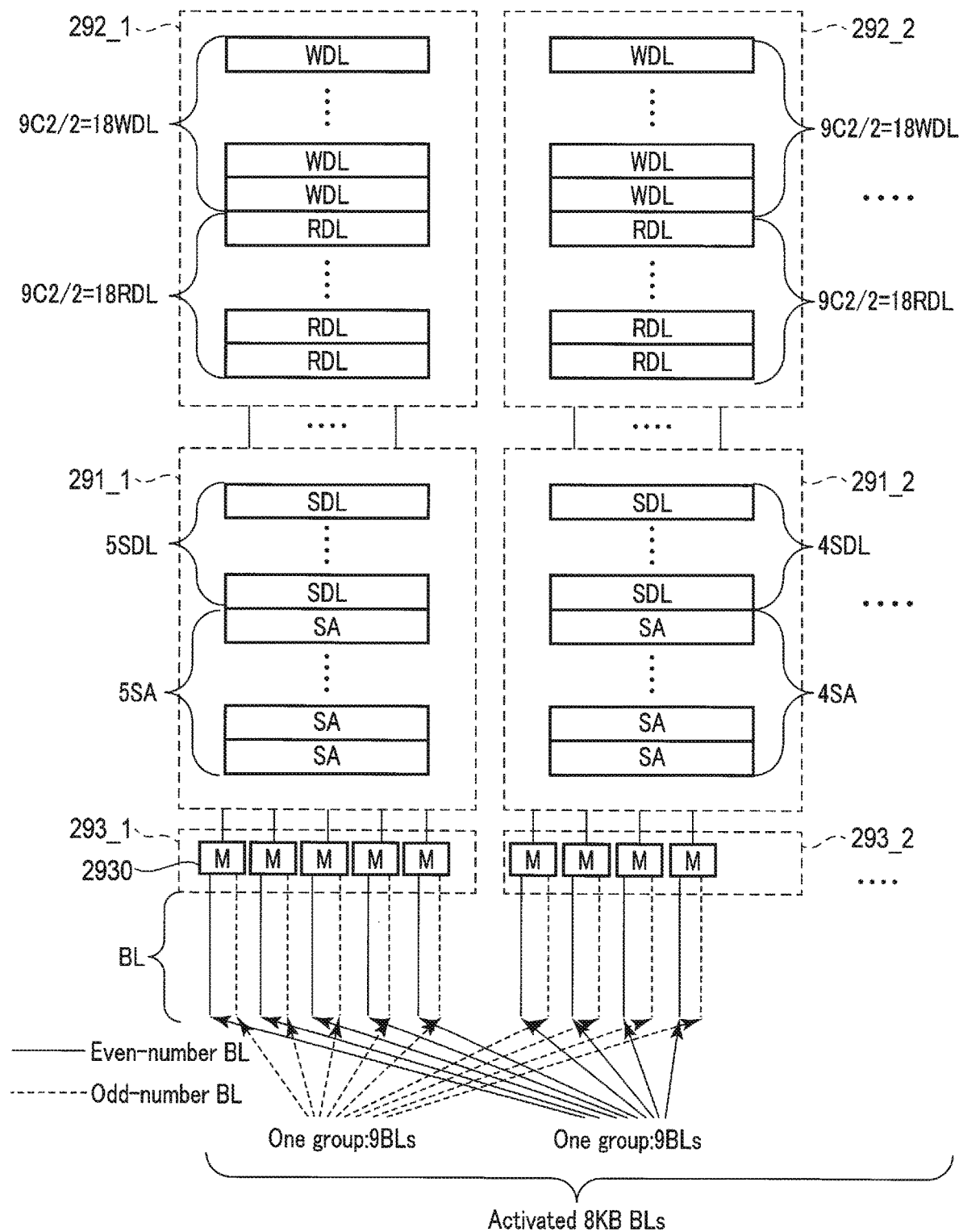
FIG. 22 is a block diagram showing a configuration of a sense amplifier module of a semiconductor memory device according to the second embodiment.

As shown in FIG. 22, the sense amplifier module 29 of the semiconductor memory device according to the second embodiment includes a plurality of sense units 291 (291_1 to 291_k), latch units 292 (292_1 to 292_k), and a plurality of operation units 293 (293_1 to 293_k).

As in the comparative example, one group includes nine memory cells in the present embodiment. However, unlike in the comparative example, there are roughly two types of groups. One is a type of groups relating to odd-number bit lines BL, and the other is a type of groups relating to even-number bit lines BL.

The operation unit 293 includes a multiplexer 2930 coupled to odd-number bit lines BL or even-number bit lines BL and configured to select bit lines BL to be coupled to the sense unit 291 in accordance with the selected group. Namely, when the group relating to odd-number bit lines BL is selected, the operation unit 293 couples the odd-number bit lines BL to the sense unit 291 and activates the odd-number bit lines BL. Then, the operation unit 293 deactivates the even-number bit lines BL. Namely, when the group relating to even-number bit lines BL is selected, the operation unit 293 couples the even-number bit lines BL to the sense unit 291 and activates the even-number bit lines BL. Then, the operation unit 293 deactivates the odd-number bit lines BL.

In each sense unit 291, the number of sense amplifiers SA and the number of latch circuits SDL are half the number of the bit lines BL coupled to the operation unit 293. Namely, the set of sense amplifier SA and latch circuit SDL in one sense unit 291 is in one-to-two correspondence with the bit lines BL relating to the sense unit 291. An operation unit 293_1 is coupled to ten bit lines BL. Therefore, five sets of sense amplifier SA and latch circuit SDL are provided in a sense unit 291_1 corresponding to the operation unit 293_1. An operation unit 293_2 is coupled to eight bit lines BL. Therefore, four sets of sense amplifier SA and latch circuit SDL are provided in a sense unit 291_2 corresponding to the operation unit 293_2.

Each latch unit 292 includes a plurality of latch circuits WDL and latch circuits RDL. Each of the number of latch circuits WDL and the number of latch circuits RDL is $_nC_2/2$ (n is the number of cells per group). Namely, the correspondence between each of the number of latch circuits WDL and the number of latch circuits RDL included in one latch unit 292 and the number of cells per group is $_nC_2/2$ to n. Assumed in the present embodiment is the case where one group includes 9 memory cells; therefore, each of the number of latch circuits WDL and the number of latch circuits RDL is 18. Adjacent two latch units 292 are electrically coupled to each other and can receive each other's data, although it is not shown for simplification.

Next, the multiplexer 2930 will be described. As shown in FIG. 23, the multiplexer 2930 includes NMOS transistors Treh, Tre, Troh, and Tro.

The transistor Treh electrically couples an even-number bit line to a sense amplifier SA based on an even-number bit line select signal ESEL_H, and activates the even-number bit line.

The transistor Tre transfers an unselect voltage to an even-number bit line based on an even-number bit line unselect signal ESEL, and deactivates the even-number bit line. The unselect voltage is supplied from the driver set 27.

The transistor Troh electrically couples an odd-number bit line to a sense amplifier SA based on an odd-number bit line select signal OSEL_H, and activates the odd-number bit line.

The transistor Tro transfers an unselect voltage to an odd-number bit line based on an odd-number bit line unselect signal OSEL, and deactivates the odd-number bit line.

The even-number bit line select signal ESEL_H, the even-number bit line unselect signal ESEL, the odd-number bit line select signal OSEL_H, and the odd-number bit line unselect signal OSEL are controlled by the sequencer 25.

When selecting the group relating to even-number bit lines BL, the sequencer 25 brings the even-number bit line select signal ESEL_H to the "H" level, the even-number bit line unselect signal ESEL to the "L" level, the odd-number bit line select signal OSEL_H to the "L" level, and the odd-number bit line unselect signal OSEL to the "H" level. Accordingly, the even-number bit lines BL are coupled to the sense amplifiers SA (activated), and the odd-number bit lines BL are deactivated.

When selecting the group relating to odd-number bit lines BL, the sequencer 25 brings the even-number bit line select signal ESEL_H to the "L" level, the even-number bit line unselect signal ESEL to the "H" level, the odd-number bit line select signal OSEL_H to the "H" level, and the odd-number bit line unselect signal OSEL to the "L" level. Accordingly, the odd-number bit lines BL are coupled to the sense amplifiers SA (activated), and the even-number bit lines BL are deactivated.

<2-2> Advantage

According to the above-described embodiment, the correspondence between each of the number of latch circuits WDL and the number of latch circuits RDL included in one latch unit 292 and the number of cells per group is $_nC_2/2$ to n. Accordingly, the area of the latch unit 292 can be reduced in comparison with the comparative example.

<3> Third Embodiment

The third embodiment will be described. In the third embodiment, a sense amplifier module will be described. The basic configuration and basic operation of the device according to the third embodiment are the same as those of the device according to the above-described first embodiment. Thus, descriptions of matters described in the above-described first embodiment and matters easily inferable from the first embodiment will be omitted.

<3-1> Configuration of Sense Amplifier Module of Third Embodiment

A configuration of a sense amplifier module of a semiconductor memory device according to the third embodiment will be described with reference to FIGS. 24 to 26.

As shown in FIG. 24, the sense amplifier module 29 of the semiconductor memory device according to the third embodiment further includes a plurality of combinational circuit groups 294 (294_1 to 294_k). The combinational circuit group 294 is a structure for performing the arithmetic operations performed in the latch circuits SDL, WDL, and RDL, etc. as described in the first embodiment.

The combinational circuit group 294 will be described in more detail with reference to FIGS. 25 and 26.

As shown in FIG. 25, the combinational circuit group 294 includes NOR circuits G1-1, G1-2, G1-3, G1-4, G2-1a, G2-1b, G2-1c, G2-1d, G2-2a, G2-2b, G2-2c, G2-2d, G2-3a, G2-3b, G2-3c, G2-3d, G2-4a, G2-4b, G2-4c, and G2-4d, and NAND circuits G2-1e, G2-2e, G2-3e, and G2-4e.

The NOR circuit G1-1 performs a NOR operation based on non-inverted inputs from the latch circuit WDL(1_2), latch circuit WDL(1_3), and latch circuit WDL(1_4) to generate an output signal Q1-1.

The NOR circuit G1-2 performs a NOR operation based on an inverted input from the latch circuit WDL(1_2) and non-inverted inputs from the latch circuit WDL(1_3) and latch circuit WDL(1_4) to generate an output signal Q1-2.

The NOR circuit G1-3 performs a NOR operation based on inverted inputs from the latch circuit WDL(1_2) and latch circuit WDL(1_3), and a non-inverted input from the latch circuit WDL(1_4) to generate an output signal Q1-3.

The NOR circuit G1-4 performs a NOR operation based on inverted inputs from the latch circuit WDL(1_2), latch circuit WDL(1_3), and latch circuit WDL(1_4) to generate an output signal Q1-4.

The NOR circuit G2-1a performs a NOR operation based on an inverted input from the latch circuit WDL(1_2) and a non-inverted input of a signal IN2-2.

The NOR circuit G2-1b performs a NOR operation based on an inverted input from the latch circuit WDL(1_3) and a non-inverted input of a signal IN2-3.

The NOR circuit G2-1c performs a NOR operation based on an inverted input from the latch circuit WDL(1_4) and a non-inverted input of a signal IN2-4.

The NOR circuit G2-1d performs a NOR operation based on non-inverted inputs from the NOR circuits G2-1a, G2-1b, and G2-1c.

The NAND circuit G2-1e performs a NAND operation based on a non-inverted input from the NOR circuit G2-1d and an inverted input of a signal IN1-1 to generate an output signal Q2-1.

The NOR circuit G2-2a performs a NOR operation based on a non-inverted input from the latch circuit WDL(1_2) and a non-inverted input of a signal IN2-1.

The NOR circuit G2-2b performs a NOR operation based on an inverted input from the latch circuit WDL(2_3) and a non-inverted input of the signal IN2-3.

The NOR circuit G2-2c performs a NOR operation based on an inverted input from the latch circuit WDL(2_4) and a non-inverted input of the signal IN2-4.

The NOR circuit G2-2d performs a NOR operation based on non-inverted inputs from the NOR circuits G2-2a, G2-2b, and G2-2c.

The NAND circuit G2-2e performs a NAND operation based on a non-inverted input from the NOR circuit G2-2d and an inverted input of a signal IN1-2 to generate an output signal Q2-2.

The NOR circuit G2-3a performs a NOR operation based on a non-inverted input from the latch circuit WDL(1_3) and a non-inverted input of the signal IN2-1.

The NOR circuit G2-3b performs a NOR operation based on a non-inverted input from the latch circuit WDL(2_3) and a non-inverted input of the signal IN2-2.

The NOR circuit G2-3c performs a NOR operation based on an inverted input from the latch circuit WDL(3_4) and a non-inverted input of the signal IN2-4.

The NOR circuit G2-3d performs a NOR operation based on non-inverted inputs from the NOR circuits G2-3a, G2-3b, and G2-3c.

The NAND circuit G2-3e performs a NAND operation based on a non-inverted input from the NOR circuit G2-3d and an inverted input of a signal IN1-3 to generate an output signal Q2-3.

The NOR circuit G2-4a performs a NOR operation based on an inverted input from the latch circuit WDL(1_4) and a non-inverted input of the signal IN2-1.

The NOR circuit G2-4b performs a NOR operation based on an inverted input from the latch circuit WDL(2_4) and a non-inverted input of the signal IN2-2.

The NOR circuit G2-4c performs a NOR operation based on an inverted input from the latch circuit WDL(3_4) and a non-inverted input of the signal IN2-3.

The NOR circuit G2-4d performs a NOR operation based on non-inverted inputs from the NOR circuits G2-4a, G2-4b, and G2-4c.

The NAND circuit G2-4e performs a NAND operation based on a non-inverted input from the NOR circuit G2-4d and an inverted input of a signal IN1-4 to generate an output signal Q2-4.

As shown in FIG. 26, the combinational circuit group 294 further includes ExOR circuits G3-1, G3-2, G3-3, G3-4, G3-5, and G3-6, NAND circuits G4-1, G4-2, G4-3, and G4-4, AND circuits G5a, G5b, G5c, and G5d, and an OR circuit G5e.

The ExOR circuit G3-1 performs an ExOR operation based on non-inverted inputs from the latch circuits RDL (1_2) and WDL(1_2) to generate an output signal Q3-12.

The ExOR circuit G3-2 performs an ExOR operation based on non-inverted inputs from the latch circuits RDL (1_3) and WDL(1_3) to generate an output signal Q3-13.

The ExOR circuit G3-3 performs an ExOR operation based on non-inverted inputs from the latch circuits RDL (1_4) and WDL(1_4) to generate an output signal Q3-14.

The ExOR circuit G3-4 performs an ExOR operation based on non-inverted inputs from the latch circuit RDL (2_3) and WDL(2_3) to generate an output signal Q3-23.

The ExOR circuit G3-5 performs an ExOR operation based on non-inverted inputs from the latch circuits RDL (2_4) and WDL(2_4) to generate an output signal Q3-24.

The ExOR circuit G3-6 performs an ExOR operation based on non-inverted inputs from the latch circuits RDL (3_4) and WDL(3_4) to generate an output signal Q3-34.

The NAND circuit G4-1 performs a NAND operation based on non-inverted inputs of the signals Q3-12, Q3-13, and Q3-14 to generate an output signal Flag1.

The NAND circuit G4-2 performs a NAND operation based on non-inverted inputs of the signals Q3-12, Q3-23, and Q3-24 to generate an output signal Flag2.

The NAND circuit G4-3 performs a NAND operation based on non-inverted inputs of the signals Q3-13, Q3-23, and Q3-34 to generate an output signal Flag3.

The NAND circuit G4-4 performs a NAND operation based on non-inverted inputs of the signals Q3-14, Q3-24, and Q3-34 to generate an output signal Flag4.

The AND circuit G5a performs an AND operation based on a non-inverted input of the signal Flag1 and a non-inverted input from the latch circuit SDL1.

The AND circuit G5b performs an AND operation based on a non-inverted input of the signal Flag2 and a non-inverted input from the latch circuit SDL2.

The AND circuit G5c performs an AND operation based on a non-inverted input of the signal Flag3 and a non-inverted input from the latch circuit SDL3.

The AND circuit G5d performs an AND operation based on a non-inverted input of the signal Flag4 and a non-inverted input from the latch circuit SDL4.

The OR circuit G5e performs an OR operation based on non-inverted inputs from the AND circuits G5a, G5b, G5c, and G5d to generate a fail flag Fail as an operation result.

<3-2> Specific Example

Next, a specific example of the combinational circuit group of the semiconductor memory device according to the third embodiment will be described with reference to FIGS. 25 and 26.

Described below is the case where the combinational circuit group 294 is applied to the specific example described in <1-4-1-3>, above.

In the specific example, the first program is performed on the cell 1, cell 3, and cell 2 so that the thresholds of the cell 4, cell 1, and cell 3, and cell 2 are placed in the ascending order, as described above. After completion of the first program, the thresholds of the cells are in the order of cell 4, cell 3, cell 1, and cell 2. Therefore, the detection 2 is failed; therefore, the second cycle program is performed on the cell 3 and cell 2, and the third cycle program is performed on the cell 2. In this way, the thresholds of the four cells in a group can be placed in the ascending order of cell 4, cell 1, cell 3, and cell 2.

Described here is an operation of the combinational circuit group 294 in such a specific example. In the specific example, the values described in the first embodiment are referred to regarding the values stored in the latch circuits.

At the first pulse application time of the first program in the step S101, "1" needs to be stored in the latch circuit SDL4 to place the cell 4 in the non-write state. At that time, the output results Q1-1 to Q1-4 of the NOR circuits G1-1 to G1-4 of the combinational circuit group 294 are transferred to the latch circuits SDL1 to SDL4. After that, "0" is stored in the latch circuits SDL1 to SDL3, and "1" is stored in the latch circuit SDL4. Then, the first pulse is applied. The cell 4 is a non-write target, and the first pulse is not applied thereto.

Next, at the second pulse application time of the first program, "1" is stored in the latch circuit SDL1 to place the cell 1 in the non-write state in addition to the cell 4.

First, when data is set after the first pulse application, the results of the latch circuits SDL1 to SDL4 are reflected in the inputs of the NOR circuits G2-1a to G2-1c, G2-2a to G2-2c, G2-3a to G2-3c, G2-4a to G2-4c. Namely, the results of the latch circuits SDL1 to SDL4 used at the first pulse application time are transferred as the signals IN2-1 to IN2-4. As a result, the signals Q2-2 and Q2-3 become "0", and the signals Q2-1 and Q2-4 become "1". Then, the values of the signals Q2-1 to Q2-4 are transferred to the latch circuits SDL1 to SDL4. Consequently, "0" is stored in the latch circuits SDL2 and SDL3, and "1" is stored in the latch circuits SDL1 and SDL4. Then, the second pulse is applied. The cell 1 and cell 4 are non-write targets, and the second pulse is not applied thereto.

Next, at the third pulse application time of the first program, "1" is stored in the latch circuit SDL3 to place the cell 3 in the non-write state in addition to the cell 4.

When data is set after the second pulse application, the results of the latch circuits SDL1 to SDL4 are reflected in the inputs of the NOR circuits G2-1a to G2-1c, G2-2a to G2-2c, G2-3a to G2-3c, G2-4a to G2-4c. Namely, the results of the latch circuits SDL1 to SDL4 used at the first pulse application time are transferred as the signals IN2-1 to IN2-4. As a result, the signal Q2-2 becomes "0", and the signals Q2-1 Q2-3, and Q2-4 become "1". Then, the values of the signals Q2-1 to Q2-4 are transferred to the latch circuits SDL1 to SDL4. Consequently, "0" is stored in the latch circuit SDL2, and "1" is stored in the latch circuits SDL1, SDL3, and SDL4. Then, the third pulse is applied. The cell 1, cell 3, and cell 4 are non-write targets, and the third pulse is not applied thereto. The first program is thereby completed.

In the program verification, when the thresholds of the cells are in the ascending order of cell 4, cell 3, cell 1, and cell 2, predetermined data is stored in the latch circuits RDL after the program verification, as in the first embodiment. Specifically, "0" is stored in the latch circuit RDL(1_2), and "1" is stored in the latch circuits RDL(1-3), (1_4), (2_3), (2_4), and (3_4).

After that, flags indicating whether the read results match the expected order are obtained by performing arithmetic operations using the ExOR circuits G3-1 to G3-6 and NAND circuits G4-1 to G4-4. The signals Flag1 to Flag4, which are the output results of the NAND circuits G4-1 to G4-4, correspond to the cell 1 to cell 4, respectively. The signals Flag1 to Flag4 corresponding to the cells whose read data and write data do not match are "1".

After that, the latch circuits SDL1 to SDL4 are reset, and the signals Q1-1 to Q1-4 are transferred to the latch circuits SDL1 to SDL4.

If the operation results of the AND circuits G5a to G5d and OR circuit G5e are "1", the detection is failed. In this example, the fail flag is not set ("0"), and the detection 1 is passed; accordingly, the operation transitions to the detection 2.

In the detection 2, the same operation as that at the second pulse application time is performed. Specifically, data of the latch circuits SDL1 to SDL4 in the detection 1 is transferred as the signals IN2-1 to IN2-4, and the signals Q2-1 to Q2-4 are determined. Then, the signals Q2-1 to Q2-4 are transferred to the latch circuits SDL1 to SDL4. As a result, "1" is stored in the latch circuit SDL1. The results of the signals Flag2 and Flag4 are "0", and the results of the signals Flag1 and Flag3 are "1". Therefore, the fail flag corresponding to the result of the OR circuit G5e is "1", and the detection 2 is determined as a failure; accordingly, the operation transitions to the second cycle program.

The second cycle program is performed with the latch circuits SDL1 to SDL4 in the states at the time when the detection 2 ends. After that, the values of the latch circuits SDL1 to SDL4 are updated for the third cycle program. In this case, the latest values of the latch circuits SDL1 to SDL4 are transferred as the signals IN2-1 to IN2-4, and the signals Q2-1 to Q2-4 consequently generated are transferred to the latch circuits SDL1 to SDL4. As a result, "1" is stored in the latch circuits SDL1, SDL3, and SDL4, and "0" is stored in the latch circuit SDL2. Therefore, only the cell 2 becomes a write target. In that state, the third cycle program is performed.

After the third cycle program, a program verification is performed again.

Here, the expected order is achieved by the above second cycle program and third cycle program.

If one of the detections 1, 2, and 3 is failed, respective pulses are applied, and a write operation is repeated until the thresholds of all of the four cells are placed in the expected order.

<3-3> Advantage

According to the above-described embodiment, circuits only for performing arithmetic operations on data are provided. When arithmetic operations are performed by using latch circuits, consideration must be given not to erase data of the latch circuits, and it is difficult to efficiently perform arithmetic operations. However, the present embodiment enables arithmetic operations without erasing data of latch circuits, and thus enables efficient and high-speed arithmetic operations.

<4> Fourth Embodiment

The fourth embodiment will be described. A write operation will be described in the fourth embodiment. The basic configuration and basic operation of the device according to the fourth embodiment are the same as those of the device according to the above-described first embodiment. Thus, descriptions of matters described in the above-described first embodiment and matters easily inferable from the first embodiment will be omitted.

<4-1> Comparative Example

Before describing the write method of a semiconductor memory device according to the fourth embodiment, a concern related to over-programming in the case where the write method described in the first embodiment is adopted will be described.

In the write method described in the first embodiment (also referred to as a first write method), a detection is performed after a program verification, and a program pulse is applied to a write target cell in accordance with the result of the detection.

In this case, the number of required program pulse applications differs among groups due to a variation in cell characteristics. However, one sequencer 25 performs a write operation on all the groups. Therefore, the same number of pulse applications are performed on each group. The program voltage is raised as the number of programs (number of loops) increases. Therefore, by the influence of the group including a cell that is slow in achieving the order, the overall program voltage is raised. In the write method of the first embodiment, the number of program verifications is small; therefore, the write operation can be sped up, whereas there is a concern related to over-programming.

Figure 27:
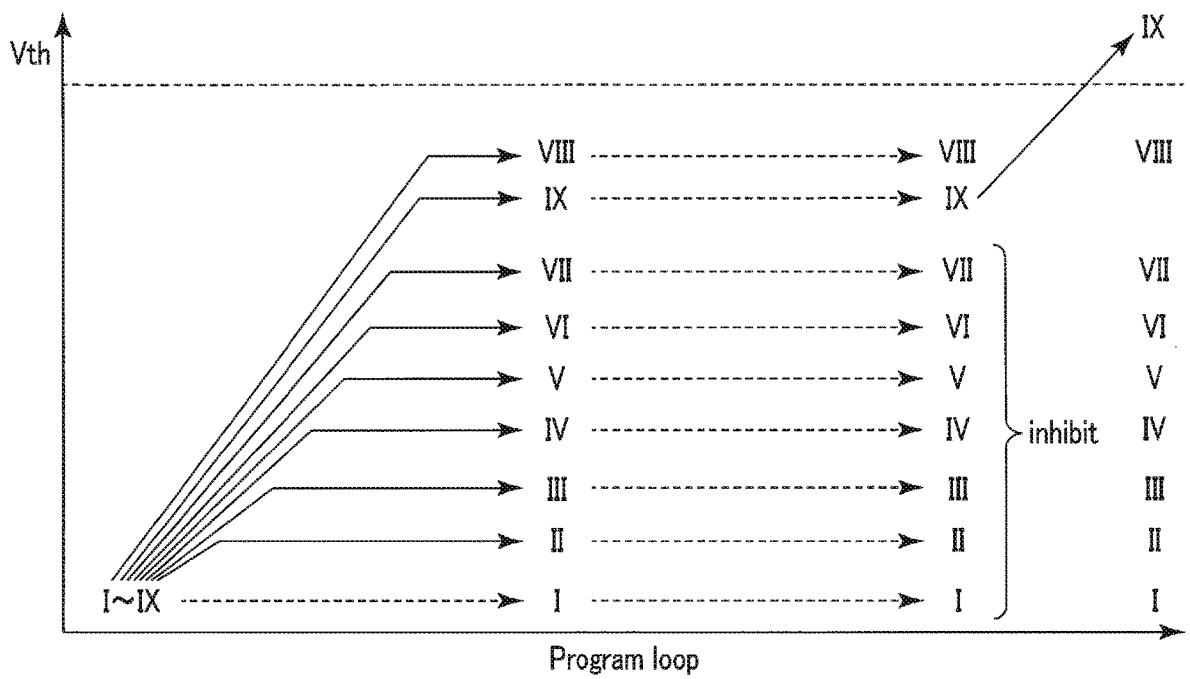
FIG. 27 is a diagram showing changes of thresholds of memory cells in a program loop.

The concern related to over-programming will be described with reference to FIG. 27. Here, the case where one group includes nine cells will be described. In the case of FIG. 27, a write operation needs to be performed on the memory cells to achieve the order from the first place to the ninth place.

The flow of the basic write operation is the same as the operation described in the first embodiment other than the number of program pulse applications and the number of detections, which are different because there are nine levels.

First, in the first program, a program pulse is applied eight times while raising the level of the selected word line WL in stages. Let us assume that the order from the first place to the seventh place is thereby achieved in this group (see FIG. 27). However, if the order is achieved only from the first place to the fourth place in another group (not shown), the sequencer 25 applies a pulse five times while incrementing the level of the selected word line WL to achieve the remaining part of the order. At that time, the cells that have achieved the order are placed in the write-inhibit state. Therefore, a write voltage is not effectively applied to those cells. However, the voltage of the selected word line WL is under the common control by the sequencer 25. Therefore, the voltage is increased in accordance with the rule for every group.

Let us assume that the order from the first place to the seventh place is achieved in the other groups after the above-described five pulse applications. In that case, to place the eighth cell and the ninth cell in order, the first to eighth cells are placed in the inhibit state, and a write voltage is applied to the cell to be in the ninth place. At that time, as the voltage of the selected word line WL has already been raised, a large write voltage is suddenly applied to the cell to be in the ninth place in this group. As a result, a large rise in the threshold may occur depending on the cell characteristics (see FIG. 27). Such a large threshold rise is called, for example, over-programming. If this over-programming occurs multiple times in the same group, providing nine levels within a predetermined threshold range may be disabled. This problem becomes more pronounced as the number of cells included in one group increases.

<4-2> Second Write Method

<4-2-1> Flow

Figure 28:
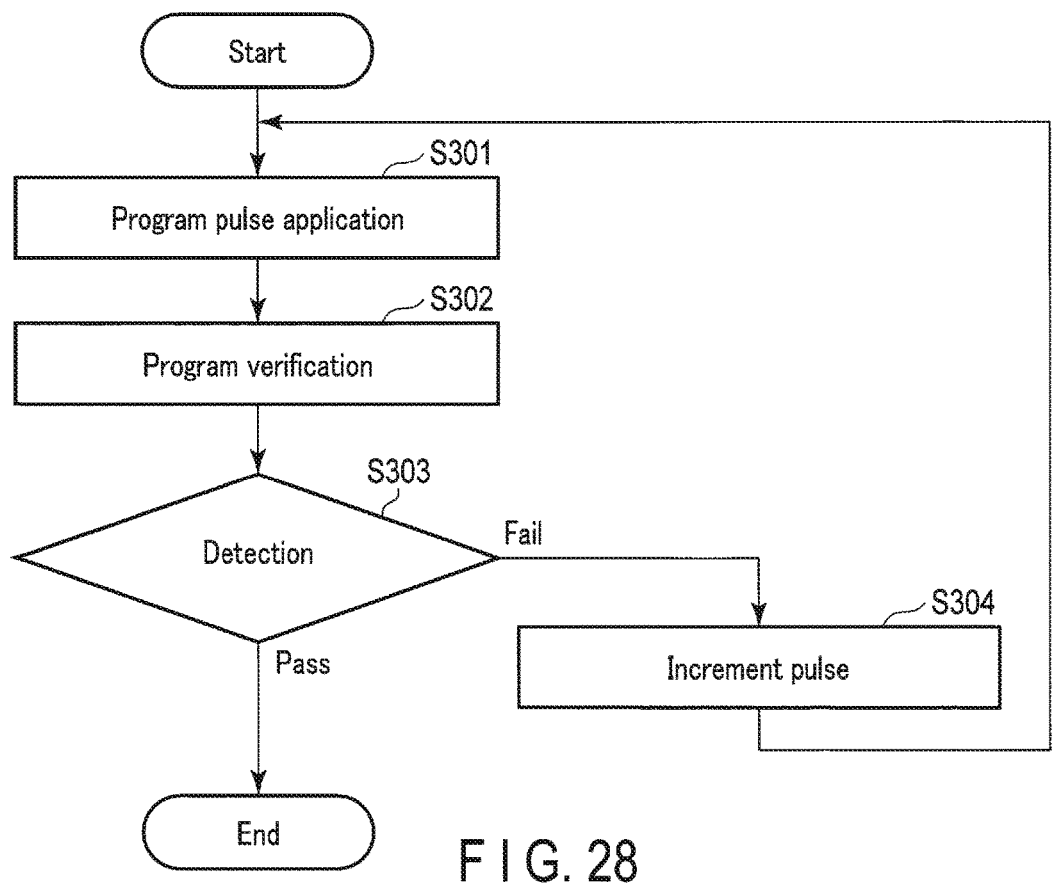
FIG. 28 is a flowchart showing a second write method of a semiconductor memory device according to a fourth embodiment.

A second write method of the semiconductor memory device according to the fourth embodiment will be described with reference to FIG. 28. The second write method is a method of performing a program verification for every pulse application to prevent over-programming.

[Step S301]

The sequencer 25 performs a program based on the permutation data stored in the latch circuits WDL. The sense amplifier module 29 distinguishes the cell for which a program is to be performed from the cells to be placed in the inhibit (write-inhibit) state.

First, only the cell to be in the lowest place in the group is placed in the inhibit state. A write voltage is applied to the cells other than the cell to be in the lowest place, and the thresholds of the cells are raised.

[Step S302]

After step S301, the sequencer 25 performs a program verification.

[Step S303]

As a detection, the sequencer 25 checks whether the order of the cells to be achieved in step S301 is correct, and if the order is correct in an allowable or larger number of groups, the step S303 is passed. In that case, the write operation ends.

[Step S304]

When determining that the detection is failed (fail in step S303), the sequencer 25 adds an offset ($\Delta$VPGM) to the write voltage of the selected word line WL.

Therefore, a program pulse that is higher than the last program pulse by the offset can be applied to the program target cell in the step S301.

<4-2-2> Waveforms

Figure 29:
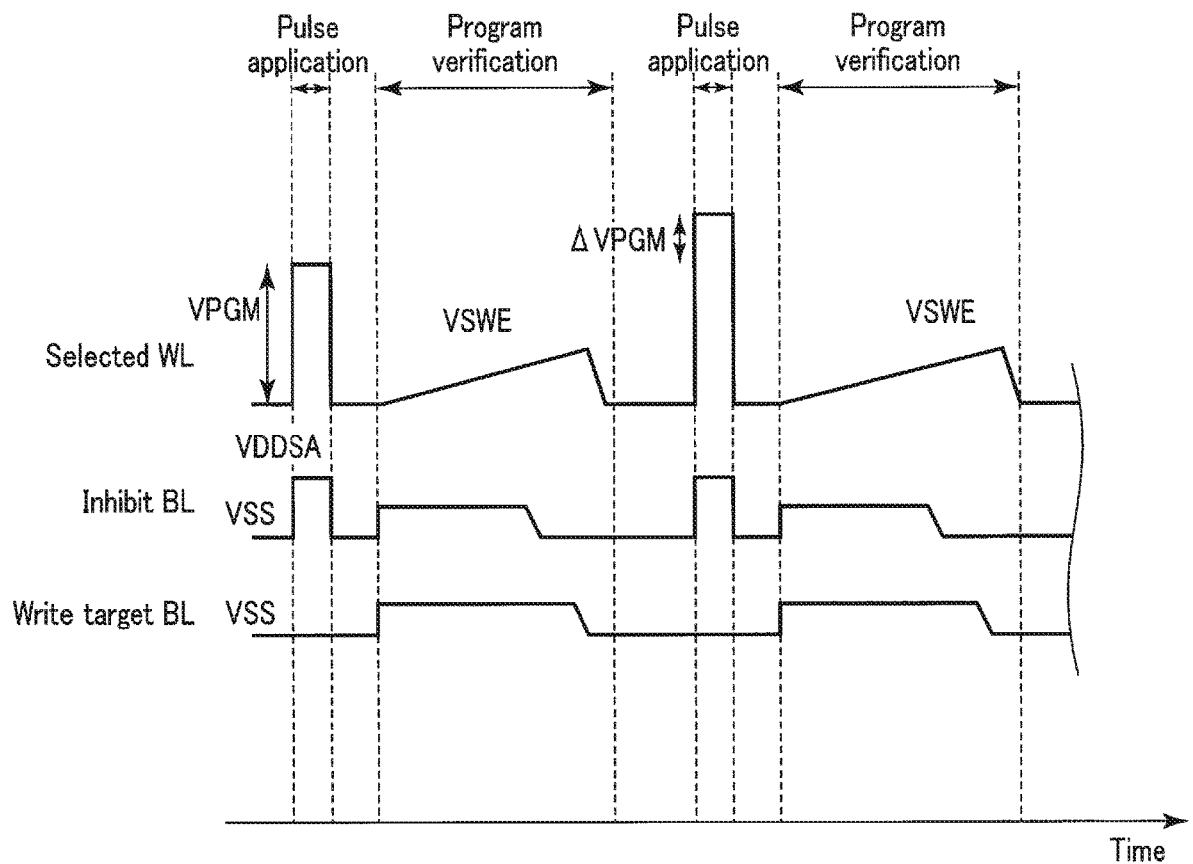
FIG. 29 is a waveform diagram showing operation waveforms in the second write method.

Next, operation waveforms in the second write method will be described. FIG. 29 shows voltages of the selected word line WL, write target bit line BL, and inhibit bit line BL.

As shown in FIG. 29, an application of a program pulse and a program verification are alternatively performed in the second write method. The voltage VDDSA is applied to the inhibit bit line BL, and the voltage VSS is applied to the write target bit line BL. The write voltage applied to the selected word line WL is incremented by ΔVPGM in accordance with the number of pulse applications.

<4-2-3> Advantage

Figure 30:
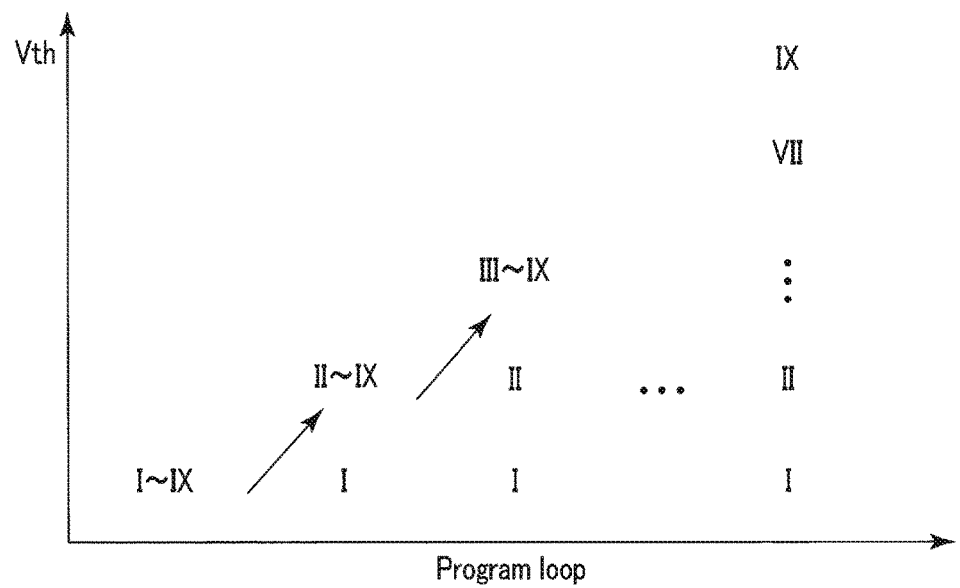
FIG. 30 is a diagram showing changes of thresholds of memory cells in a program loop.

In the second write method, a program verification is performed for every pulse application. Since the number of program verifications is larger than in the first write method, a longer time is required for the write operation. In contrast, the second write method enables programming in the ascending order from the cell to be in the lowest place as shown in FIG. 30, and the above-described over-programming can be prevented.

<4-3> Third Write Method

<4-3-1> Comparative Example

A comparative example (second write method) will be described with reference to FIG. 31.

Figure 31:
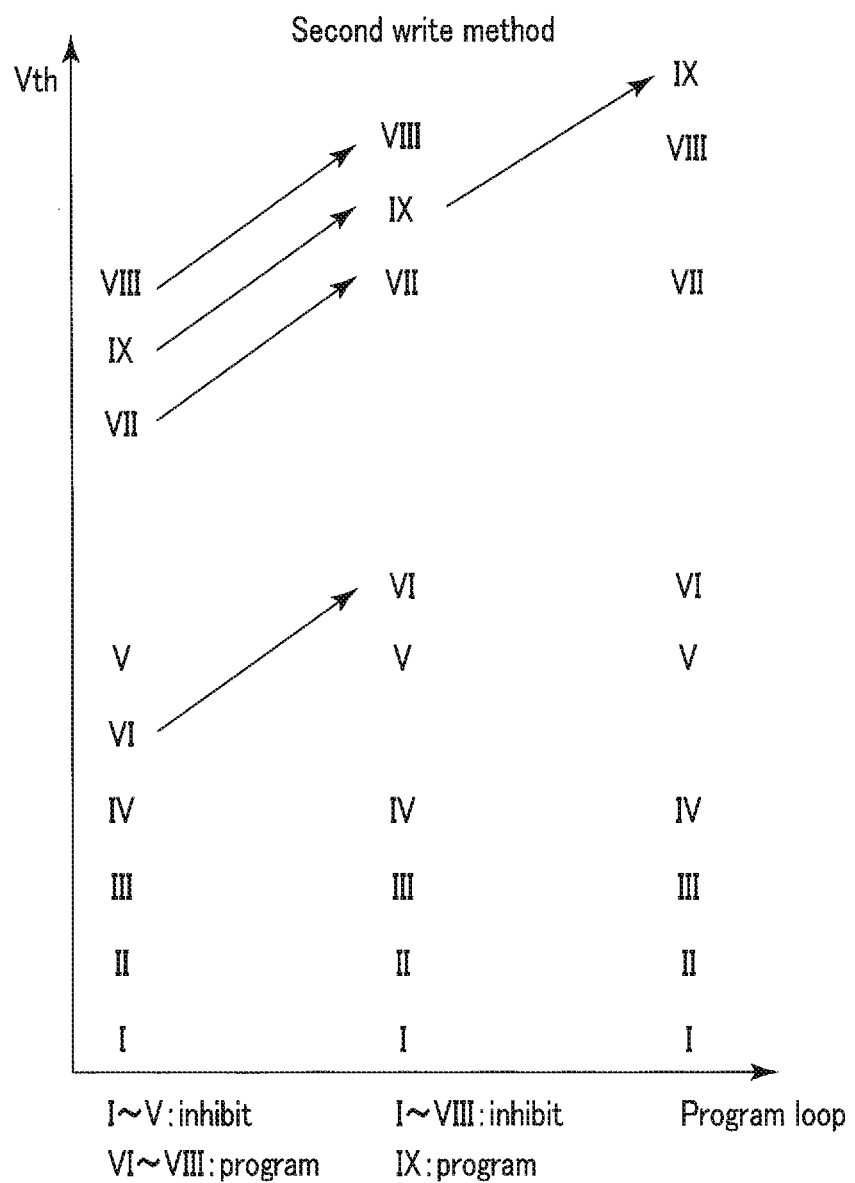
FIG. 31 is a diagram showing changes of thresholds of memory cells in a program loop.

FIG. 31 shows thresholds of the cells in a group after application of a program pulse. FIG. 31 shows the case where the sixth cell and the ninth cell are late in achieving the order. In the second write method, when the place of the sixth cell differs from the place in the expected order, a program pulse is applied to not only the sixth cell, but also the subsequent cells, i.e., the seventh, eighth, and ninth cells. When the order from the first place to the eighth place is confirmed to be correct in the subsequent program verification, only the threshold of the ninth cell is further raised by the next program pulse application.

In the second write method, a write operation is performed on the higher-place cells (the seventh, eighth, and ninth cells in this example) at the same time as the write operation on the sixth cell. This contributes to an increase in the program speed in the initial stage of the program loop in which most cells still have small thresholds, but may cause an excessive rise in the thresholds of higher-place cells as the program loop proceeds.

<4-3-2> Operation of Third Write Method

Figure 32:
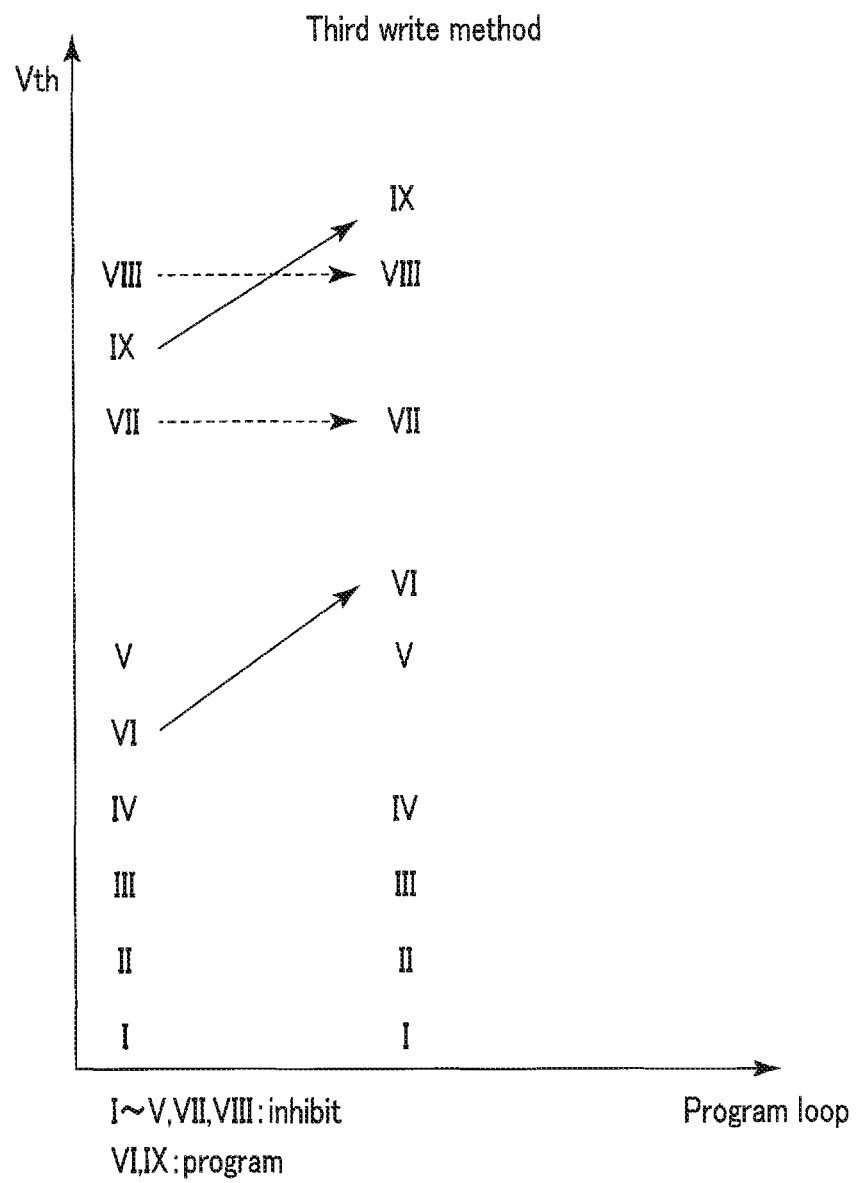
FIG. 32 is a diagram showing changes of thresholds of memory cells in a program loop.

A third write method will be described with reference to FIG. 32.

In the third write method, a program pulse is applied to only a cell not in the expected order, not to both of the cell not in the expected order and a higher-order cell.

<4-3-3> Advantage

In the third write method, a program pulse is applied to only a cell not in the expected order. Therefore, a program is not performed on the cells that are already in the expected order, and the final threshold distribution can be prevented from widening.

<4-4> Fourth Write Method

<4-4-1> Outline

Next, the fourth write method will be described. In the fourth write method, a multi-level program is adopted in which thresholds can be brought to multiple levels in one program pulse application.

<4-4-2> Waveforms

Figure 33:
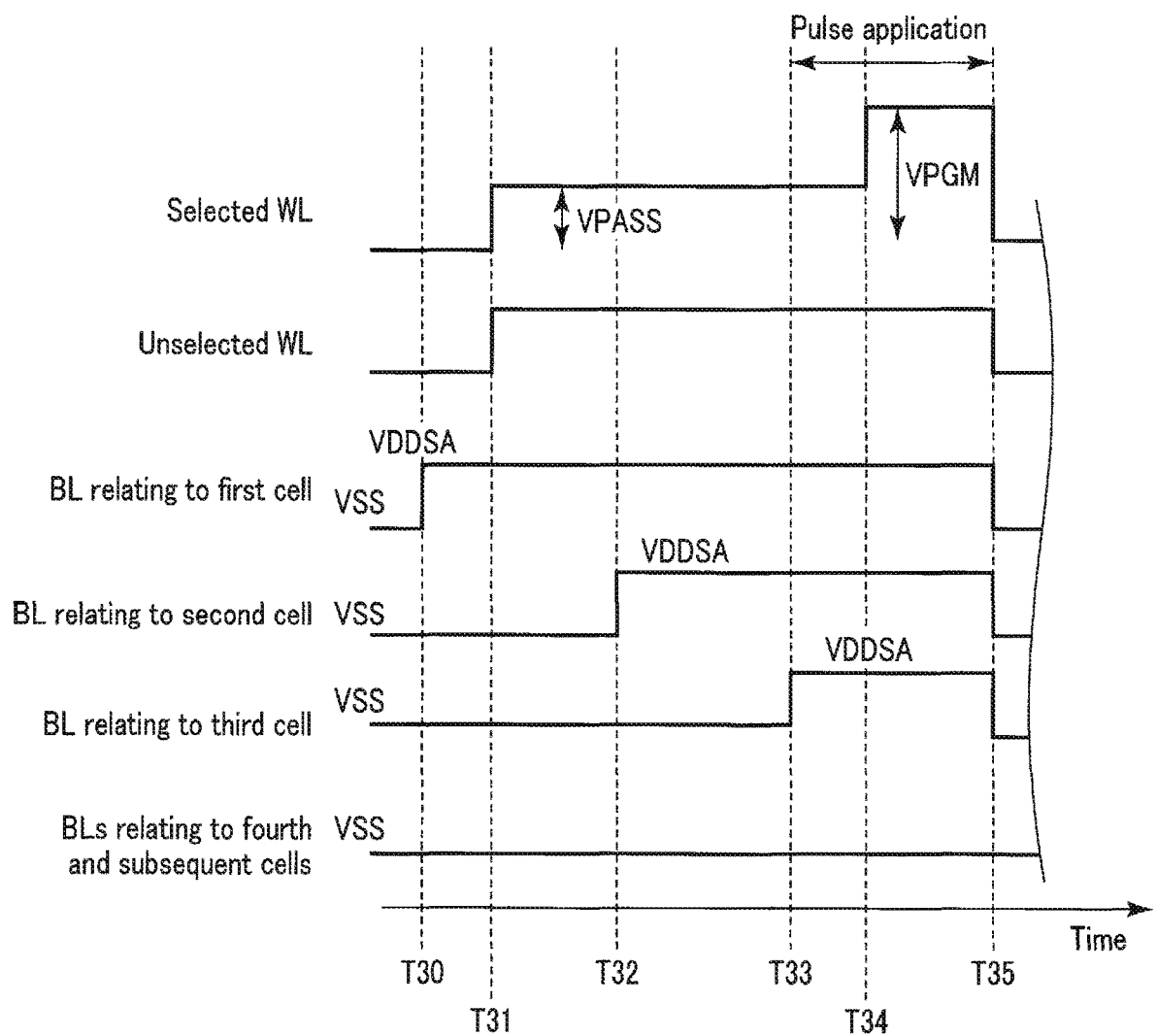
FIG. 33 is a waveform diagram showing operation waveforms in a fourth write method.

Waveforms of the multi-level program will be described with reference to FIGS. 33 to 36. FIGS. 33, 35, and 36 show voltages of the selected word line WL, the unselected word line WL, and the bit lines BL relating to the first, second, third, and fourth and subsequent cells.

When a program pulse is first applied, an operation to apply different write voltages to the first cell, the second cell, the third cell, and the fourth and subsequent cells is performed.

In the multi-level program, when raising the voltage of the unselected word line WL, the write voltage effectively applied can be controlled to be multiple levels by controlling the timing to set the voltage of the bit line BL linked to each cell at the voltage VDDSA in accordance with the expected level.

As shown in FIG. 33, the first cell is placed in the inhibit state; therefore, the voltage of the bit line BL relating to the first cell is brought to the voltage VDDSA before the voltage of the unselected word line WL is raised (time T30). The voltage of the bit line BL relating to the second cell is brought to the voltage VDDSA at the first timing (time T32) after the voltage of the unselected word line WL is started to be raised (time T31). The voltage of the bit line BL relating to the third cell is brought to the voltage VDDSA at the second timing (time T33) after the voltage of the unselected word line WL is started to be raised. The voltages of the bit lines BL relating to the forth and subsequent cells are maintained at the voltage VSS. This control realizes the following relationship between the write voltages effectively applied: first cell<second cell<third cell<fourth and subsequent cells.

Figure 34:
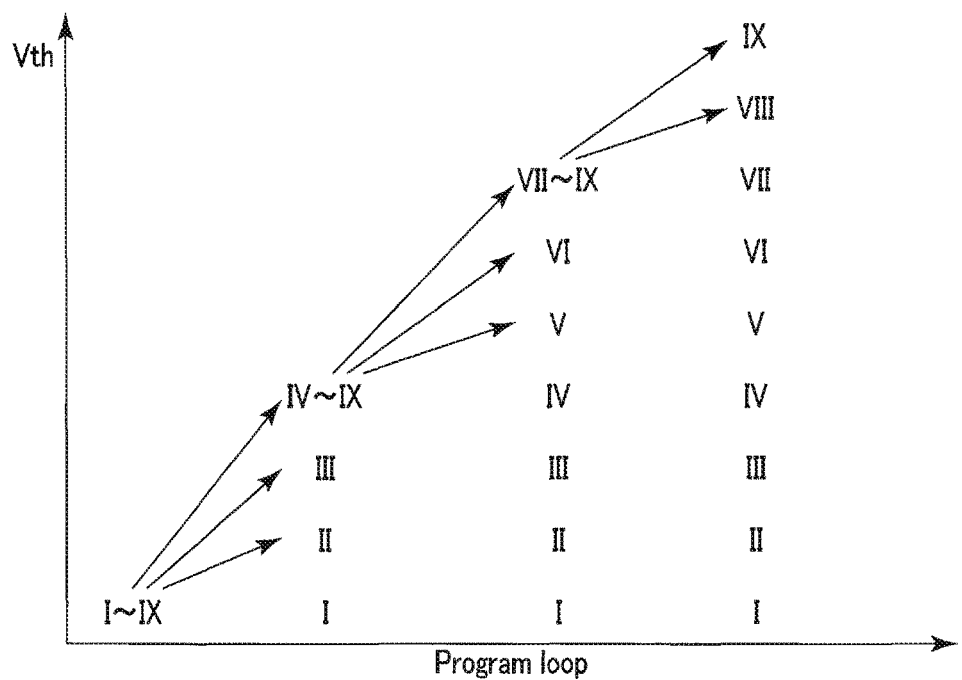
FIG. 34 is a diagram showing changes of thresholds of memory cells in a program loop.
Figure 35:
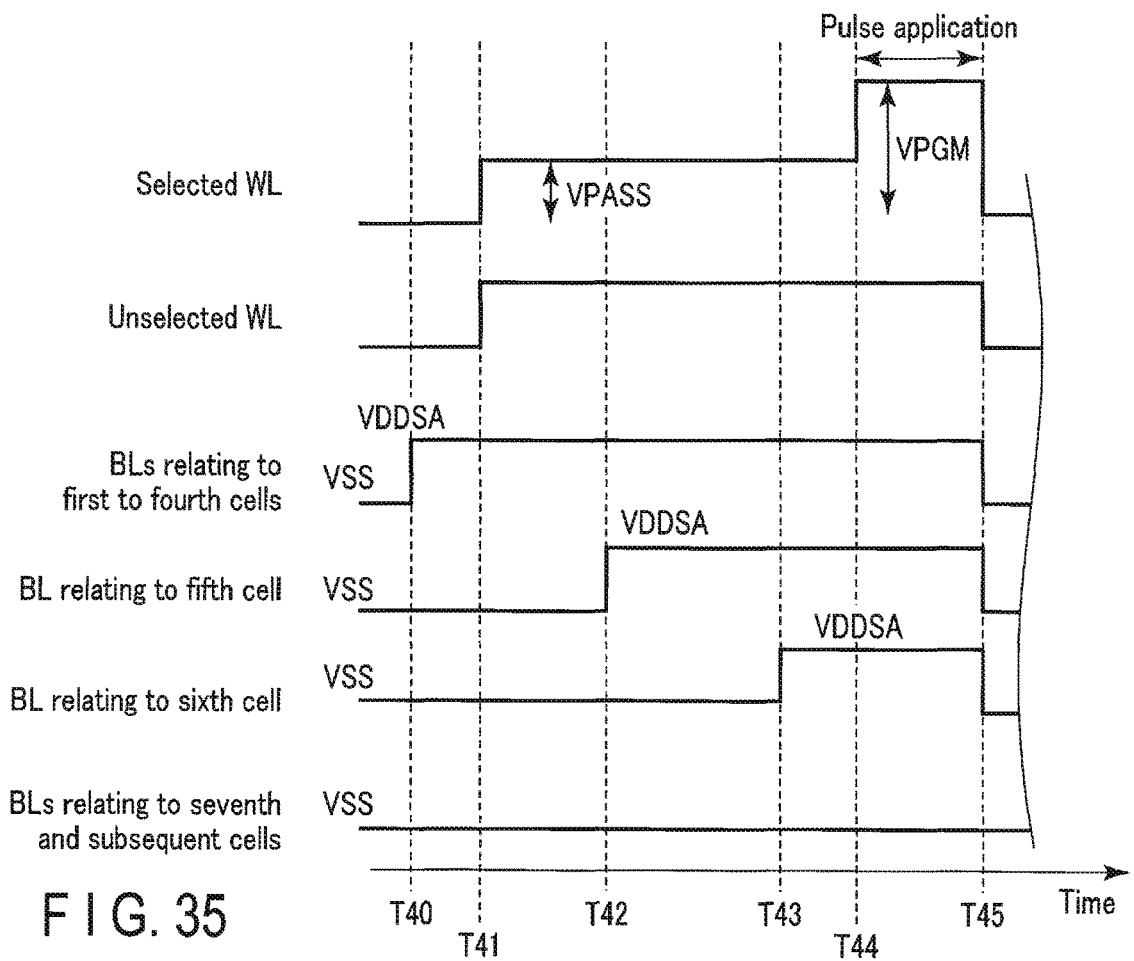
FIG. 35 is a waveform diagram showing operation waveforms in the fourth write method.

By performing such a write operation, the thresholds of the cells are changed as shown in FIG. 34. After a program pulse application, a program verification is performed. If the order from the first to fourth cells is correct, the operation proceeds to the next program pulse application. In the next program pulse application, the write voltage effectively applied is controlled by the timing of setting the voltage of the bit line BL linked to each cell at the voltage VDDSA, as in the first program pulse application.

The first to fourth cells have already been placed in order. Therefore, as shown in FIG. 35, before raising the voltage of the unselected word line WL (time T40), the voltages of the bit lines BL relating to the first to fourth cells are brought to the voltage VDDSA so as to place the first to fourth cells in the inhibit state. After starting to raise the voltage of the unselected word line WL (time T41), the bit line BL relating to the fifth cell is first set at the voltage VDDSA and, after a given time (time T43), the bit line BL relating to the sixth cell is set at the voltage VDDSA. The bit lines BL relating to the seventh and subsequent cells are maintained at the voltage VSS. As shown in FIG. 34, this control prevents the thresholds of the first to fourth cells from changing, and changes the thresholds of the fifth and subsequent cells. The change amounts satisfy the following relationship: fifth cell<sixth cell<seventh and subsequent cells. After that, a program verification is performed, and if the order from the first to seventh cells is correct, the operation proceeds to the next program pulse application.

In the last program pulse application, the eighth cell and the ninth cell are placed in order. As shown in FIG. 36, from the beginning (time T50), the voltages of the bit lines BL from the first to seventh cells are at the voltage VDDSA, and the first to seventh cells are in the inhibit state. After starting to raise the voltage of the unselected word line WL (time T51), the voltage of the bit line BL relating to the eighth cell is brought to the voltage VDDSA halfway, whereas the bit line BL relating to the ninth cell is maintained at the voltage VSS, thereby distinguishing the eighth cell from the ninth cell. A program verification is then performed and, if the order of all the cells is correct, the program ends.

<4-4-3> Advantage

This multi-level programming enables achieving multiple thresholds by one program pulse application, and dramatically increases the writing speed.

<4-5> Fifth Write Method

<4-5-1> Outline

Next, a fifth write method will be described. In the fifth write method, a write voltage is effectively applied only to the cells in wrong places.

<4-5-2> Comparative Example

A specific example of a comparative example (fourth write method) will be described with reference to FIG. 37. As shown in FIG. 37, the difference between the thresholds of the fourth cell and the fifth cell is small; therefore, it is conceivable to apply a program pulse to the fifth and subsequent cells.

However, in this case, a write voltage is also applied to the fifth and subsequent cells in the right places, and the final write level may be raised.

<4-5-3> Specific Example

A specific example of the fifth write method will be described with reference to FIGS. 38 and 39.

Figure 38:
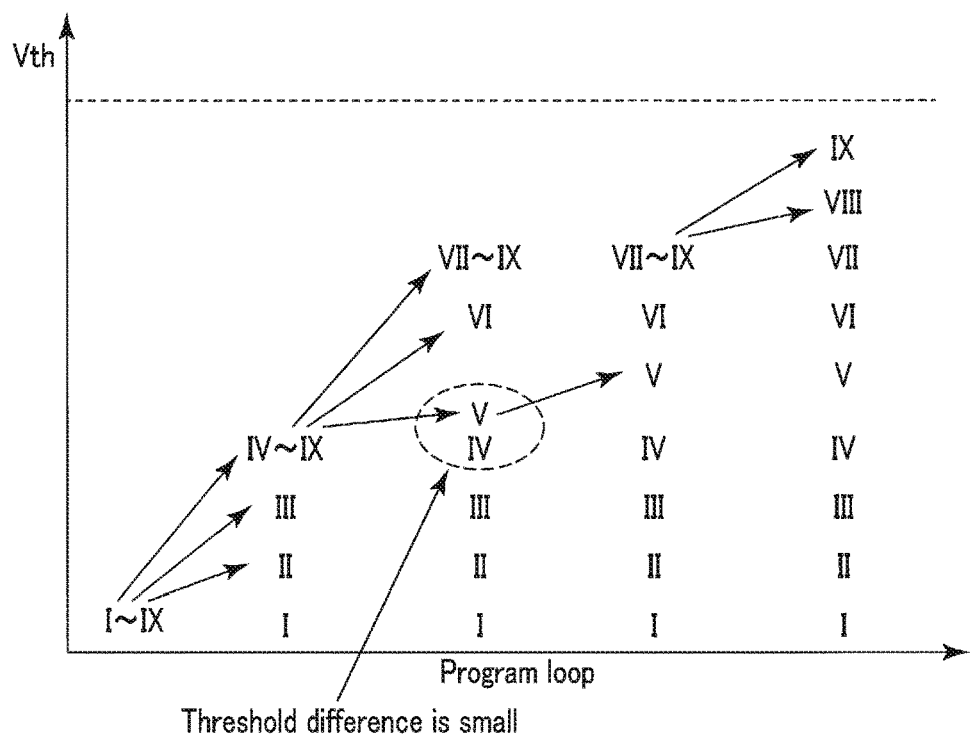
FIG. 38 is a diagram showing changes of thresholds of memory cells in a program loop.
Figure 39:
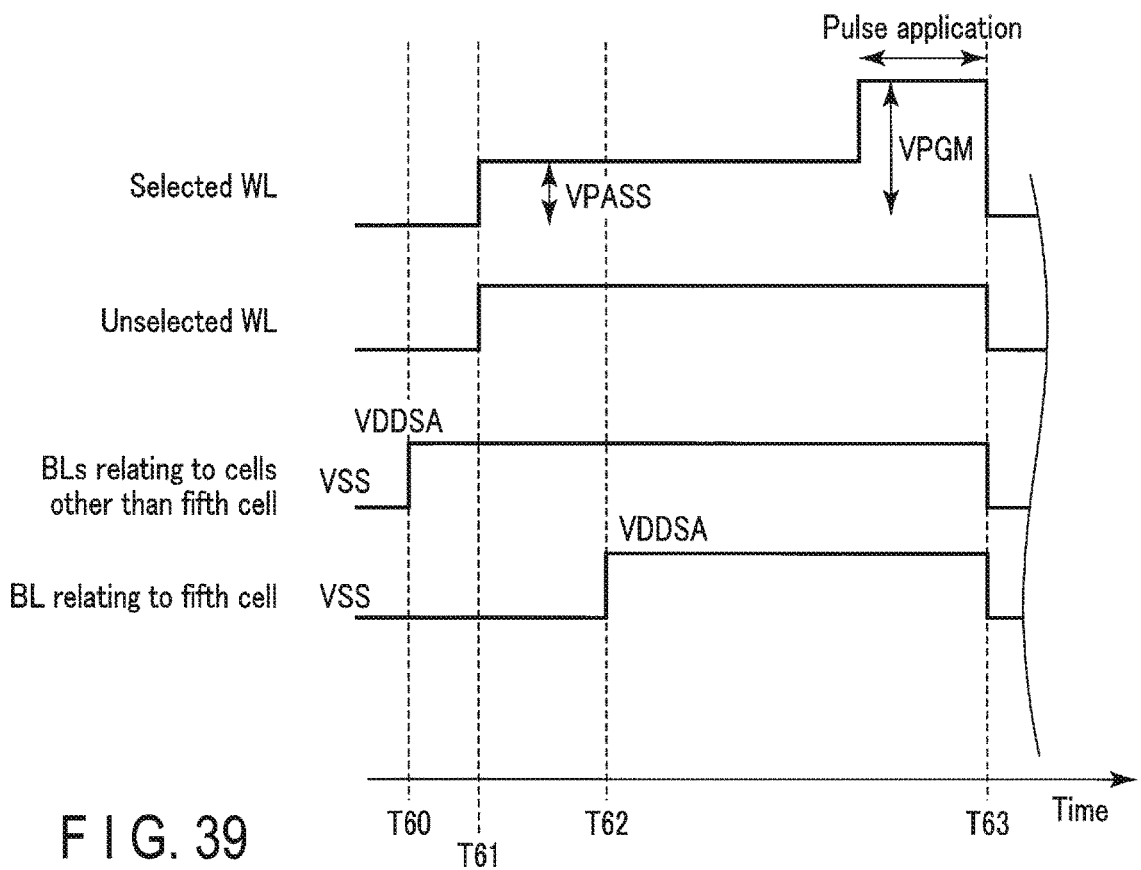
FIG. 39 is a waveform diagram showing operation waveforms in a fifth write method.

As shown in FIG. 38, in the fifth write method, the write voltage is controlled to be effectively applied to only the cells in the wrong places.

Specifically, let us assume that the writing speed of the fifth cell is low. In this case, as shown in FIG. 39, after the program verification is completed, the write voltage applied to the selected word line WL remains the same as that in the previous program pulse application, the cells other than the fifth cell are placed in the inhibit state (time T60), and the voltage of the bit line BL relating to the fifth cell is set at the voltage VDDSA at the second timing (time T62) after the voltage of the unselected word line WL is raised (time T61), thereby effectively applying the write voltage to only the fifth cell.

<4-5-4> Advantage

Let us assume that the voltage of the bit line BL relating to the fifth cell is set at VDDSA at the first timing after the voltage of the non-write word line WL is raised in the previous program pulse application. In this case, by setting the voltage at the voltage VDDSA at the second timing in the present program pulse application, the write voltage effectively applied to the fifth cell can be made larger than that applied in the previous program pulse application while maintaining the level of the selected word line WL. This control enables an additional application of a write voltage only to the fifth cell without applying an excessive write voltage to the sixth and subsequent cells, thereby suppressing an excessive voltage application.

<4-6> Sixth Write Method

<4-6-1> Outline

Next, a sixth write method will be described. The sixth write method adopts split writing. The split writing is a write operation in which one group is divided into a given number of subgroups SGP, and a program is performed for each subgroup SGP.

<4-6-2> Specific Example

A specific example of the sixth write method will be described with reference to FIG. 40.

Figure 40:
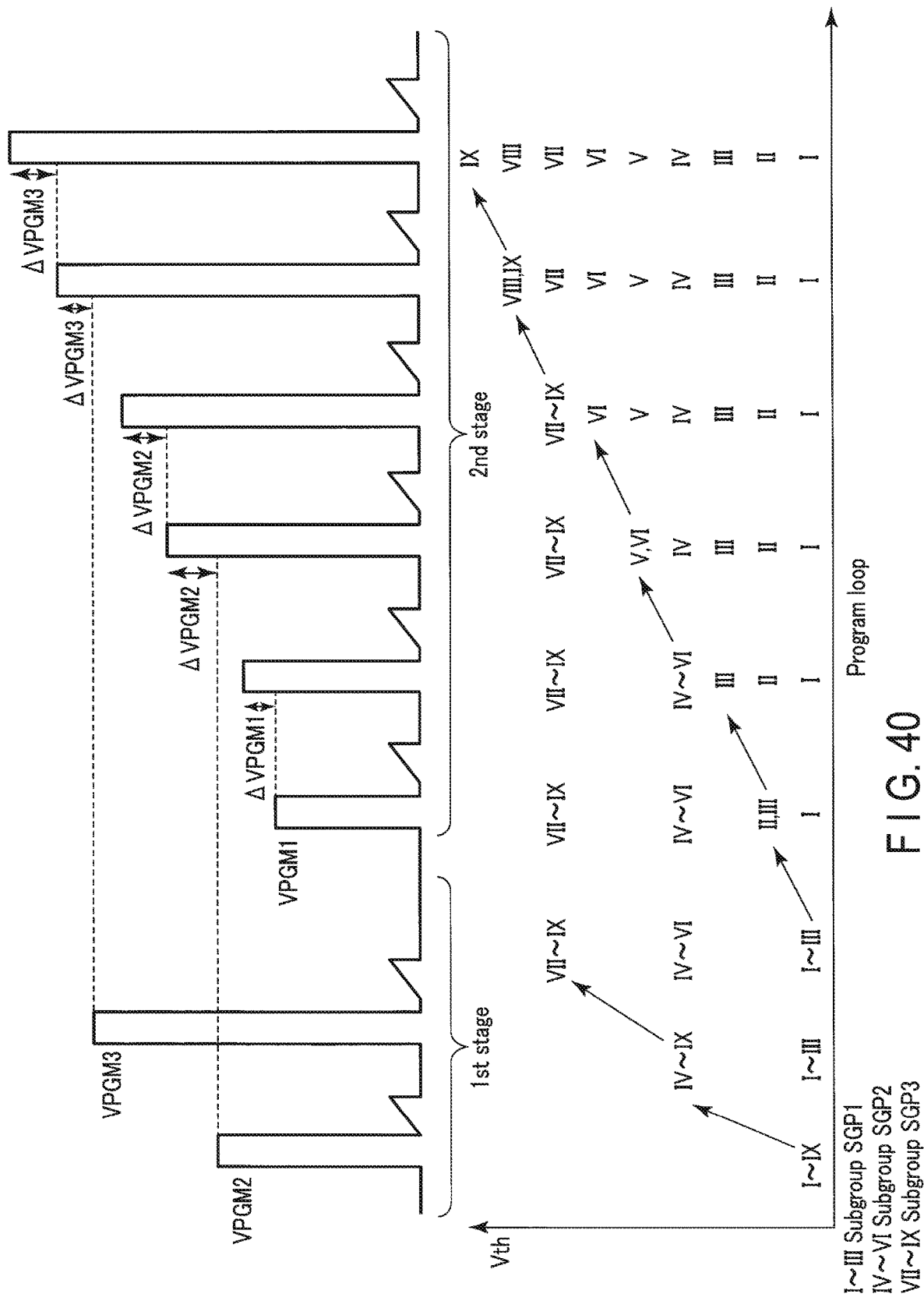
FIG. 40 is a diagram showing a specific example of a sixth write method.

FIG. 40 shows an example in which nine cells are divided into three subgroups SGP each including three cells. The group including the first to third cells is a subgroup SGP1, the group including the fourth to sixth cells is a subgroup SGP2, and the group including the seventh to ninth cells is a subgroup SGP3.

In the first stage, a program is roughly performed on each subgroup SGP.

Then, in the second stage, the thresholds of the cells in each subgroup SGP are brought to the respective levels.

Specifically, in the first stage, a write voltage VPGM2 is applied to the selected word line WL with the cells in the subgroup SGP1 placed in the inhibit state, and a program is roughly performed to bring the thresholds of the subgroup SGP2 and subgroup SGP3 to a certain level.

Then, a write voltage VPGM3 is applied to the selected word line WL with the cells in the subgroups SGP1 and SGP2 placed in the inhibit state, and the thresholds of the cells in the subgroup SGP3 are brought to a higher level.

Subsequently, the operation proceeds to the second stage, and the thresholds of the cells in the subgroup SGP1 are brought to respective levels.

Specifically, a write voltage VPGM1 is applied to the second and third cells with the first cell placed in the inhibit state.

Next, a write voltage VPGM1+ΔVPGM1 is applied to the third cell with the first and second cells placed in the inhibit state.

In this way, the thresholds of the three cells in the subgroup SGP1 are brought to respective threshold levels.

Similarly, the thresholds of the cells in each of the subgroups SGP2 and SGP3 are brought to respective threshold levels, whereby the write operation is completed.

<4-6-3> Advantage

As described above, by dividing a group of cells into subgroups SGP in advance, adjustment for the cell slow in achieving the order is made in each subgroup SGP. Therefore, an excessive rise of the thresholds of higher-place cells can be suppressed.

<4-7> Seventh Write Method

<4-7-1> Outline

Next, the seventh write method will be described. The seventh write method is a combination of split writing and multi-level programming.

<4-7-2> Specific Example

The seventh write method will be described with reference to FIG. 41.

Figure 41:
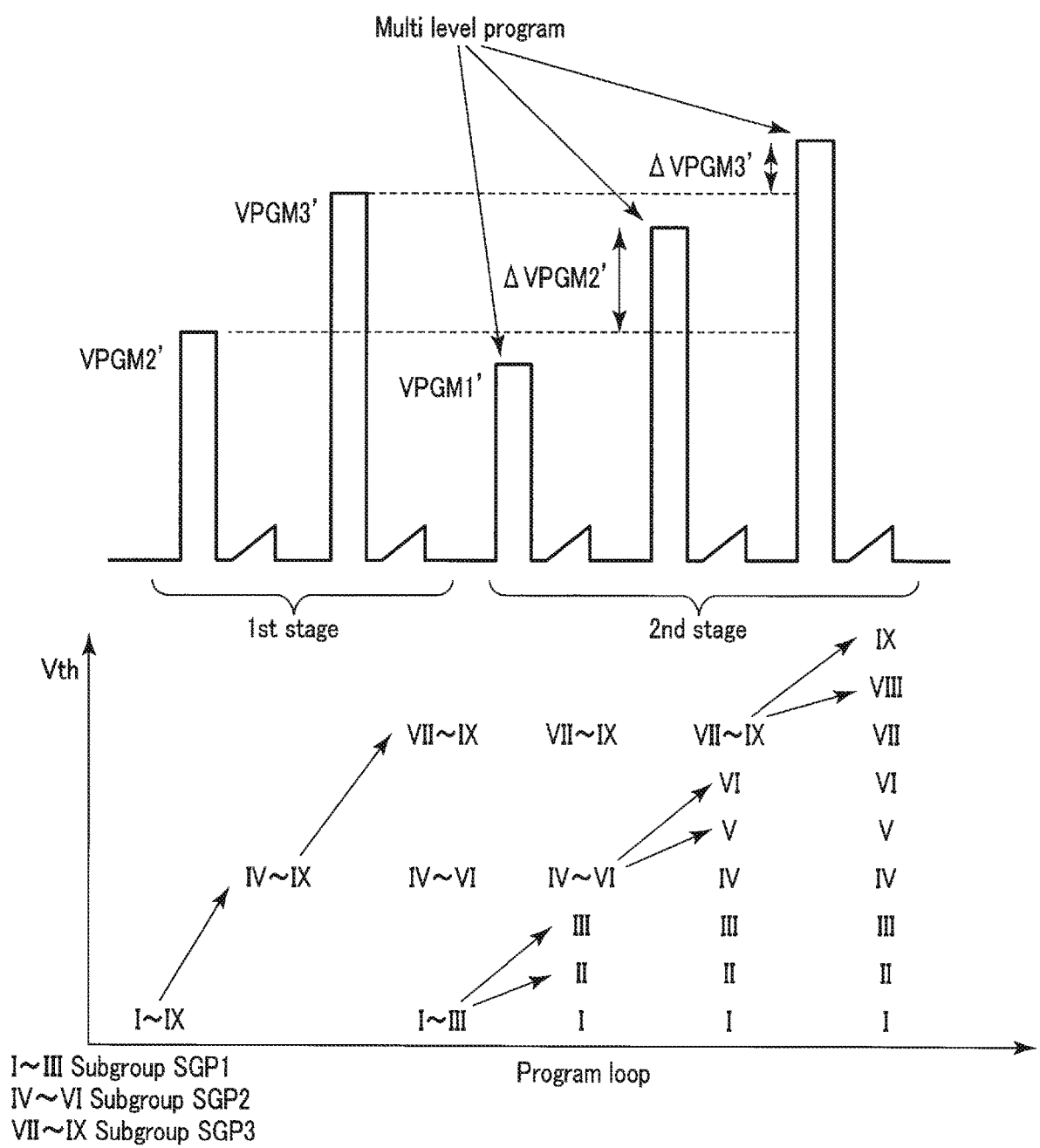
FIG. 41 is a diagram showing a specific example of a seventh write method.

In the first stage, as shown in FIG. 41, as the change amounts of thresholds need to be large, the multi-level programming cannot be used. Therefore, the multi-level programming is used in the second stage.

After a program is roughly performed on the subgroups SGP1, SGP2, and SGP3 in the first stage, a program to bring the thresholds of the cells in each of the subgroup SGP1, the subgroup SGP2, and the subgroup SGP3 to respective levels is performed as the second stage. In the second stage, the multi-level programming is adopted.

<4-7-3> Advantage

By combining split writing with multi-level programming, the writing speed can be increased.

The first to sixth write methods can be used in combination in accordance with the characteristics of the cells.

<5> Others

In the above-described embodiments, the semiconductor memory device 20 includes a conversion circuit that converts the signal I/O<7:0> into permutation data. However, as shown in FIG. 42, the memory controller 10 may include a conversion circuit that converts the signal into permutation data.

Embodiments of the present invention have been described above; however, the present invention is not limited to the above-described embodiments, and can be variously modified in practice without departing from the spirit of the invention. Furthermore, the above-described embodiments include inventions at various stages, and various inventions are extracted by appropriately combining the disclosed structural elements. For example, even if some structural elements are deleted from the disclosed structural elements, the resultant structure can be extracted as an invention as long as a predetermined effect can be obtained.

The invention claimed is:

1. A semiconductor memory device comprising:
a plurality of memory cells;
a first circuit configured to convert first data into second data relating to an order of thresholds of the memory cells; and
a second circuit configured to perform a write operation on the memory cells based on the second data,
wherein the second circuit includes a first latch group to store write data, a second latch group to store read data read from the memory cells, and a third latch group to store read data supplied from the second latch group, and performs an arithmetic operation to select a write target memory cell based on the second data.

2. The semiconductor memory device according to claim 1, wherein the second data includes a plurality of third data items each defining a relationship between thresholds of two memory cells.

3. The semiconductor memory device according to claim 1, wherein:
a number of latches included in the first latch group is equal to a number of latches included in the third latch group, and
a number of latches included in the second latch group is smaller than the number of latches included in the first latch group or the number of latches included in the third latch group.

4. The semiconductor memory device according to claim 1, further comprising:
a sequencer configured to control the second circuit, the first latch group, the second latch group, and the third latch group,
wherein when writing the second data in the memory cells, the sequencer:
stores the second data in the first latch group,
performs a first program on the memory cells based on the second data,
performs a verification after the first program,
stores fourth data obtained by the verification in the second latch group,
performs an arithmetic operation on the second data and the fourth data by using the first latch group, the second latch group, and the third latch group, and selects a second program target memory cell, and
performs a second program on the second program target memory cell.

5. The semiconductor memory device according to claim 4, wherein the second circuit further includes a third circuit configured to perform an arithmetic operation to select the second program target memory cell.

6. The semiconductor memory device according to claim 1, wherein the second circuit refrains from performing a write operation on only a memory cell in a lowest place of the order of thresholds of the memory cells.

7. The semiconductor memory device according to claim 1, wherein the second circuit performs a write operation on only a memory cell in a different place of the order of thresholds of the memory cells from the second data.

8. The semiconductor memory device according to claim 1, wherein when performing a write operation on the memory cells, the second circuit applies different voltages in accordance with the order of thresholds of the memory cells in an initial voltage application.

9. The semiconductor memory device according to claim 1, wherein the second circuit performs a write operation on each of subgroups which the memory cells are divided into.

10. A memory system comprising:
a controller including a first circuit configured to convert first data into second data relating to an order of thresholds of a plurality of memory cells; and
a semiconductor memory device including the memory cells and a second circuit configured to perform a write operation on the memory cells based on the second data transmitted from the controller,
wherein the second circuit includes a first latch group to store write data, a second latch group to store read data read from the memory cells, and a third latch group to store read data supplied from the second latch group, and performs an arithmetic operation to select a write target memory cell based on the second data.

11. The memory system according to claim 10, wherein the second data includes a plurality of third data items each defining a relationship between thresholds of two memory cells.

12. The memory system according to claim 10, wherein:
a number of latches included in the first latch group is equal to a number of latches included in the third latch group, and
a number of latches included in the second latch group is smaller than the number of latches included in the first latch group or the number of latches included in the third latch group.

13. The memory system according to claim 10, further comprising:
a sequencer configured to control the second circuit, the first latch group, the second latch group, and the third latch group,
wherein when writing the second data in the memory cells, the sequencer:
stores the second data in the first latch group,
performs a first program on the memory cells based on the second data,
performs a verification after the first program,
stores fourth data obtained by the verification in the second latch group,
performs an arithmetic operation on the second data and the fourth data by using the first latch group, the second latch group, and the third latch group, and selects a second program target memory cell, and
performs a second program on the second program target memory cell.

14. The memory system according to claim 13, wherein the second circuit further includes a third circuit configured to perform an arithmetic operation to select the second program target memory cell.

15. The memory system according to claim 10, wherein the second circuit refrains from performing a write operation on only a memory cell in a lowest place of the order of thresholds of the memory cells.

16. The memory system according to claim 10, wherein the second circuit performs a write operation on only a memory cell in a different place of the order of thresholds of the memory cells from the second data.

17. The memory system according to claim 10, wherein when performing a write operation on the memory cells, the second circuit applies different voltages in accordance with the order of thresholds of the memory cells in an initial voltage application.

18. The memory system according to claim 10, wherein the second circuit performs a write operation on each of subgroups which the memory cells are divided into.

* * * * *